(12) United States Patent
Toba et al.

(10) Patent No.: US 9,520,504 B2
(45) Date of Patent: Dec. 13, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Koichi Toba, Kanagawa (JP); Hiraku Chakihara, Kanagawa (JP); Yoshiyuki Kawashima, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 175 days.

(21) Appl. No.: 14/190,183

(22) Filed: Feb. 26, 2014

(65) Prior Publication Data
US 2014/0239378 A1    Aug. 28, 2014

(30) Foreign Application Priority Data

Feb. 28, 2013    (JP) ................. 2013-039678

(51) Int. Cl.
*H01L 29/792* (2006.01)
*H01L 29/66* (2006.01)
(Continued)

(52) U.S. Cl.
CPC ....... *H01L 29/792* (2013.01); *H01L 27/11565* (2013.01); *H01L 27/11568* (2013.01); *H01L 29/4234* (2013.01); *H01L 29/66833* (2013.01)

(58) Field of Classification Search
CPC .... H01L 29/513; H01L 29/517; H01L 29/518; H01L 29/792; H01L 29/66; H01L 29/66833; H01L 27/11568; H01L 27/115; H01L 21/28194; H01L 21/28202; H01L 21/28282
(Continued)

(56) References Cited

U.S. PATENT DOCUMENTS 8,373,216 B2 *   2/2013   Chakihara ......... H01L 21/28273
                                                         257/298
2010/0078705 A1   4/2010   Chakihara et al.
(Continued)

FOREIGN PATENT DOCUMENTS

JP       2010-087252         4/2010
JP       2011-222938 A      11/2011
(Continued)

OTHER PUBLICATIONS

Office Action issued Jul. 5, 2016, in Japanese Patent Application No. 2013-039678.

*Primary Examiner* — Monica D Harrison
(74) *Attorney, Agent, or Firm* — Shapiro, Gabor and Rosenberger, PLLC

(57) ABSTRACT

In an MONOS-type memory cell with a split gate structure, short circuit between a selection gate electrode and a memory gate electrode is prevented, and reliability of a semiconductor device is improved. In a MONOS memory having a selection gate electrode and a memory gate electrode that are adjacent to each other and that extend in a first direction, an upper surface of the selection gate electrode in a region except for a shunt portion at an end portion of the selection gate electrode in the first direction is covered with a cap insulating film. The memory gate electrode is terminated on the cap insulating film side with respect to a border between the cap insulating film and an upper surface of the shunt portion exposed from the cap insulating film.

13 Claims, 60 Drawing Sheets

(51) Int. Cl.
*H01L 27/115* (2006.01)
*H01L 29/423* (2006.01)

(58) Field of Classification Search
USPC .......................................... 438/287; 257/324
See application file for complete search history.

(56) References Cited

U.S. PATENT DOCUMENTS

| | | |
|---|---|---|
| 2011/0095348 A1 | 4/2011 | Chakihara et al. |
| 2011/0272753 A1 | 11/2011 | Funayama et al. |

FOREIGN PATENT DOCUMENTS

| | | |
|---|---|---|
| JP | 2013-021171 | 1/2013 |
| WO | WO 2010/082389 A1 | 7/2010 |

* cited by examiner

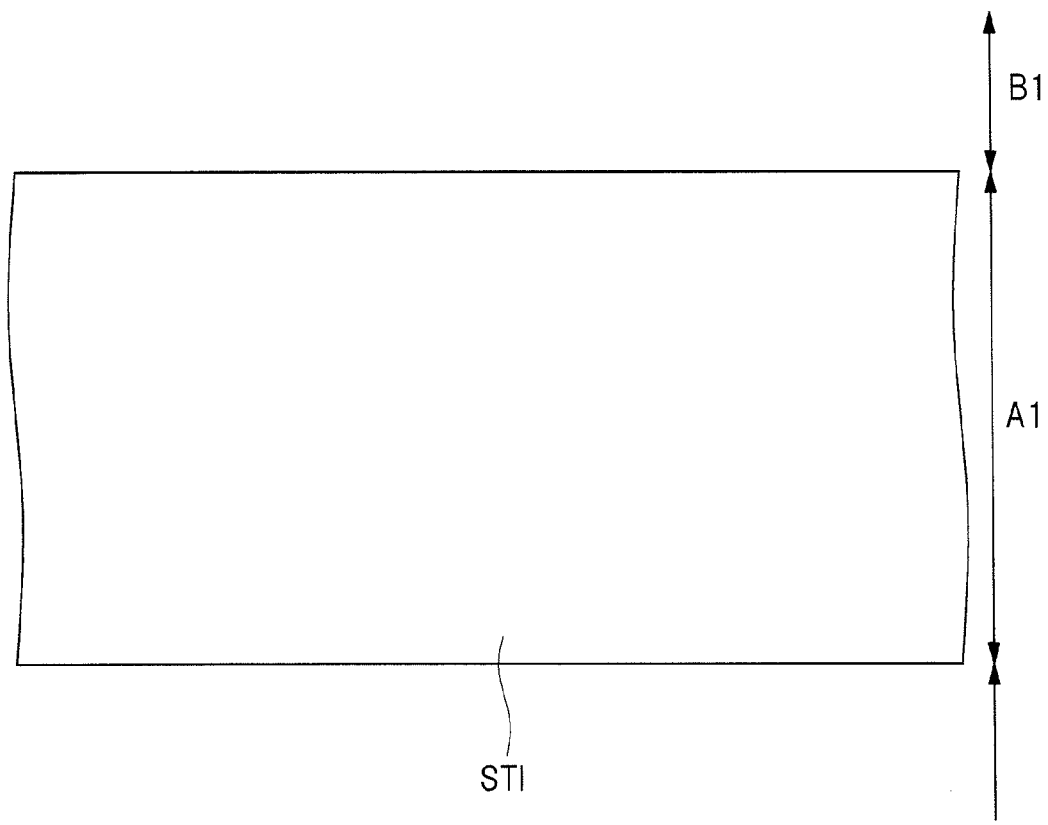
FIG. 6
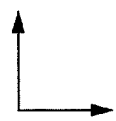
FIRST DIRECTION
SECOND DIRECTION

FIRST DIRECTION

SECOND DIRECTION

FIRST DIRECTION

SECOND DIRECTION

FIRST DIRECTION

SECOND DIRECTION

SEMICONDUCTOR DEVICE AND METHOD OF MANUFACTURING THE SAME

CROSS-REFERENCE TO RELATED APPLICATION

The present application claims priority from Japanese Patent Application No. 2013-039678 filed on Feb. 28, 2013, the content of which is hereby incorporated by reference into this application.

TECHNICAL FIELD

The present invention relates to a semiconductor device and a technique of manufacturing the same. More particularly, the present invention relates to a technique effectively applied to a semiconductor device having a nonvolatile memory cell of a MONOS (Metal Oxide Nitride Oxide Semiconductor) type with a split gate structure, and applied to a method of manufacturing the semiconductor device.

BACKGROUND

In recent years, as an element used for a nonvolatile memory cell, a MONOS type nonvolatile memory cell (hereinafter, simply referred to as an MONOS memory in some cases) using a nitride film as a charge storage layer has attracted attention. As the MONOS type nonvolatile memory cell, not only a memory cell with a single transistor structure but also a memory cell with a split gate structure having a two-transistor structure having a selection gate electrode and a memory gate electrode has been proposed.

The selection gate electrode and the memory gate electrode, which configure the MONOS memory with the split gate structure and which are adjacent to each other on a semiconductor substrate, are electrically insulated from each other by an insulating film that is interposed therebetween and includes a charge storage layer. When the MONOS memory is operated, information is stored and deleted by inputting/outputting electric charges to/from the charge storage layer.

International Patent Publication No. WO2010/082389 (Patent Document 1) describes that short circuit between the selection gate electrode and the memory gate electrode which are adjacent to each other is prevented by providing an insulating film on the selection gate electrode which configuring the MONOS memory with the split gate structure.

SUMMARY

In order to supply different electric potentials to the selection gate electrode and the memory gate electrode, a plug is connected to an upper surface of each of the electrodes. Here, when the upper surface of the selection gate electrode is covered with an insulating film as described in Patent Document 1, it is necessary to expose a part of the upper surface of the selection gate electrode from the insulating film because the plug is connected to the upper surface of the selection gate electrode in a shunt region serving as a power supply region.

At this time, when the memory gate electrode is formed adjacent to a side wall of the selection gate electrode whose upper surface is exposed in the shunt region, there is a risk of the short circuit between the selection gate electrode and the memory gate electrode through a silicide layer or others formed on the upper surfaces of the selection gate electrode and the memory gate electrode, resulting in degradation of the reliability of the semiconductor device.

The other preferred aims and novel characteristics of the present invention will be apparent from the description of the present specification and the accompanying drawings.

The typical summary of embodiments disclosed in the present application will be briefly described as follows.

In a semiconductor device according to one embodiment, the MONOS memory having the selection gate electrode and the memory gate electrode that are adjacent to each other and extend in a first direction has a structure in which the upper surface of the selection gate electrode in a region except for the shunt portion at the end portion of the selection gate electrode in the first direction is covered with a cap insulating film. In this case, the memory gate electrode is terminated on the cap insulating film side with respect to a border between the cap insulating film and the upper surface of the shunt portion exposed from the cap insulating film.

Moreover, in a method of manufacturing a semiconductor device according to another embodiment, the selection gate electrode and the memory gate electrode that are adjacent to each other and extend in a first direction are formed, and the upper surface of the selection gate electrode in a region except for the shunt portion at an end portion of the selection gate electrode in the first direction is covered with the cap insulating film. In this case, the memory gate electrode is terminated on the cap insulating film side with respect to a border between the cap insulating film and the upper surface of the shunt portion exposed from the cap insulating film.

Effects of the Invention

According to one embodiment disclosed in the present application, the reliability of the semiconductor device can be improved.

BRIEF DESCRIPTIONS OF THE DRAWINGS

FIG. 6 is a plan view of a principal part illustrating a method of manufacturing the semiconductor device according to the first embodiment of the present invention;

DETAILED DESCRIPTION

Hereinafter, embodiments will be described in detail based on the drawings. Note that components having the same function are denoted by the same reference symbols throughout all drawings for describing the embodiments, and the repetitive description thereof will be omitted. Also, in the following embodiments, the same or similar portions are not repeatedly described in principle except in particular requirement.

Also, in some drawings used in the following embodiments, hatching is partially added even in a plan view so as to make the drawings easy to see.

First Embodiment

In a nonvolatile storage element in which a gate electrode for selection (hereinafter, simply referred to as selection gate electrode) and a gate electrode for storage (hereinafter, simply referred to as memory gate electrode) are adjacent to each other so as to interpose an insulating film therebetween, the present embodiment will describe that the short circuit between the selection gate electrode and the memory gate electrode is prevented by devising a pattern shape of each gate electrode and a shape of the insulating film on the selection gate electrode.

Figure 1:
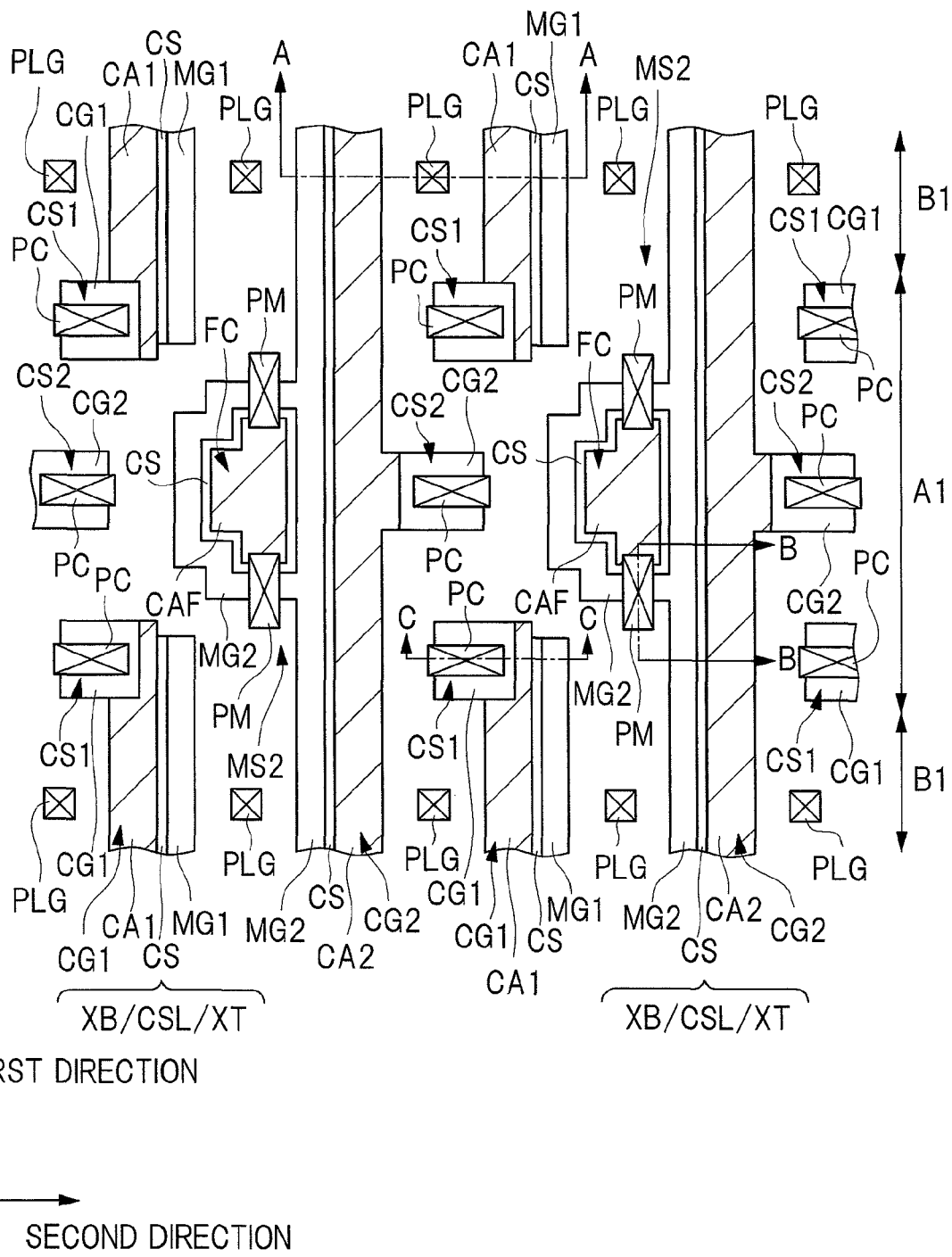
FIG. 1 is a plan view of a principal part illustrating a semiconductor device according to a first embodiment of the present invention.
Figure 2:
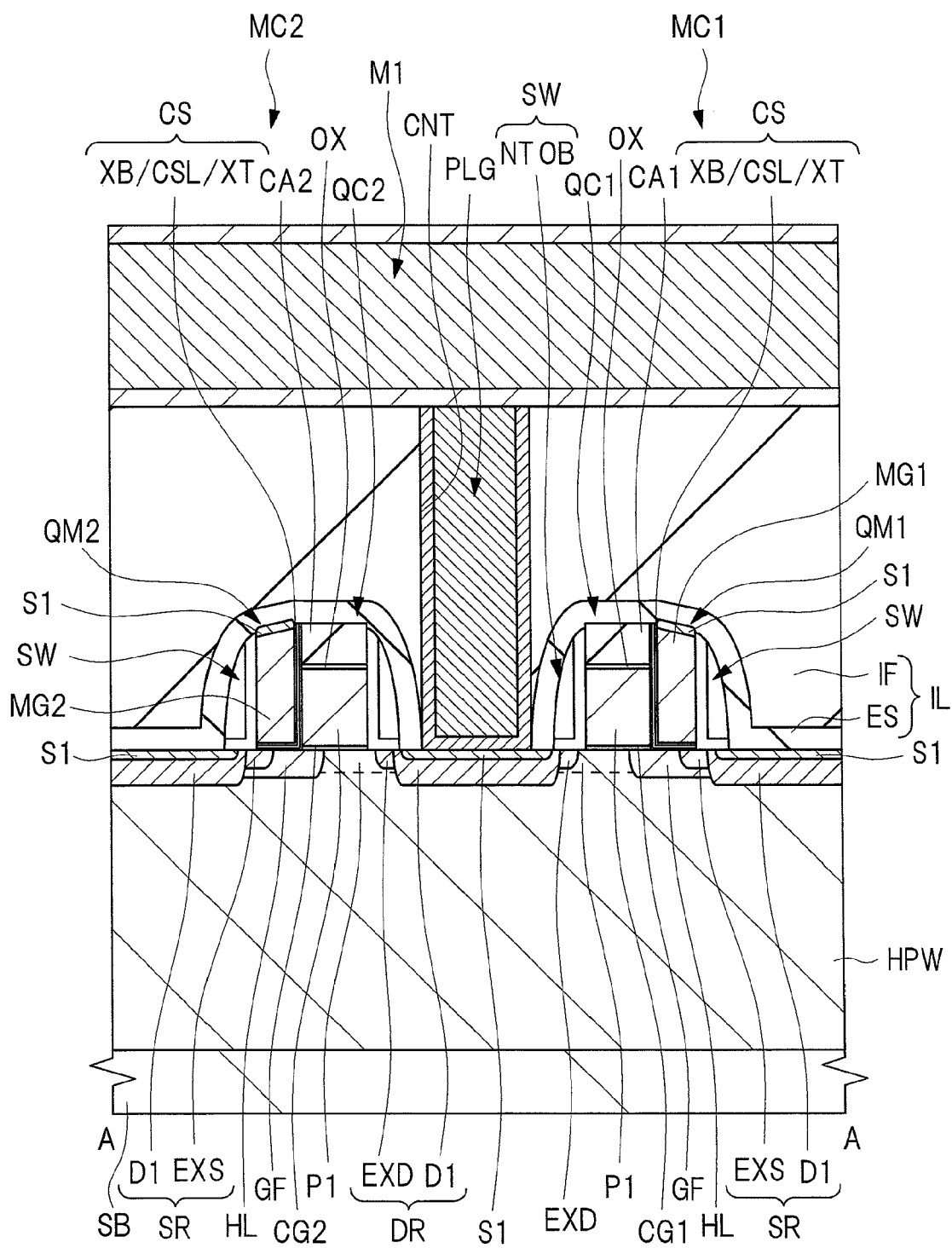
FIG. 2 is a cross-sectional view of a principal part illustrating the semiconductor device according to the first embodiment of the present invention.

First, FIG. 1 is a plan view of a principal part of the MONOS memory with the split gate structure according to a semiconductor device of the present embodiment. Moreover, FIG. 2 illustrates a cross-sectional view of the principal part taken along a line A-A of FIG. 1. Note that FIG. 1 illustrates only the selection gate electrode, the memory gate electrode, the insulating film that is interposed therebetween and includes the charge storage layer, the insulating film on the selection gate electrode, and the plug. In FIG. 1, hatching is added to the insulating film such as the cap insulating film formed on the selection gate electrode so as to easily understand the drawing. Moreover, on the plan view, a pattern outline covered with a resist pattern is illustrated by a dashed line.

As illustrated in FIG. 1, in the plan view, on a semiconductor substrate (not illustrated), a plurality of selection gate electrodes CG1 and CG2 extending in a first direction along a main surface of the semiconductor substrate are formed. The selection gate electrodes CG1 and CG2 are arranged so as to be alternately aligned in a second direction that is a direction along the main surface of the semiconductor substrate and that is orthogonal to the first direction. Moreover, a pattern of the selection gate electrode CG1 is separated in the first direction. In other words, a plurality of the selection gate electrodes CG1 extending in the first direction are arranged so as to be aligned in the first direction.

In this case, right above the selection gate electrodes CG1 and CG2, cap insulating films CA1 and CA2 each made of, for example, a silicon nitride film are formed, respectively. In a plan view, the cap insulating films CA1 and CA2 are arranged so as to overlap the selection gate electrodes CG1 and CG2, respectively. In other words, right below the cap insulating films CA1 and CA2, the selection gate electrodes CG1 and CG2 are always formed, respectively.

Moreover, a part of the upper surface of each of the selection gate electrodes CG1 and CG2 is exposed from each of the cap insulating films CA1 and CA2. The upper surface of each of the selection gate electrodes CG1 and CG2 in regions exposed from the cap insulating films CA1 and CA2 is a power supply region to which a plug PC for supplying power to each of the selection gate electrodes CG1 and CG2 is connected, that is, a shunt region. In this case, the selection gate electrodes CG1 and CG2 in the regions exposed from the cap insulating films CA1 and CA2 are referred to as shunt portions CS1 and CS2, respectively. To the upper surface of each of the shunt portions CS1 and CS2, a pillar-shaped plug PC having a shape extending in the second direction in a plan view is connected. That is, in the plan view, the plug PC has a shape such as a rectangular shape or an elliptical shape.

Note that although illustrations of the semiconductor substrate, a semiconductor layer formed on the upper surface of the semiconductor substrate, and an insulating layer for an element isolation region or others are omitted in FIG. 1, a power supply region A1 illustrated in FIG. 1, that is, a first region is an inactive region where an element isolation region is formed on the upper surface of the semiconductor substrate, and a semiconductor layer such as a source/drain region is formed in an active region B1, that is, a second region on the upper surface of the semiconductor substrate. Moreover, both of the shunt portions CS1 and CS2 where the upper surfaces of the selection gate electrodes CG1 and CG2 are exposed from the cap insulating films CA1 and CA2 are formed in the power supply region A1, and are formed in a region overlapping the element isolation region on the upper surface of the semiconductor substrate in a plan view.

That is, the shunt portions CS1 and CS2 are formed on the element isolation regions. Therefore, even when the plugs PC connected to the upper surface of each of the shunt portions CS1 and CS2 are formed so as to partially protrude from the shunt portions CS1 and CS2, the plug PC is partially connected to the upper surface of the element isolation region, and therefore, conduction of the plug PC and the selection gate electrodes CG1 and CG2 to the semiconductor substrate can be prevented.

The shunt portion CS1 is provided at an end portion in the first direction of the selection gate electrode CG1. On the other hand, the shunt portion CS2 is provided so as to protrude in the second direction from a side wall of the selection gate electrode CG2 extending in the first direction, but is not provided at an end portion of the selection gate electrode CG2 in the first direction. In this case, the selection gate electrode CG1 that extends in the first direction has a first side wall and a second side wall opposite to the first side wall. Moreover, the selection gate electrode CG2 that extends in the first direction has a third side wall and a fourth side wall opposite to the third side wall. All the first to fourth side walls are side walls that extend in the first direction. The first side wall of the selection gate electrodes CG1 and the third side wall of the selection gate electrodes CG2 which are adjacent to each other face each other. Moreover, the second side wall of the selection gate electrodes CG1 and the fourth side wall of the selection gate electrode CG2 which are adjacent to each other face each other.

The shunt portion CS1 is formed so as to protrude in the second direction from the first side wall of the selection gate electrode CG1. That is, the shunt portion CS1 of the selection gate electrode CG1 protrudes from the first side wall at the end portion of the selection gate electrode CG1 in the first direction toward the third side wall of the facing selection gate electrode CG2.

Moreover, the shunt portion CS2 protrudes in the second direction from the third side wall of the selection gate electrode CG2 in a portion at which the selection gate electrode CG1 is cut in the first direction, that is, in a region between the adjacent two selection gate electrodes CG1 in the first direction. That is, the shunt portion CS2 is arranged between the two shunt portions CS1 that are spaced apart from each other in the first direction. The cap insulating film CA1 is extended in the first direction and is arranged so as to be aligned with the shunt portion CS1 in the second direction, and therefore, a region to which the plug PC is connected is ensured in the shunt portions CS1 and CS2 as described above by expanding a width in the second direction more than in the selection gate electrodes CG1 and CG2 in regions covered with the cap insulating films CA1 and CA2.

To the second side wall of the selection gate electrode CG1 as well as to the fourth side wall of the selection gate electrode CG2, memory gate electrodes MG1 and MG2, which extend in the first direction, are provided so as to be adjacent thereto, respectively. Between the selection gate electrode CG1 and the memory gate electrode MG1, an insulating film XB, a charge storage layer CSL and an insulating film XT are sequentially formed from the second side wall of the selection gate electrode CG1 toward the memory gate electrode MG1. Similarly, between the selection gate electrode CG2 and the memory gate electrode MG2, the insulating film XB, the charge storage layer CSL and the insulating film XT are sequentially formed from the fourth side wall of the selection gate electrode CG2 toward the memory gate electrode MG2.

In this case, a stacked film formed of the insulating film XB, the charge storage layer CSL and the insulating film XT is referred to as an ONO (Oxide Nitride Oxide) film CS. The ONO film CS serving as an insulating film is interposed between the selection gate electrode CG1 and the memory gate electrode MG1, and besides, between the selection gate electrode CG2 and the memory gate electrode MG2, so that these electrodes are electrically insulated from each other. In FIGS. 1 and 2, the insulating film XB, the charge storage layer CSL and the insulating film XT formed sequentially from the semiconductor substrate side and from each side wall side of the selection gate electrodes CG1 and CG2 are denoted by symbols XB/CSL/XT.

The memory gates MG1 and MG2 are formed so as to be adjacent to the second wall of the selection gate electrode CG1 and the fourth wall of the selection gate electrode CG2. That is, the memory gate electrodes MG1 and MG2 are arranged so as to face each other between the selection gate electrodes CG1 and CG2 that are adjacent to each other in the second direction. Note that, as similar to the selection gate electrode CG1, the memory gate electrode MG1 is arranged so as to be separated in the first direction. On the other hand, the memory gate electrode MG2 extends along the selection gate electrode CG2 without being separated.

In the vicinity of the region between the shunt portions CS1 adjacent to each other in the first direction, a shunt portion MS2 serving as a power supply region for the memory gate electrode MG2 is formed on the fourth side wall of the selection gate electrode CG2. Regarding the second direction, in the power supply region A1, the selection gate electrode CG2 is made adjacent to one side wall of the memory gate electrode MG2, and a selection gate electrode FC, which is kept in an electrically floating state, is formed on the other side wall. In a plan view, the peripheral portion of the selection gate electrode FC is surrounded by the memory gate electrode MG2.

That is, the selection gate electrode FC is a conductive film in the same layer as those of the selection gate electrodes CG1 and CG2 but is not connected to the selection gate electrodes CG1 and CG2. Note that the film in the same layer described in the present application refers to a film formed in the same process in a production process. That is, it is considered that the films in the same layer are spaced apart from each other and are not integrally formed. Moreover, the films in the same layer are not always formed with the same height as each other from the main surface of the semiconductor substrate. Furthermore, the ONO film CS is also interposed between the selection gate electrode FC and the memory gate electrode MG2 that is adjacent to the selection gate electrode FC. Also, the upper surface of the selection gate electrode FC is covered with a cap insulating film CAF that is an insulating film in the same layer as those of the cap insulating films CA1 and CA2.

The memory gate electrode MG2 is a sidewall-shaped electrode formed on the side wall of the selection gate electrode CG2 in self alignment, and therefore, cannot form a pattern of the power supply region having a wide area in a plan view as different from the shunt portions CS1 and CS2 formed by a patterning process. Moreover, since the memory gate electrodes MG1 and MG2 are the self-alignment formed patterns, the width of each of the memory gate electrodes MG1 and MG2 in a direction orthogonal to the first direction that is the extending direction of the memory gate electrodes MG1 and MG2, that is, in the second direction, is small.

Therefore, when the plug PM is tried to be simply connected to the upper surface of the memory gate electrode MG2 that extends along the fourth side wall of the selection gate electrode CG2, if positional misalignment of a formation position of the plug PM is caused due to a photomask misalignment, there is such a high possibility of connection failure between the memory gate electrode MG2 and the plug PM.

As described above, in the shunt portion MS2, the selection gate electrode FC is formed on the second side wall of the selection gate electrode CG2 via the memory gate electrode MG2. Although the cap insulating film CAF is formed on the selection gate electrode FC, the plug PM to be connected to the memory gate electrode MG2 is formed by removing a part thereof so as to be connected to the selection gate electrode FC. The plan view of FIG. 1 does not illustrate the removal of the part of the cap insulating film CAF because of the plug PM, and therefore, a cross-sectional surface thereof will be described in detail later.

Note that, even when the electrical short-circuit occurs between the selection gate electrode FC and the memory gate electrode MG2, there is no problem since the electrical short-circuit does not occur between the selection gate electrode CG2 and the memory gate electrode MG2 because the selection gate electrode FC is kept in the floating state. In the present embodiment, the plug PM for supplying the power to the memory gate electrode MG2 is formed so as to bridge a portion right above each of the selection gate electrode FC and the memory gate electrode MG2 formed along the side wall of the selection gate electrode FC.

In this manner, by forming the memory gate electrode MG2 adjacent to the selection gate electrode FC in the floating state as the shunt portion MS2, the short-circuit between the memory gate electrode MG2 and the selection gate electrode CG2 is prevented even when the positional misalignment of the formation position of the plug PM to be connected to the shunt portion MS2 is caused. Therefore, since a margin for the positional misalignment of the formation position of the plug PM can be expanded, the conduction failure between the plug PM and the memory gate electrode MG2 can be easily prevented.

Note that illustrations of the semiconductor substrate, the semiconductor layer formed on the upper surface of the semiconductor substrate, and the insulating layer such as the element isolation region are omitted in FIG. 1. However, the shunt portion MS2 corresponding to the region to which the plug PM is connected and other shunt portions are formed in the power supply region A1 where the element isolation region is formed on the upper surface of the semiconductor substrate. That is, the shunt portion MS2 is formed on the element isolation region. Therefore, even when a part of the plug PM connected to the upper surface of the shunt portion MS2 is formed so as to protrude from the shunt portion MS2, the plug PM and the memory gate electrode MG2 are not conducted to the semiconductor substrate since the part of the plug PM is connected to the upper surface of the element isolation region. Moreover, in a region not illustrated in FIG. 1, the plug PM is also connected to the upper surface of the memory gate electrode MG1. As similar to the shunt portion MS2, the plug PM is also connected to the upper surface of the memory gate electrode MG1 in an inactive region where an interlayer insulating film is formed on the upper surface of the semiconductor substrate.

In the active region B1, drain regions (not illustrated) are formed on the first side wall of the selection gate electrode CG1 and on the third side wall of the selection gate electrode CG2 on the upper surface of the semiconductor substrate (not illustrated). Moreover, source regions (not illustrated) are formed on the second side wall of the selection gate electrode CG1 and on the fourth side wall of the selection gate electrode CG2 on the upper surface of the semiconductor substrate (not illustrated).

A memory cell MC1 is configured of the selection gate electrode CG1 and the memory gate electrode MG1 that are adjacent to each other, and besides, the source region and the drain region that are arranged so as to sandwich the selection gate electrode CG1 and the memory gate electrode MG1 in a plan view. Moreover, a memory cell MC2 is configured of the selection gate electrode CG2 and the memory gate electrode MG2 that are adjacent to each other, and besides, the source region and the drain region that are arranged so as to sandwich the selection gate electrode CG2 and the memory gate electrode MG2 in a plan view. A plurality of memory cells MC1 and MC2 are alternately arranged in the second direction, and the adjacent memory cells MC1 and MC2 share either the drain region or the source region.

Figure 32:
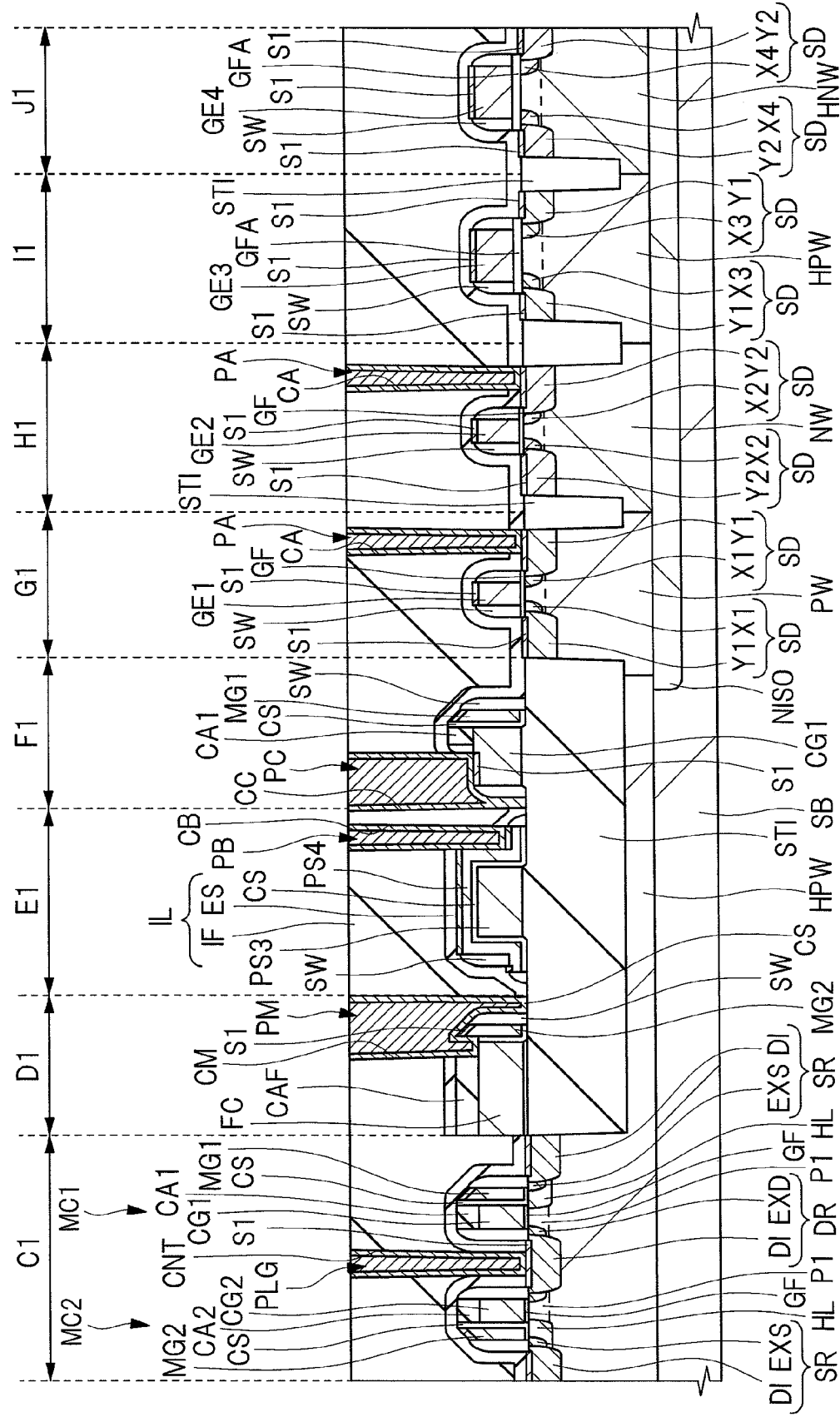
FIG. 32 is a cross-sectional view of a principal part illustrating the method of manufacturing the semiconductor device, continued from FIG. 30.

On the semiconductor substrate, in addition to the memory cells MC1 and MC2, a capacitive element, a low breakdown-voltage MISFET (Metal Insulator Semiconductor Field Effect Transistor), a high breakdown-voltage MISFET having a higher driving voltage than that of the low breakdown-voltage MISFET, and others although not illustrated are formed. The structures of these semiconductor elements are illustrated in FIG. 32 or others used for explaining a method of manufacturing the semiconductor device later.

Next, by using a cross-sectional view illustrated in FIG. 2, the memory cells MC1 and MC2 configuring the MONOS memory with split gate structure will be explained. FIG. 2 is a cross-sectional view of a principal part taken along a line A-A of FIG. 1. Here, a structure of a nonvolatile memory cell formed on a memory region, that is, on a region on which the memory cell is formed will be explained.

As illustrated in FIG. 2, a semiconductor substrate SB is made of, for example, a p-type single crystal silicon, and has an active region on a main surface (device formation surface) in which an n-type MISFET for selecting the memory cells MC1 and MC2 and an n-type MISFET for the memory are arranged. Hereinafter, the n-type MISFETs for selecting the memory cells MC1 and MC2 are referred to as selection nMISQC1 and QC2, respectively. Moreover, hereinafter, the n-type MISFETs for the memories of the memory cells MC1 and MC2 are referred to as memory nMISQM1 and QM2, respectively.

Moreover, in FIG. 2, since the memory cells MC1 and MC2 have mutually line symmetrical shapes, the structure of the memory cell MC1 will be mainly explained, and the descriptions of the structures of the memory cell MC2, the selection nMISQC2 and the memory nMISQM2 will be omitted in some cases.

The drain region DR of the memory cell MC1 has an LDD (Lightly Doped Drain) structure that includes, for example, an $n^-$-type semiconductor region EXD having a relatively low concentration and $n^+$-type semiconductor region DI having a relatively high concentration whose impurity concentration is higher than that of the $n^-$-type semiconductor region EXD. Moreover, each of the source regions SR of the memory cells MC1 and MC2 has the LDD structure that includes, for example, an $n^-$-type semiconductor region EXS having a relatively low concentration and an $n^+$-type semiconductor region DI having a relatively high concentration whose impurity concentration is higher than that of the $n^-$-type semiconductor region EXS. The $n^-$-type semiconductor regions EXD and EXS are arranged on each channel region side of the memory cells MC1 and MC2, and the $n^+$-type semiconductor region DI is arranged at a position spaced apart from each channel region side of the memory cells MC1 and MC2 by the $n^-$-type semiconductor regions EXD and EXS.

On the main surface of the semiconductor substrate SB between the drain region DR and the source region SR, the selection gate electrode CG1 of the selection nMISQC1 and the memory gate electrode MG1 of the memory nMISQM1 are formed adjacent to each other so as to extend in the first direction. In the first direction, the plurality of memory cells MC1 and MC2 are located adjacent to each other via an element isolation region STI having, for example, an STI (Shallow Trench Isolation) structure and being formed on the semiconductor substrate SB. On the upper surface of the selection gate electrode CG1, the cap insulating film CA1 is formed via an insulating film OX.

The memory gate electrode MG1 is formed in a sidewall shape on the one side face of a stacked film made of the cap insulating film CA1, the insulating film OX and the selection gate electrode CG1. As described above, no memory gate electrode MG1 is formed on the first side wall of the selection gate electrode CG1, and the memory gate electrode MG1 is formed on the second side wall of the selection gate electrode CG1 so as to be adjacent thereto. The selection gate electrode CG1 is made of, for example, an n-type low resistance polycrystal silicon, and the gate length of the selection gate electrode CG1 is set to, for example, about 80 to 120 nm. Moreover, the memory gate electrode MG1 is a second conductive film made of, for example, an n-type low resistance polycrystal silicon, and the gate length of the memory gate electrode MG1 is set to, for example, about 50 to 100 nm.

The insulating film OX is made of, for example, a silicon oxide film. The cap insulating film CA1 is an insulating film made of, for example, silicon nitride, silicon oxide, silicon oxide containing nitride, silicon carbide containing nitrogen, or others, and its thickness is, for example, about 50 nm. Moreover, the height from the main surface of the semiconductor substrate SB to the upper surface of the selection gate electrode CG1 is, for example, about 140 nm, and the height from the main surface of the semiconductor substrate SB to the upper surface of the memory gate electrode MG1 is made higher than the height of the upper surface of the selection gate electrode CG1 by about 50 nm.

Moreover, on the upper surface of the memory gate electrode MG1, a silicide layer S1 made of, for example, nickel silicide (NiSi), cobalt silicide ($CoSi_2$), or others, is formed. The thickness of the silicide layer S1 is, for example, about 20 nm. In the nonvolatile memory cell with the split gate structure, it is required to supply an electric potential to both of the selection gate electrode CG1 and the memory gate electrode MG1, and its operating speed greatly depends on the resistance values of the selection gate electrode CG1 and the memory gate electrode MG1. Therefore, by forming the silicide layer S1, it is desired to reduce the resistances of the selection gate electrode CG1 and the memory gate electrode MG1.

In the active region, the silicide layer S1 is formed only on the upper surface of the memory gate electrode MG1, and is not formed on the upper surface of the selection gate electrode CG1. However, by reducing the resistance of the conductive film forming the selection gate electrode CG1 or others, a desired operating speed can be obtained. The above-described silicide layer S1 is also formed on the upper surface of the $n^+$-type semiconductor region DI forming the source region SR or the drain region DR. Moreover, in the shunt portion not illustrated in FIG. 2, the silicide layer S1 is also formed on the upper surface of the selection gate electrode CG1.

Between the selection gate electrode CG1 and the main surface of the semiconductor substrate SB, a gate insulating film GF is formed. The gate insulating film GF is made of, for example, silicon oxide, and its film thickness is set to, for example, about 1 to 5 nm. On the element isolation region STI and on the semiconductor substrate SB via the gate insulating film GF, the selection gate electrode CG1 is arranged. A p-well HPW is formed on the main surface of the semiconductor substrate SB below the gate insulating film GF, and a p-type semiconductor region P1 is formed on the main surface of the p-well HPW by introducing, for example, B (boron) thereto. The semiconductor region P1 is a semiconductor region used for forming a channel of the selection nMISQC1, and a threshold value voltage of the selection nMISQC1 is set to a predetermined value by the semiconductor region P1.

The memory gate electrode MG1 is formed on a side face of the selection gate electrode CG1 via a gate insulating film, that is, an ONO film CS. The ONO film CS that insulates between the selection gate electrode CG1 and the memory gate electrode MG1 is made of a stacked film formed of an insulating film XB, a charge storage layer CSL and an insulating film XT. Moreover, the memory gate electrode MG1 is arranged on the semiconductor substrate SB via the ONO film CS.

The charge storage layer CSL is made of, for example, silicon nitride, and its thickness is set to, for example, about 5 to 20 nm. The insulating films XB and XT are made of, for example, silicon oxide, and the thickness of the insulating film XB is, for example, about 1 to 10 nm, and the thickness of the insulating film XT is, for example, about 4 to 15 nm. The insulating films XB and XT may be formed by using silicon oxide containing nitrogen.

In the present embodiment, as the charge storage layer CSL, an insulating film having a trap level is used. As one example of the insulating film having the trap level, the above-described silicon nitride film is cited. However, the insulating film is not limited to the silicon nitride film, and a high dielectric constant film having a dielectric constant higher than that of the silicon nitride film, such as an aluminum oxide (alumina) film, a hafnium oxide film or a tantalum oxide film, may be used.

The sidewalls SW are formed on the first side wall of the selection gate electrode CG1, that is, on the side face on the opposite side to the main gate electrode MG1 corresponding to the side face on the drain region DR side, and formed on one side face of the memory gate electrode MG1, that is, on the side face of the opposite side to the side adjacent to the selection gate electrode CG1 corresponding to the side face on the source region SR side. The sidewall SW is made of a stacked film formed of, for example, a silicon oxide film OB and a silicon nitride film NT. The thickness of the silicon oxide film OB is, for example, 20 nm, and the thickness of the silicon nitride film NT is, for example, 25 nm.

On the semiconductor substrate SB (p-well HPW) that is below the insulating film XB and located between the p-type semiconductor region P1 and the source region SR, an n-type semiconductor region HL is formed by introducing, for example, As (arsenic) or P (phosphorus) thereto. The n-type semiconductor region HL is a semiconductor region used for forming a channel of the memory nMISQM1 so that the threshold value voltage of the memory nMISQM1 is set to a predetermined value by the n-type semiconductor region HL.

The memory cell MC1 is covered with an interlayer insulating film IL, and a contact hole CNT that reaches the drain region DR is formed in the interlayer insulating film IL. The interlayer insulating film IL is made of a stacked film formed of, for example, a silicon nitride film ES and a silicon oxide film IF on the silicon nitride film ES.

To the drain region DR, a first layer wire M1 that extends in the second direction orthogonal to the first direction in which the selection gate electrode CG1 extends is connected via a plug PLG buried into the contact hole CNT. The plug PLG is formed of a stacked film including a relatively-thin barrier film made of a stacked film of, for example, Ti (titanium) and TiN (titanium nitride) and a relatively-thick conductive film made of W (tungsten), Al (aluminum), or others, formed so as to be covered by the barrier film. Note that, in a region not illustrated in FIG. 2, the plug PLG is also connected to the upper surface of the source region SR.

Figure 3A:
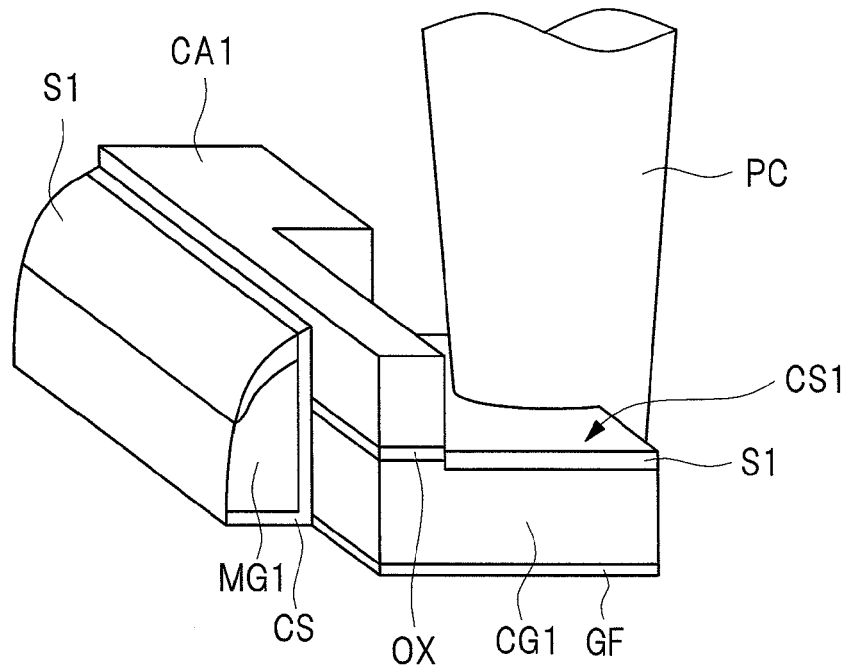
FIG. 3A is an overhead view of a principal part illustrating the semiconductor device according to the first embodiment of the present invention.
Figure 3B:
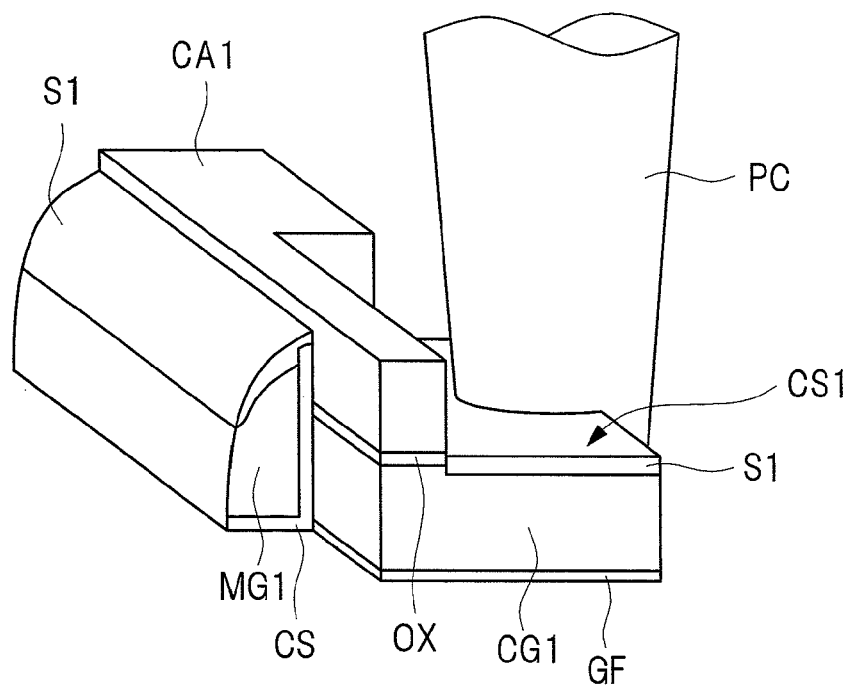
FIG. 3B is an overhead view of a principal part illustrating the semiconductor device according to the first embodiment of the present invention.

Here, FIGS. 3A and 3B illustrate a structure obtained when the selection gate electrode CG1 in the vicinity of the shunt portion CS1, the cap insulating film CA1 and the memory gate electrode MG1 are viewed from overhead. FIGS. 3A and 3B are overhead views of a principal part partially illustrating the MONOS memory with the split gate structure forming the semiconductor device of the present embodiment. FIGS. 3A and 3B are views obtained by viewing a pattern in the vicinity of the shunt portion CS1 at the end of the selection gate electrode CG1 illustrated in FIG. 1 from overhead.

As illustrated in FIG. 3A, the upper surface of the selection gate electrode CG1 extending in the first direction has the shunt portion CS1 exposed from the cap insulating film CA1 at the end thereof in the first direction, and the silicide layer S1 is formed on the upper surface of the selection gate electrode CG1 of the shunt portion CS1. The shunt portion CS1 is formed on the first side wall side of the selection gate electrode CG1, and the cap insulating film CA1 is formed between the shunt portion CS1 and the memory gate electrode MG1 formed adjacent to the second side wall of the selection gate electrode CG1. Moreover, in a region below the cap insulating film CA1, the selection gate electrode CG1 and the memory gate electrode MG1 are insulated from each other via the ONO film CS.

As illustrated in FIG. 3A, the memory gate electrode MG1 is formed on the side wall of the stacked film including the selection gate electrode CG1 and the cap insulating film CA1 in self alignment, and therefore, is formed higher than the selection gate electrode CG1. On the upper surface of the memory gate electrode MG1, the silicide layer S1 is formed. Here, as illustrated in FIG. 3B, a case in which the silicide layer S1 formed on the memory gate electrode MG1 is abnormally grown to be higher than the position of the ONO film CS can be considered.

However, even when the silicide layer S1 on the memory gate electrode MG1 is formed beyond the ONO film CS, the short circuit between the shunt portion CS1 and the memory gate electrode MG1 can be prevented since the cap insulating film CA1 is formed among the shunt portion CS1 exposed from the cap insulating film CA1, the memory gate electrode MG1, and the silicide layer S1 on the memory gate electrode MG1.

Figure 4:
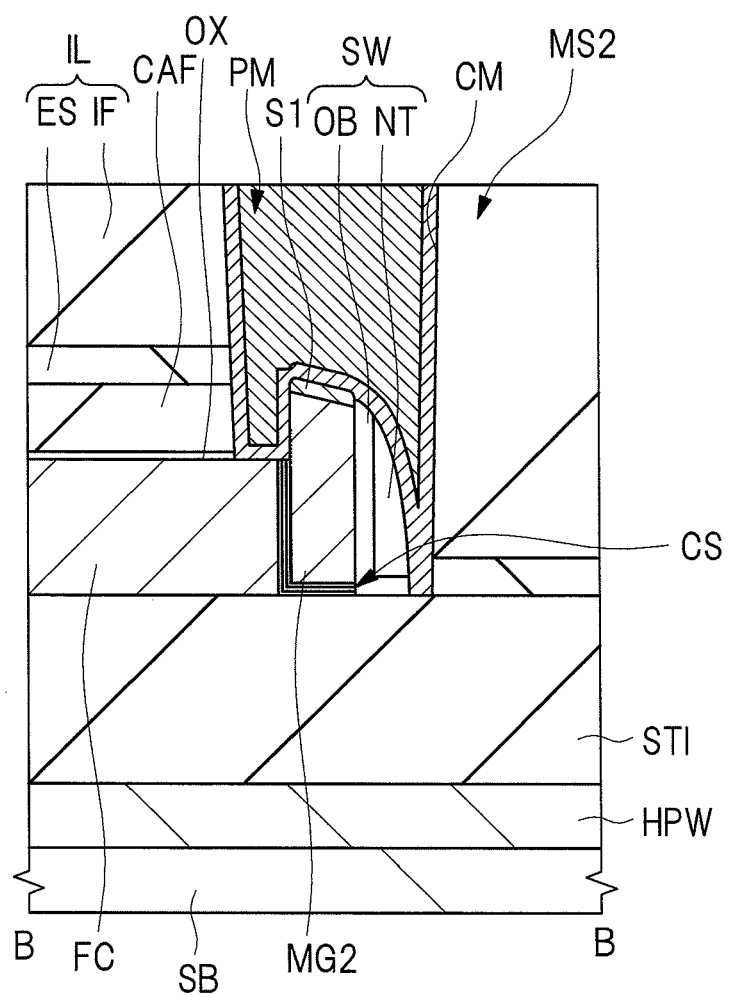
FIG. 4 is a cross-sectional view of a principal part illustrating the semiconductor device according to the first embodiment of the present invention.
Figure 5:
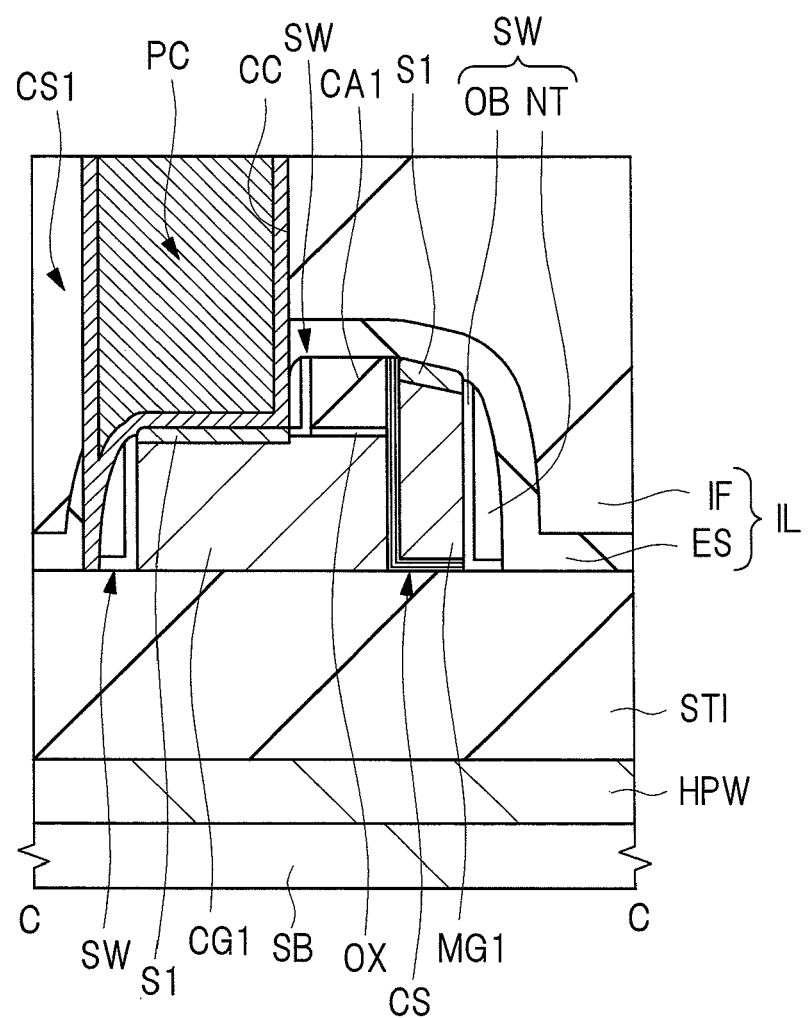
FIG. 5 is a cross-sectional view of a principal part illustrating the semiconductor device according to the first embodiment of the present invention.

Next, the structures of the shunt portion of the memory gate electrode (see FIG. 4) and the shunt portion of the selection gate electrode (see FIG. 5) that are formed in the power supply region will be explained. FIG. 4 is a cross-sectional view of a principal part taken along a line B-B of FIG. 1, which is a cross-sectional view of a principal part in the power supply region of the memory gate electrode MG2. FIG. 5 is a cross-sectional view of a principal part taken along a line C-C of FIG. 1, which is a cross-sectional view of a principal part in the power supply region of the selection gate electrode CG1.

As illustrated in FIG. 4, the structure of the shunt portion MS2 of the memory gate electrode MG2 formed in the power supply region is different from the structures of the selection nMISQC1 and the memory nMISQM1 formed in the memory region illustrated in FIG. 2 in that the memory gate electrode MG2 and the selection gate electrode FC are formed in the element isolation region STI. Moreover, the structure of the insulating film including the cap insulating film CA1 is also different. These structures will be described in detail later. In the interlayer insulating film IL in the power supply region, a contact hole CM which reaches the silicide layer S1 is opened, the contact hole being formed on the upper surface of the memory gate electrode MG2 formed on the side face of the selection gate electrode FC via the ONO film CS.

The contact hole CM is formed on each of the element isolation region STI in the power supply region, the sidewall SW, the memory gate electrode MG2 and the ONO film CS. The memory gate electrode MG2 in the power supply region is connected to a first layer wire (not illustrated) via the plug PM formed of a conductive film buried into the contact hole CM.

In this case, each contact hole CM has a shape ridden above the selection gate electrode FC, and the cap insulating film CAF and the insulating film OX on the selection gate electrode FC are removed in the region where the contact hole CM is formed. Therefore, a part of the upper surface of the selection gate electrode FC is exposed from the cap insulating film CAF and the insulating film OX, and is in contact with the plug PM. Moreover, the ONO film CS formed on the side walls of the removed parts of the cap insulating film CAF and the insulating film OX is also removed.

In this manner, the plug PM is also in contact with the side face of the silicide layer S1 on the selection gate electrode FC side formed on the memory gate electrode MG2, and therefore, the contact area between the plug PM and the silicide layer S1 can be increased, and the contact resistance between the plug PM and the memory gate electrode MG2 can be reduced. The selection gate electrode FC located below the plug PM is not connected to the selection gate electrode CG2, and is kept in the floating state. Therefore, as described above, even when the plug PM for supplying the power to the memory gate electrode MG is in contact with the selection gate electrode FC, the electrical short circuit between the selection gate electrode CG2 and the memory gate electrode MG2 does not occur.

Since the contact hole CM is formed on the element isolation region STI, the plug PM is not connected to the semiconductor substrate SB.

Moreover, as illustrated in FIG. 5, the structure of the shunt portion CS1 of the selection gate electrode CG formed in the power supply region is different from the structure of the selection nMISQC1 (see FIG. 2) formed in the memory region. In the selection nMISQC1 formed in the memory region, the cap insulating film CA1 is formed so as to cover the entire upper surface of the selection gate electrode CG1. However, the cap insulating film CA1 is not formed on a part of the upper surface of the selection gate electrode CG1 formed in the power supply region. In other words, the part of the upper surface of the selection gate electrode CG1 is exposed from the cap insulating film CA1.

Furthermore, on the upper surface of the selection gate electrode CG1 exposed from the cap insulating film CA1, the silicide layer S1 is formed. On the interlayer insulating film IL in the power supply region, a contact hole CC that reaches the silicide layer S1 formed on the upper surface of the selection gate electrode CG1 is formed. The selection gate electrode CG1 in the power supply region is connected to the first layer wire (not illustrated) on the interlayer insulating film IL via the plug PC formed of a conductive film buried into the contact hole CC.

Moreover, the cap insulating film CA1 is formed on the upper surface of the selection gate electrode CG1, that is, on the upper surface on the second side wall side, and the ONO film CS and the memory gate electrode MG1 are formed adjacent to the side walls of the selection gate electrode CG1 and the cap insulating film CA1, that is, the side walls including the second side wall side.

In this case, in order to prevent the short circuit between the selection gate electrode CG1 and the memory gate electrode MG1 via the silicide layer S1 or others, the cap insulating film CA1 covering a part of the upper surface of the selection gate electrode CG1 in the shunt portion CS1 is formed. A reason why the part of the upper surface of the selection gate electrode CG1 in the shunt portion CS1 is covered with the cap insulating film CA1 is that the short circuit between selection gate electrode CG1 and the memory gate electrode MG1 caused by the approaching of the region where the upper surface of the selection gate electrode CG1 is exposed from the insulating film and the memory gate electrode MG1 is prevented. Therefore, the region where the cap insulating film CA1 is formed right above the selection gate electrode CG1 corresponds to the side on which the memory gate electrode MG1 is formed, that is, the second side wall side of the selection gate electrode CG1.

As described above with reference to FIG. 4, in the shunt portion MS2 in the power supply region, the contact hole CM formed on the interlayer insulating film IL is formed so as to reach the memory gate electrode MG2 of the memory nMISQM2 (see FIG. 2) in the power supply region, and the plug PM is buried inside the contact hole CM, so that the memory gate electrode MG2 and the plug PM are electrically connected with each other.

Since the sidewall-shaped memory gate electrode MG2 formed in the self alignment has a narrow width in a plan view, there is a risk that the connection failure between the memory gate electrode MG2 and the plug PM occurs if the positional misalignment of the formation position of the plug PM is caused. Moreover, if the positional misalignment of the formation position of the plug PM is caused, there is a risk that the contact area between the memory gate electrode MG2 and the plug PM becomes smaller, which results in the increase in the contact resistance.

On the other hand, by using the above-described structure, a preferable electrical connection can be obtained between the memory gate electrode MG2 and the plug PM. Moreover, the area of the semiconductor device having a nonvolatile memory cell can be downsized. Furthermore, the production yield of the semiconductor device having the nonvolatile memory cell can be improved.

As illustrated in FIG. 5, in the shunt portion CS1 in the power supply region of the selection gate electrode CG1, the upper surface of the selection gate electrode CG1 of the selection nMISQC1 (see FIG. 2) is exposed from the cap insulating film CA1, so that the silicide layer S1 is formed thereon.

Therefore, the contact hole CC formed in the interlayer insulating film IL in the same process as that of the contact hole CM can easily reach the silicide layer S1 on the upper surface of the selection gate electrode CG1, and therefore, the preferable electrical connection can be obtained between the selection gate electrode CG1 and the plug PC to be buried inside the contact hole CC.

Moreover, since the cap insulating film CA1 is formed on the upper surface of the selection gate electrode CG1 in the active region B1 (see FIG. 1), it is not necessary to consider a failure such as the short circuit between the memory gate electrode MG1 and the selection gate electrode CG1 upon forming the silicide layer S1. Here, as described above, the silicide layer S1 is formed on the selection gate electrode CG1 in the shunt region of the selection gate electrode CG1. At this time, the height of the memory gate electrode MG1 can be also formed to be lower than the height of the selection gate electrode CG1 in order to eliminate the failure such as the short circuit as described above although there is no particular problem because the ONO film CS is formed between the memory gate electrode MG1 and the selection gate electrode CG1.

Figure 62:
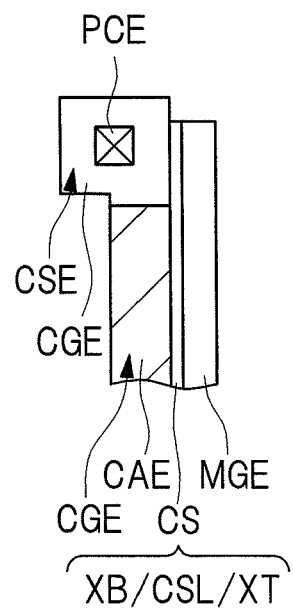
FIG. 62 is a plan view of a principal part illustrating a semiconductor device of a comparative example.
Figure 63:
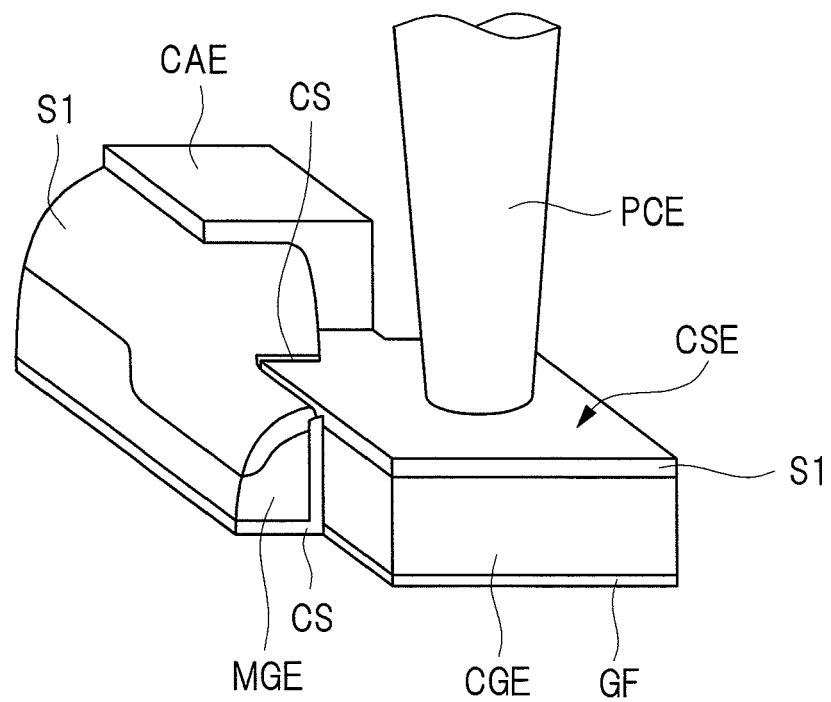
FIG. 63 is an overhead view of a principal part illustrating the semiconductor device of the comparative example.

Next, with reference to a comparative example illustrated in FIGS. 62 and 63, effects of the semiconductor device according to the present embodiment will be explained. FIG. 62 is a plan view of a principal part of a semiconductor device according to the comparative example. FIG. 63 is an overhead view of the semiconductor device according to the comparative example. FIG. 63 is a view obtained by viewing a pattern illustrated in FIG. 62 from overhead. The selection gate electrode and the memory gate electrode illustrated in FIGS. 62 and 63 form patterns corresponding to the end portions of the selection gate electrode CG1 and the memory gate electrode MG1 adjacent to each other in the first direction as illustrated in FIG. 1, that is, a pattern corresponding to the vicinity of the shunt portion CS1.

FIGS. 62 and 63 illustrate the patterns of the selection gate electrode CGE and the memory gate electrode MGE configuring the MONOS memory with the split gate structure according to the semiconductor device of the comparative example. Note that, in FIGS. 62 and 63, illustrations of the semiconductor substrate and the sidewall made of the insulating film, or others, are omitted. Moreover, in FIG. 62, illustrations of the silicide layer S1 and the memory gate electrode MGE ridden above the selection gate electrode CGE are omitted.

As illustrated in FIG. 63, the selection gate electrode CGE is formed on the semiconductor substrate (not illustrated) via the gate insulating film GF so as to extend in the first direction, and the memory gate electrode MGE is formed in a sidewall shape so as to be adjacent to one of the side walls extending in the first direction among the side walls of the gate insulating film GF and extend in the first direction. The selection gate electrode CGE and memory gate electrode MGE adjacent to each other are insulated from each other by the ONO film CS, and the memory gate electrode MGE and the semiconductor substrate below memory gate electrode MGE are insulated from each other by the OMO film CS.

The upper surface of the selection gate electrode CGE is covered with the cap insulating film extending in the first direction via the insulating film OX, and the end portion of the selection gate electrode CGE in the first direction, that is, the upper surface of the shunt portion CSE, is exposed from the cap insulating film CAE and the insulating film OX. The upper surface of the selection gate electrode CGE of the shunt portion CSE is covered with the silicide layer S1, and a plug PCE for supplying an electric potential to the selection gate electrode CGE is connected onto the upper surface of the silicide layer S1.

The upper surface of the memory gate electrode is covered with the silicide layer S1. The memory gate electrode MGE is a pattern formed in self alignment on the side walls of the selection gate electrode CGE and the cap insulating film CAE. Therefore, in the memory gate electrode MGE, the side wall of the stacked-layer pattern including the selection gate electrode CGE and the cap insulating film CAE is higher than the pattern formed on the side wall of the selection gate electrode CGE in the shunt portion CSE. Moreover, in the manufacturing processes of the semiconductor device, the memory gate electrode MGE is also formed in a sidewall shape on the side wall of the cap insulating film CAE at a border between the region where the selection gate electrode CGE is covered with the cap insulating film CAE and the region where the upper surface of the selection gate electrode CGE is exposed from the cap insulating film CAE. In other words, during the manufacturing processes of the semiconductor device, the memory gate electrode MGE is also formed right above the selection gate electrode CGE.

Note that the memory gate electrode MGE formed so as to be ridden above the selection gate electrode CGE is a portion to be removed in a process for removing the memory gate electrode MGE adjacent to one of the side walls of the selection gate electrode CGE extending in the first direction. However, when an etching amount is small due to a period of time required for an isotropic etching process such as wet etching, there is a risk that the memory gate electrode MGE partially remains on the selection gate electrode CGE. Moreover, the silicide layer S1 is formed on a partial surface of this memory gate electrode MGE.

In this case, it is considered that the selection gate electrode CGE and the memory gate electrode MGE placed thereon are separated from each other by the ONO film CS interposed therebetween. However, when the silicide layer S1 is formed on the upper surface of the selection gate electrode CGE and on the upper surface of the memory gate electrode MGE, there is a risk that the short circuit occurs between the selection gate electrode CGE and the memory gate electrode MGE via the silicide layers S1. Moreover, there is a risk that the memory gate electrode MGE formed on the selection gate electrode CGE and the plug PCE connected onto the shunt portion CSE are connected to each other, which results in the short circuit therebetween.

Even when no memory gate electrode MGE remains on the selection gate electrode CGE, if a region where the upper surface of the selection gate electrode CGE is exposed from the cap insulating film CAE as illustrated in FIG. 62, that is, the shunt portion CSE and the memory gate electrode MGE are adjacent to each other, there is a risk that the short circuit occurs between the selection gate electrode CGE and the memory gate electrode MGE. That is, when the silicide layer S1 (not illustrated) is formed on the upper surfaces of the respective electrodes that are adjacent to each other via the ONO film CS that is the extremely thin insulating film, there is a risk that the short circuit occurs between the selection gate electrode CGE and the memory gate electrode MGE above the upper portions of the respective electrodes via the silicide layer S1.

As described above, there is such a problem that the short circuit easily occurs through two routes between the selection gate electrode CGE and the memory gate electrode MGE in the shunt portion CSE at the end portion of the selection gate electrode CGE in the first direction. This problem is caused by forming the memory gate electrode MGE so as to be adjacent to the shunt portion CS1 in the case of the formation of the shunt portion CSE on the end portion of the selection gate electrode CGE extending in the first direction after the end portion of the selection gate electrode CGE is exposed from the cap insulating film CAE.

In other words, by forming the shunt portion CS2 not on the end portion of the pattern extending in the first direction but the third side wall in the middle thereof as the selection gate electrode CG2 illustrated in FIG. 1, the shunt portion CS2 and the memory gate electrode MG2 formed only on the fourth side wall can be easily insulated from each other by the cap insulating film CA2. On the other hand, when the shunt portion CSE is formed at the end portion of the pattern extending in the first direction as illustrated in FIG. 62, the memory gate electrode MGE is sometimes formed so as to go round behind the side wall of the selection gate electrode CGE, that is, behind the side wall side where no memory gate electrode MGE is formed due to the small etching amount or others in the removal of the memory gate electrode MGE as described above.

Note that, when the period of time or others required for the etching process is increased in order to avoid an insufficient etching amount as described above, the memory gate electrode MGE is excessively removed so as to recede, and the memory gate electrode MGE in the active region is partially sometimes removed. In this case, since the region to be used as the memory cell becomes smaller, a desired performance as the nonvolatile memory element cannot be obtained, and therefore, a problem of reduction in the reliability of the semiconductor device arises.

In the active region as illustrated in FIG. 2, since the upper surface of the selection gate electrode CG1 is covered with the cap insulating film CA1, the short circuit of the memory gate electrode MG1 with the selection gate electrode CG1 can be prevented even when the silicide layer S1 on the upper surface of the memory gate electrode MG1 is formed at a position higher than the ONO film CS. However, in order to supply power to the selection gate electrode CG1, it is required to expose the upper surface of the selection gate electrode CG1 from the cap insulating film CA1 in any of the regions. In this case, by exposing the end portion of the selection gate electrode CGE in the first direction from the cap insulating film CAE as seen in the above-described comparative example illustrated in FIGS. 62 and 63, a problem of the short circuit is caused when the shunt portion CSE and the memory gate electrode MGE are placed adjacent to each other.

Note that, a reason why, the selection gate electrode CG1 is separated in the first direction as illustrated in FIG. 1, and then, the shut portion CSE is formed at the end portion of the selection gate electrode CGE as illustrated in FIG. 62, is that a layout size of the arrangement of the plurality of memory cells is decreased as small as possible so as to densely arrange the semiconductor elements. Moreover, by separating the selection gate electrode CG1, a wide area can be ensured for the shunt portion serving as the power supply region to the memory gate electrode MG2 to be formed in the region between the separated parts, and a margin for the positional misalignment upon the connection between the plug PM and the memory gate electrode MG2 can be expanded, and besides, an effect for preventing the increase in the resistance value due to the reduction in the contact area between the plug PM and the memory gate electrode MG2 due to the positional misalignment can be obtained.

In this case, for example, a region where the plug PM extending in the second direction is connected to two memory gate electrodes MG2 can be ensured. On the other hand, when the selection gate electrode CG1 is not separated but extends in the first direction, the area of the shunt portion of the memory gate electrode is smaller than that of the structure illustrated in FIG. 1 because the layout size is minimized. In this case, it is considered that only one portion can be ensured as a portion where the plug PM extending in the first direction in the power supply region A1 can be connected to the memory gate electrode MG2.

Moreover, as illustrated in FIG. 62, in the comparative example, the shape of the plug PCE in a plan view is set to be a square shape or a round shape, so that the widths of the plug PCE in the first direction and the second direction are equalized. In other words, the shape of the plug PCE in a plan view is not such a shape extending in one direction as a rectangular shape or an elliptical shape.

As described above, if the short circuit occurs between the selection gate electrode CGE and the memory gate electrode MGE due to the fact that the memory gate electrode MGE and the shunt portion CSE where the upper surface of the selection gate electrode CGE is exposed from the cap insulating film CAE are arranged adjacent to each other, the memory cell including these electrodes is not normally operated, and therefore, the reliability of the semiconductor device is reduced.

On the other hand, in the MONOS memory with the split gate structure according to the semiconductor device of the present invention, by further extending the cap insulating film CA1 to the end portion of the selection gate electrode CG1 as illustrated in FIG. 1, the cap insulating film CA1 is interposed between the shunt portion CS1 on the first side wall side of the selection gate electrode CG1 and the memory gate electrode MG1 on the second side wall side of the selection gate electrode CG1 in a plan view.

That is, the memory gate electrode MG1 is terminated on the second side wall side, that is, the cap insulating film CA1 side, so as to be closer than the border between the region where the selection gate electrode CG1 is covered with the cap insulating film CA1 and the region where the upper surface of the selection gate electrode CG1 is exposed from the cap insulating film CA1, that is, the shunt portion CS1, so that it is prevented to arrange the memory gate electrode MG1 and the shunt portion CS1 so as to be adjacent to each other. In other words, in the first direction, the memory gate electrode MG1 is terminated on the active region side, that is, on the source region side so as to be closer than the border.

In other words, the memory gate electrode MG1 extending in the first direction is terminated at the portion adjacent to the cap insulating film CA1 in a plan view. That is, the memory gate electrode MG1 does not go round behind the shunt portion CS1 side so as to be closer than the border.

Also, in other words, the memory gate electrode MG1 is adjacent only to the side wall of the stacked film including the selection gate electrode CG1 and the cap insulating film CA1, and is terminated in the region adjacent to the side wall.

Here, in the present embodiment, the end portion of the cap insulating film CA1 in the first direction is extended longer than that of the above-described comparative example, and the shunt portion CS1 and the cap insulating film CS1 are arranged so as to be aligned with each other in the second direction. Moreover, by extending the end portion of the cap insulating film CA1 in the first direction, the end portion is allowed to reach a portion right above the farthest end portion of the selection gate electrode CG1 in the first direction. That is, in the first direction, the cap insulating film CA1 is extended to a position reaching a portion right above the side at the end portion of the selection gate electrode CG1, that is, the position right above the side along the second direction. In this manner, by extending the cap insulating film CA1, the memory gate electrode MG1 adjacent to the second side wall of the selection gate electrode CG1 can be more reliably insulated from the shunt portion CS1.

As described above, the short circuit between the selection gate electrode CG1 and the memory gate electrode MG1 can be prevented by forming such a pattern that the cap insulating film CA1 is interposed in a plan view between the selection gate electrode CG1 exposed from the cap insulating film CA1 in the shunt portion CS1 and the memory gate electrode MG1 adjacent to the selection gate electrode CG1. Thus, the reliability of the semiconductor device can be increased.

In this case, the width of the shunt portion CS1 in the second direction is narrower than that of the above-described comparative example. Therefore, when a plug PCE having a small cross-sectional area as illustrated in FIG. 62 is to be connected to the shunt portion CS1 illustrated in FIG. 1, if the positional misalignment of the formation position of the plug PCE occurs, the plug PCE cannot be connected to the shunt portion CS1 in some cases. Moreover, when the positional misalignment occurs between the shunt portion CS1 and the plug PCE, there is a risk that the contact area of the plug PCE with respect to the shunt portion CSE is reduced, which results in increase in the contact resistance. Therefore, in the present embodiment, as illustrated in FIG. 1, the plug PC is formed in a rectangular shape or an elliptical shape extending in the second direction.

Therefore, even when the width of the shunt portion CS1 in the second direction is narrowed by extending the cap insulating film CA1, a desired contact area can be ensured between the shunt portion CS1 and the plug PC, and the plug PC can be reliably connected to the upper surface of the selection gate electrode CG1. In this manner, since the margin for the misalignment in the formation processes of the pattern and the plug can be expanded, the manufacturing processes of the semiconductor device can be facilitated, and the reliability of the semiconductor device can be improved. Moreover, by extending the length of the plug PC in the second direction, it is not required to extend the width of the pattern of the selection gate electrode CG1 in the shunt portion CS1 in the second direction, and therefore, the increase in the layout size of the selection gate electrode CG1 in the second direction can be prevented. Thus, the semiconductor device can be easily miniaturized.

Moreover, as illustrated in FIG. 1, in the present embodiment, the cap insulating film CA1 is extended to a region to be adjacent to the shunt portion CS1 in the second direction. The following structure is also considered as the structure in which the memory gate electrode MG1 is terminated in the region adjacent to the cap insulating film CA1 so that the memory gate electrode MG1 is not adjacent to the shunt portion CS1 in a plan view. That is, as similar to the cap insulating film CAE of the comparative example illustrated in FIG. 62, it is considered to provide a structure in which the cap insulating film CA1 is formed so as to be shorter than the selection gate electrode CG1 in the first direction, and besides, in which the memory gate electrode MG1 is also shorter than the cap insulating film CA1 in the same direction.

In this case, the position at which the memory gate electrode MG1 is terminated is always located on the active region B1 side so as to be closer than the shunt portion CS1. Therefore, it is required to provide a certain distance between the shunt portion CS1 and the active region B1 in order not to remove the memory gate electrode MG1 in the active region due to the variation in the etching amount in the partial removal of the memory gate electrode MG1. Consequently, the pattern of the gate electrode of the MONOS memory in the first direction becomes longer to increase the area occupied by the MONOS memory on the semiconductor substrate, which results in a problem of difficulty in the miniaturization of the semiconductor device.

On the other hand, in the present embodiment, by extending the cap insulating film CA1 to the region adjacent to the shunt portion CS1 in the second direction, the memory gate electrode MG1 can be terminated at a position closer to the shunt portion CS1. Therefore, even when the distance is not provided between the shunt portion CS1 and the active region B1 for ensuring the margin, the memory gate electrode MG1 can be terminated at a position adjacent to the cap insulating film CA1 within the power supply region A1 that is the inactive region. Thus, the increase in the area of the semiconductor device can be prevented, and besides, the reduction in the reliability of the semiconductor device due to the removal of the memory gate electrode MG1 in the active region B1 can be easily achieved.

Next, with reference to FIGS. 6 to 32, a method of manufacturing a semiconductor device having a nonvolatile memory cell according to the present embodiment will be explained in an order of processes. FIGS. 7 to 9, 11, 14, 16, 19 to 30 and 32 are cross-sectional views of a principal part of a memory region C1, a capacitive element region E1, a power supply region F1, a low breakdown breakdown-voltage type nMIS region G1, a low breakdown breakdown-voltage type pMIS region H1, a high breakdown breakdown-voltage type nMIS region I1 and a high breakdown breakdown-voltage type pMIS region J1, during the manufacturing processes of the semiconductor device. The memory region C1 is illustrated in the cross-sectional view at the position corresponding to FIG. 2, and the power supply region F1 is illustrated in the cross-sectional view at the position corresponding to the shunt portion CS1 of the selection gate electrode CG1 of FIG. 5. Each of the low breakdown breakdown-voltage type nMIS region G1, the low breakdown breakdown-voltage type pMIS region H1, the high breakdown breakdown-voltage type nMIS region I1 and the high breakdown breakdown-voltage type pMIS region J1 is a partial region of a peripheral circuit region.

Moreover, FIGS. 6, 10, 12, 13, 15, 17, 18 and 31 are plan views of the principal part of the semiconductor device of the present embodiment during the manufacturing processes. Note that, in the plan views of FIG. 6 and thereafter, hatching is added to an insulating film such as a cap insulating film formed on the selection gate electrode.

Figure 7:
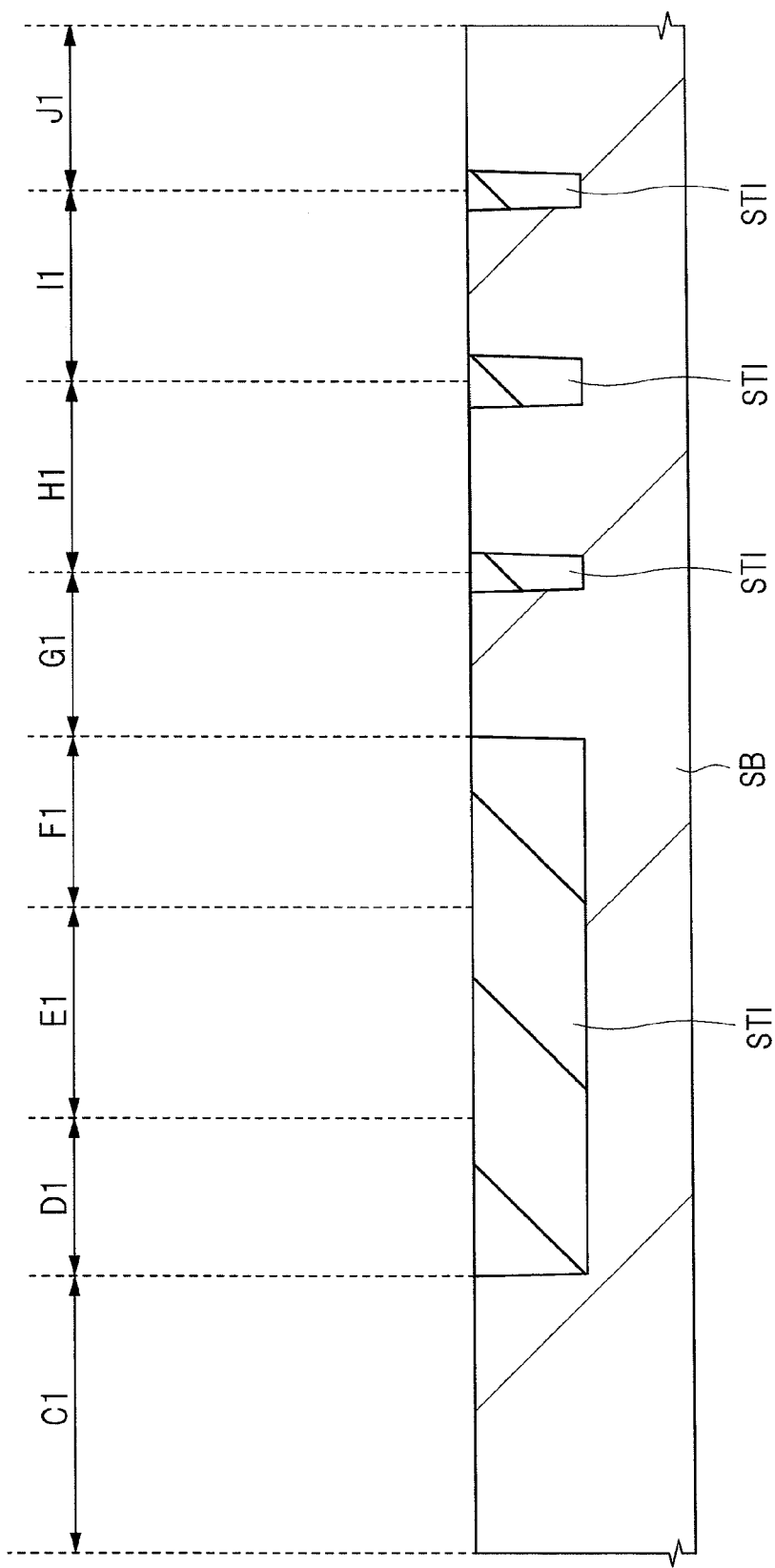
FIG. 7 is a cross-sectional view of a principal part illustrating the method of manufacturing the semiconductor device according to the first embodiment of the present invention.

First, as illustrated in FIGS. 6 and 7, on the main surface of the semiconductor substrate SB that is a thin plate of a semiconductor having a substantially planar round shape referred to as a semiconductor wafer, for example, a trench-shaped element isolation region STI and an active region B1 or others arranged so as to be surrounded by the region are formed. That is, after forming the separation trench at a predetermined portion of the semiconductor substrate SB, an insulating film made of, for example, silicon oxide, is deposited on the main surface of the semiconductor substrate SB, and then, the insulating film is polished by using a CMP (Chemical Mechanical Polishing) method or others so that the insulating film remains only inside the separation trench, so that the insulating film is buried into the separation trench. In this manner, the element isolation region STI is formed. This element isolation region STI is also formed in the power supply region and the capacitive element region on the semiconductor substrate SB.

As illustrated in FIG. 6, the upper surface of the semiconductor substrate (not illustrated) in the power supply region A1 is covered with the element isolation region STI, and the other regions become the active region B1.

Figure 8:
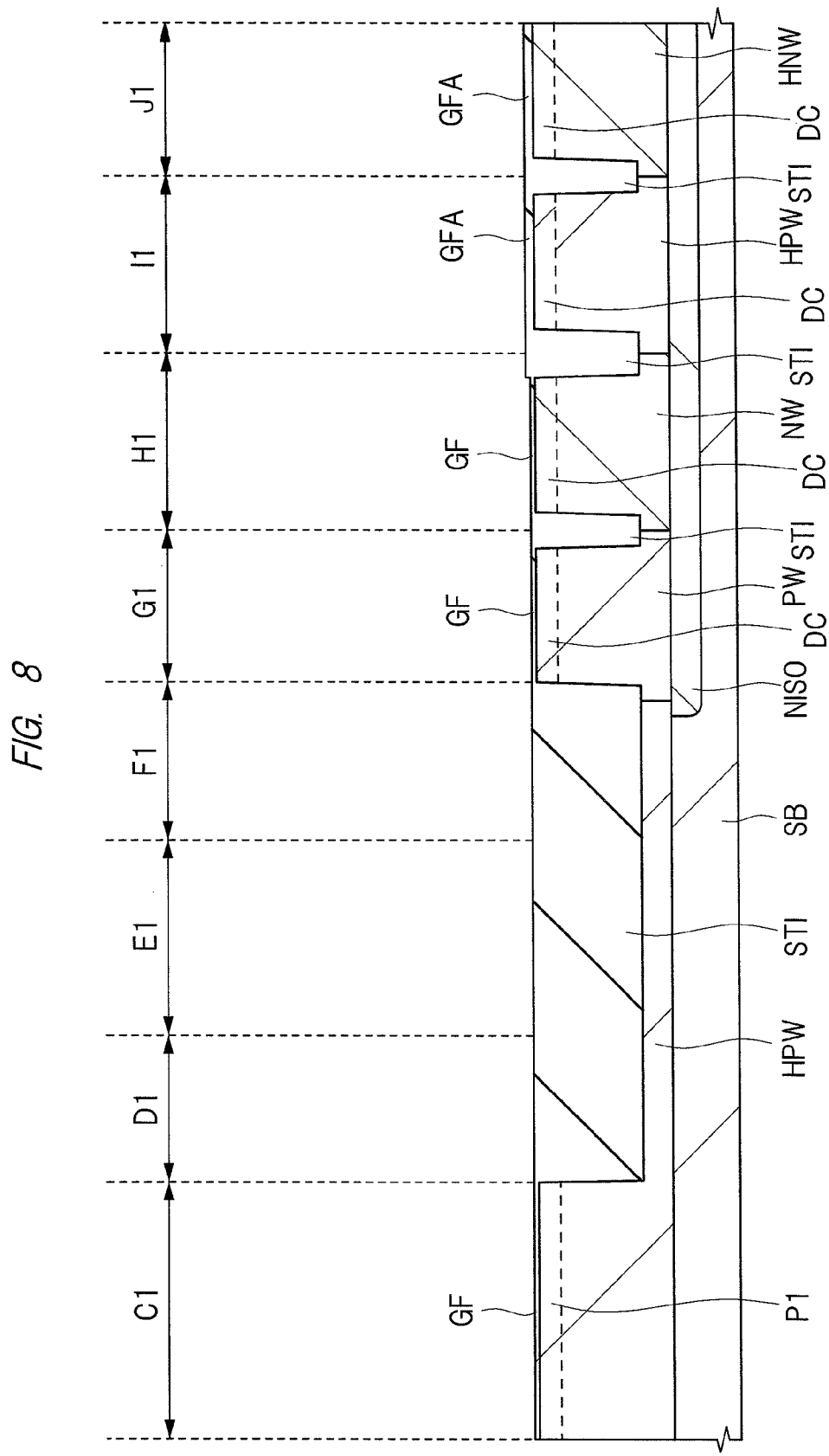
FIG. 8 is a cross-sectional view of a principal part illustrating the method of manufacturing the semiconductor device, continued from FIG. 7.

Next, as illustrated in FIG. 8, by selectively ion-implanting an n-type impurity into the semiconductor substrate SB in the peripheral circuit region, a buried n-well NISO is formed. Sequentially, a p-well HPW is formed by selectively ion-implanting a p-type impurity into the semiconductor substrate SB in the memory region C1 and the high breakdown-voltage type nMIS region I1, and an n-well HNW is formed by selectively ion-implanting an n-type impurity into the semiconductor substrate SB in the high breakdown-voltage type pMIS region J1. Similarly, a p-well PW is formed by selectively ion-implanting a p-type impurity into the semiconductor substrate SB in the low breakdown-voltage type nMIS region G1, and an n-well NW is formed by selectively ion-implanting an n-type impurity into the semiconductor substrate SB on the low breakdown-voltage type pMIS region H1.

Next, a p-type impurity such as B (boron) is selectively ion-implanted into the semiconductor substrate SB in the memory region. Thus, a p-type semiconductor region P1 for forming the channel of each of selection nMISQC1 and QC2 (see FIG. 2) is formed on the semiconductor substrate SB in the memory region. Similarly, a predetermined impurity ion is implanted into the semiconductor substrate SB in each of the low breakdown-voltage type nMIS region G1, low breakdown-voltage type pMIS region H1, high breakdown-voltage type nMIS region I1 and high breakdown-voltage type pMIS region J1 in the peripheral circuit region. Thus, a semiconductor region DC for forming the channel is formed on the semiconductor substrate SB in each of the low breakdown-voltage type nMIS region G1, low breakdown-voltage type pMIS region H1, high breakdown-voltage type nMIS region I1 and high breakdown-voltage type pMIS region J1 in the peripheral circuit region.

Next, by performing an oxidizing treatment to the semiconductor substrate SB, for example, a gate insulating film GFA having a thickness of about 20 nm and being made of silicon oxide is formed on the main surface of the semiconductor substrate SB. Sequentially, the gate insulating film GFA in the memory region C1, the low breakdown-voltage type nMIS region G1 and the low breakdown-voltage type pMIS region H1 is removed, and then, an oxidizing treatment is performed to the semiconductor substrate SB. Thus, for example, a gate insulating film GF having a thickness of about 1 to 5 nm and being made of silicon oxide is formed on the main surface of the semiconductor substrate SB in the memory region C1, and at the same time, for example, a gate insulating film GF having a thickness of about 1 to 5 nm and being made of silicon oxide is also formed on the main surface of the semiconductor substrate SB in each of the low breakdown-voltage type nMIS region G1 and the low breakdown-voltage type pMIS region H1.

Figure 9:
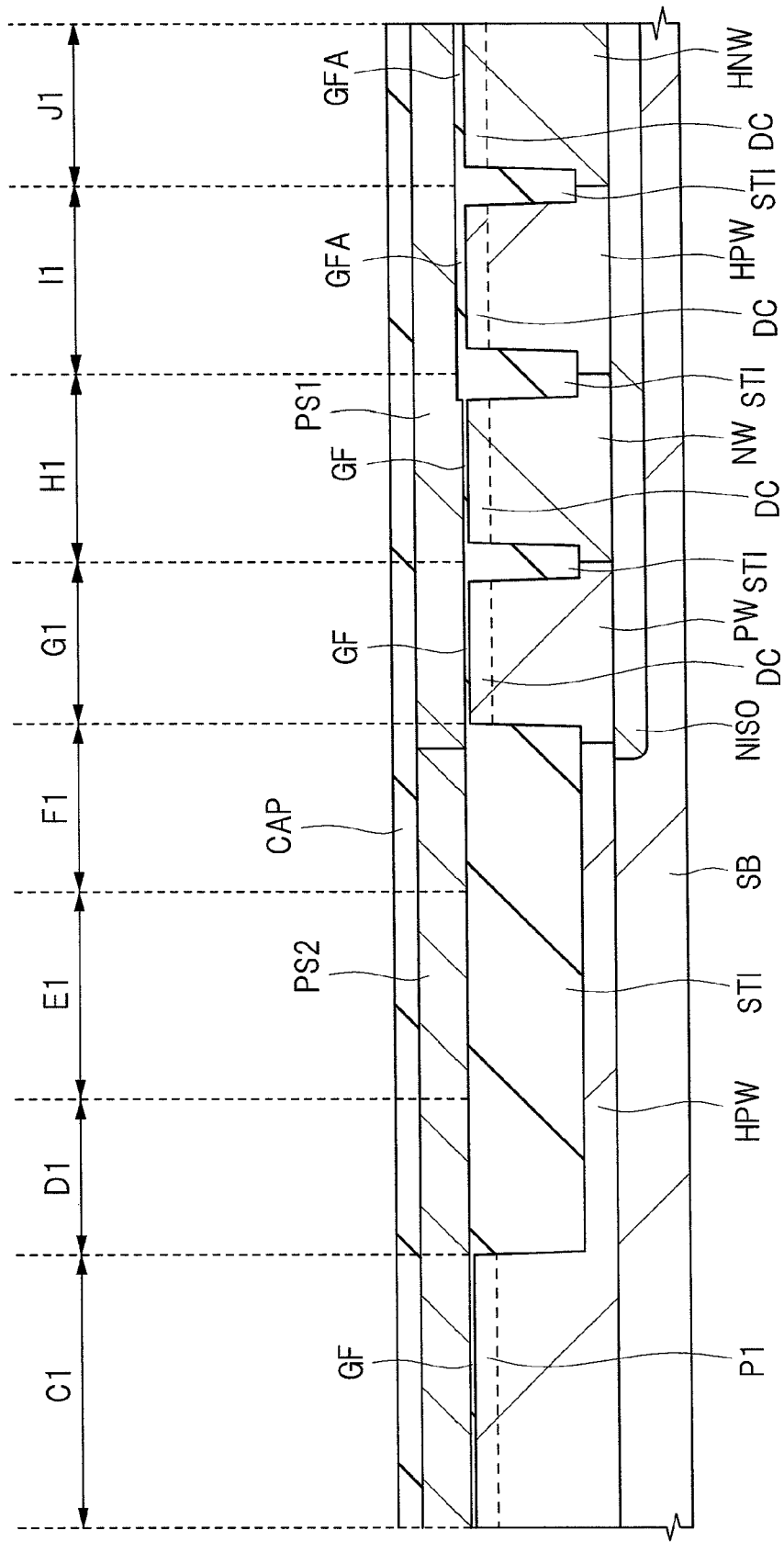
FIG. 9 is a cross-sectional view of a principal part illustrating the method of manufacturing the semiconductor device, continued from FIG. 8.

Next, as illustrated in FIG. 9, for example, a conductive film PS1 made of amorphous silicon is deposited on the main surface of the semiconductor substrate SB by using a CVD (Chemical Vapor Deposition) method, and then, an n-type conductive film PS2 is formed by introducing an n-type impurity into the conductive film PS1 in the memory region C1, the capacitive element region E1 and the power supply region F1 by using an ion implanting method or others. The thickness of the conductive film PS2 is, for example, about 140 nm.

Sequentially, an insulating film (not illustrated) and an insulating film CAP are deposited on the conductive film PS1 and on the conductive film PS2 by a CVD method. The corresponding insulating film (not illustrated) formed between the conductive film PS1 as well as the conductive film PS2 and the insulating film CAP is made of, for example, a silicon oxide film, and is a film to be the insulating film OX illustrated in FIG. 2. The insulating film CAP is made of, for example, silicon nitride, silicon oxide, silicon oxide containing nitrogen, or silicon carbide, and its thickness is, for example, 50 nm.

Figure 10:
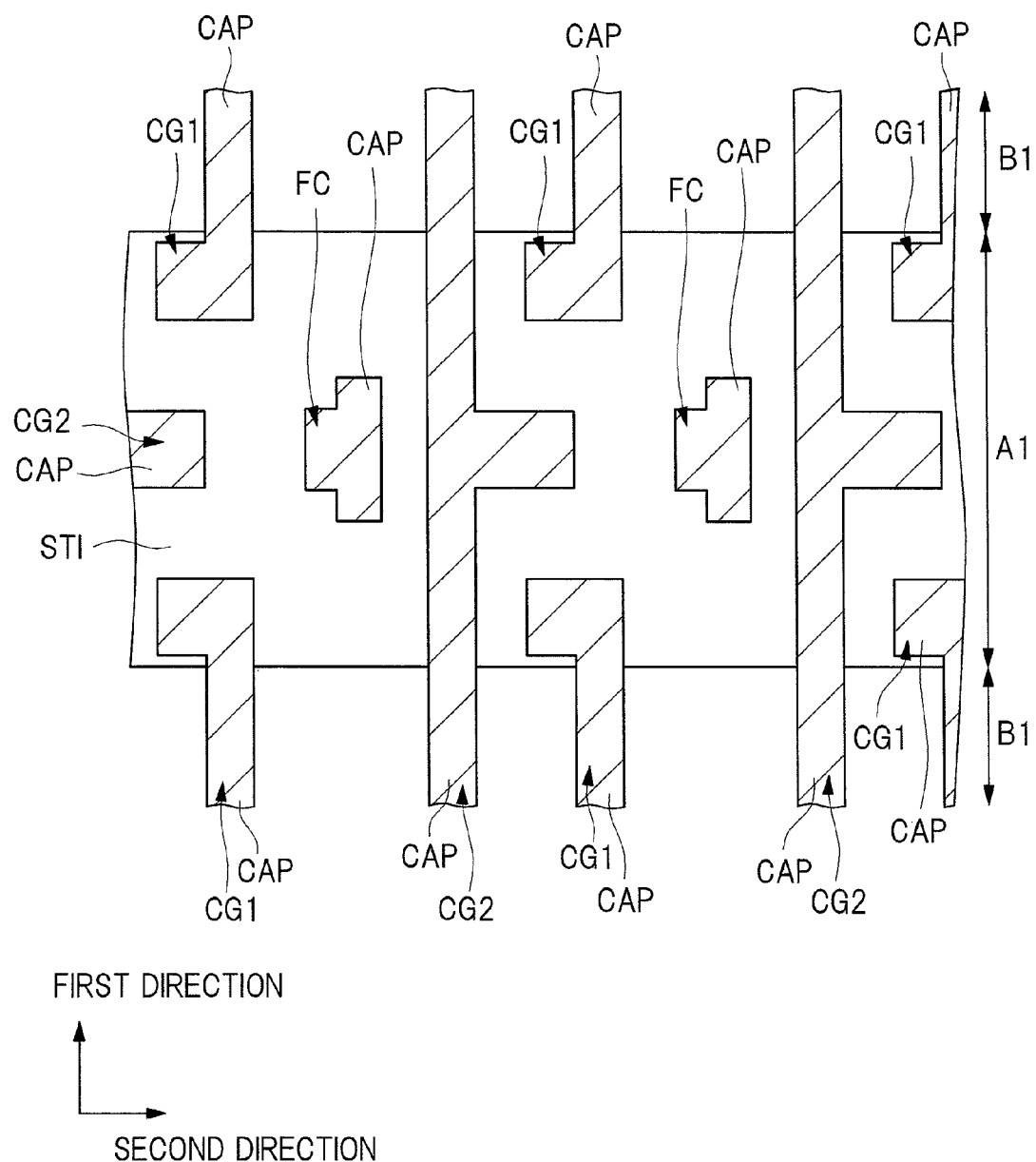
FIG. 10 is a plan view of a principal part illustrating the method of manufacturing the semiconductor device, continued from FIG. 9.
Figure 11:
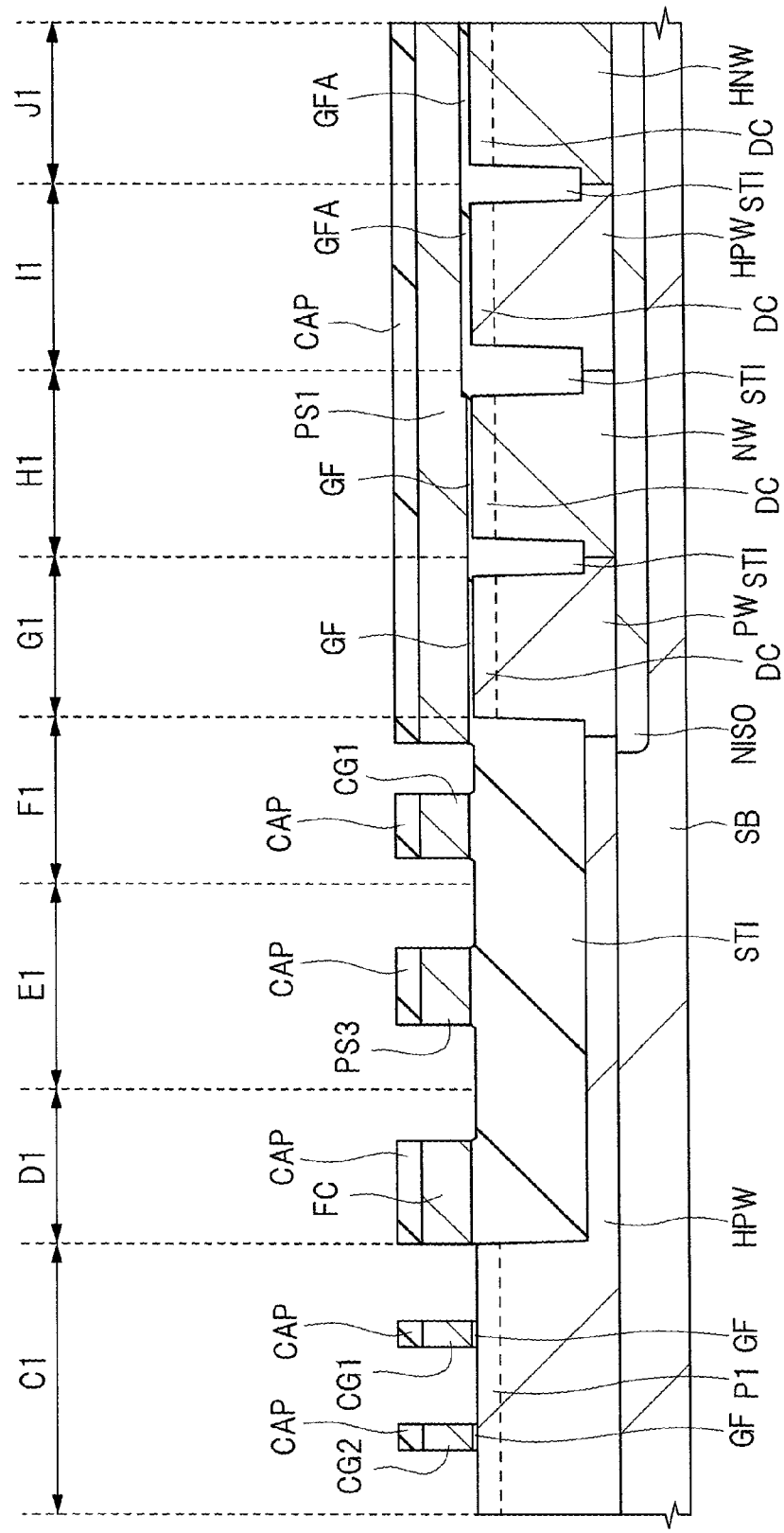
FIG. 11 is a cross-sectional view of a principal part illustrating the method of manufacturing the semiconductor device, continued from FIG. 9.

Next, as illustrated in FIGS. 10 and 11, the insulating film CAP and the conductive film PS2 in the memory region C1, the capacitive element region E1, the power supply region D1 and the power supply region F1 are sequentially patterned by using a lithography technique and a dry etching technique. Thus, as illustrated in FIG. 11, in the memory region C1, the power supply region D1 and the power supply region F1, selection gate electrodes CG1 and CG2 of the selection nMISQC1 and QC2 (see FIG. 2) made of the conductive film PS2 are formed respectively. Note that, in the power supply region F1, no selection gate electrode CG2 is illustrated. Each gate length of the selection gate electrodes CG1 and CG2 of the memory region C1 is, for example, about 100 nm. Simultaneously, a lower electrode PS3 made of the conductive film PS2 is formed in the capacitive element region E1.

As illustrated in FIG. 10, on the semiconductor substrate (not illustrated), a stacked film including the selection gate electrode CG1 and the insulating film CAP covering the upper surface of the selection gate electrode CG1, a stacked film including the selection gate electrode CG2 and the insulating film CAP covering the upper surface of the selection gate electrode CG2, the selection gate electrode FC and the insulating film CAP covering the selection gate electrode FC are formed. Since all of the upper surfaces of the selection gate electrodes CG1, CG2 and FC are covered with the insulating film CAP, FIG. 10 does not illustrate the selection gate electrodes CG1, CG2 and FC but illustrates the shape of the insulating film CAP thereon. The selection gate electrodes CG1, CG2 and FC and the insulating film CAP located right above them have the same pattern as each other in a plan view.

The selection gate electrodes CG1 and CG2 have patterns that extend in the first direction. A plurality of selection gate electrodes CG1 and CG2 are alternately arranged in the second direction, and a plurality of selection gate electrodes CG1 are arranged so as to be aligned with each other in the first direction. That is, the selection gate electrode CG1 is separated into pieces at the element isolation region STI. The selection gate electrode CG1 extending in the first direction has a first side wall extending in the first direction and a second side wall on the opposite side, and the selection gate electrode CG2 extending in the first direction has a third side wall extending in the first direction and a fourth side wall on the opposite side.

The third side wall of the selection gate electrode CG2 arranged on the first side wall side of the selection gate electrode CG1 is faced to the first side wall of the corresponding selection gate electrode CG1. Moreover, the fourth side wall of the selection gate electrode CG2 arranged on the second side wall side of the corresponding selection gate electrode CG1 is faced to the second side wall of the corresponding selection gate electrode CG1.

In this case, a selection gate electrode FC formed of a conductive film in the same layer as those of the selection gate electrodes CG1 and CG2 is formed in a region adjacent to the fourth side wall of the selection gate electrode CG2. The selection gate electrode FC is not connected to the selection gate electrodes CG1 and CG2, and is electrically insulated from the selection gate electrodes CG1 and CG2.

Figure 12:
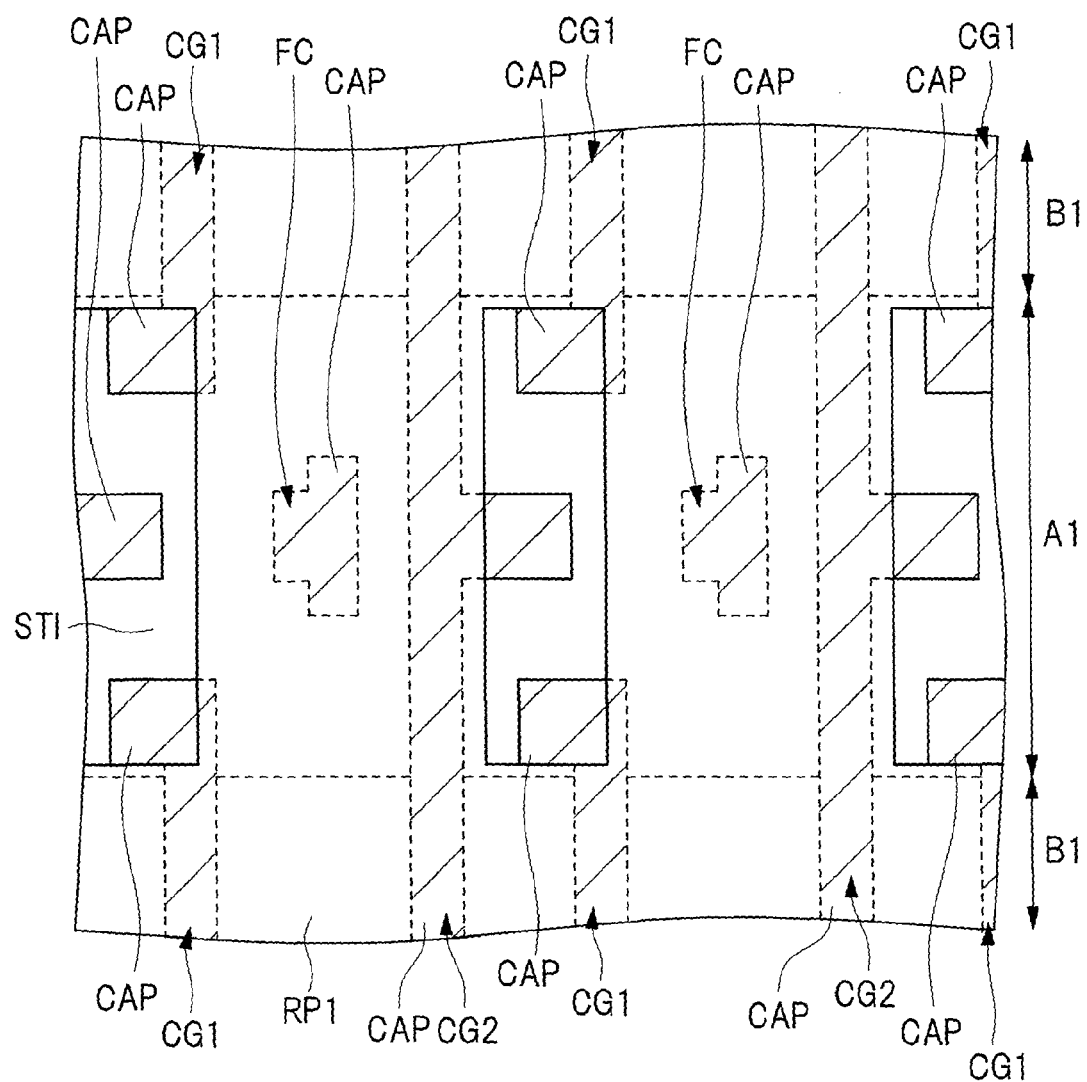
FIG. 12 is a plan view of a principal part illustrating the method of manufacturing the semiconductor device, continued from FIG. 10.

Next, as illustrated in FIG. 12, a resist pattern RP1 that covers the active region B1 of the memory region C1 (see FIG. 11) and also partially covers the power supply region A1 of the memory region is formed. The resist pattern RP1 is a mask pattern that is formed for partially removing the insulating film CAP on each of the selection gate electrodes CG1 and CG2 in the power supply region A1 by using an etching process. In the drawing, the outline of the pattern in the region covered with the resist pattern RP1 is denoted by a broken line. From the resist pattern RP1, the insulating film CAP on the end portion of the selection gate electrode CG1 in the first direction and the insulating film CAP on the pattern that protrudes toward the third side wall side of the selection gate electrode CG2 are exposed. In this case, on the end portion of the selection gate electrode CG1, the resist pattern RP1 covers a region adjacent to the second side wall side, and a region on the first side wall side on the opposite side is exposed therefrom.

Figure 13:
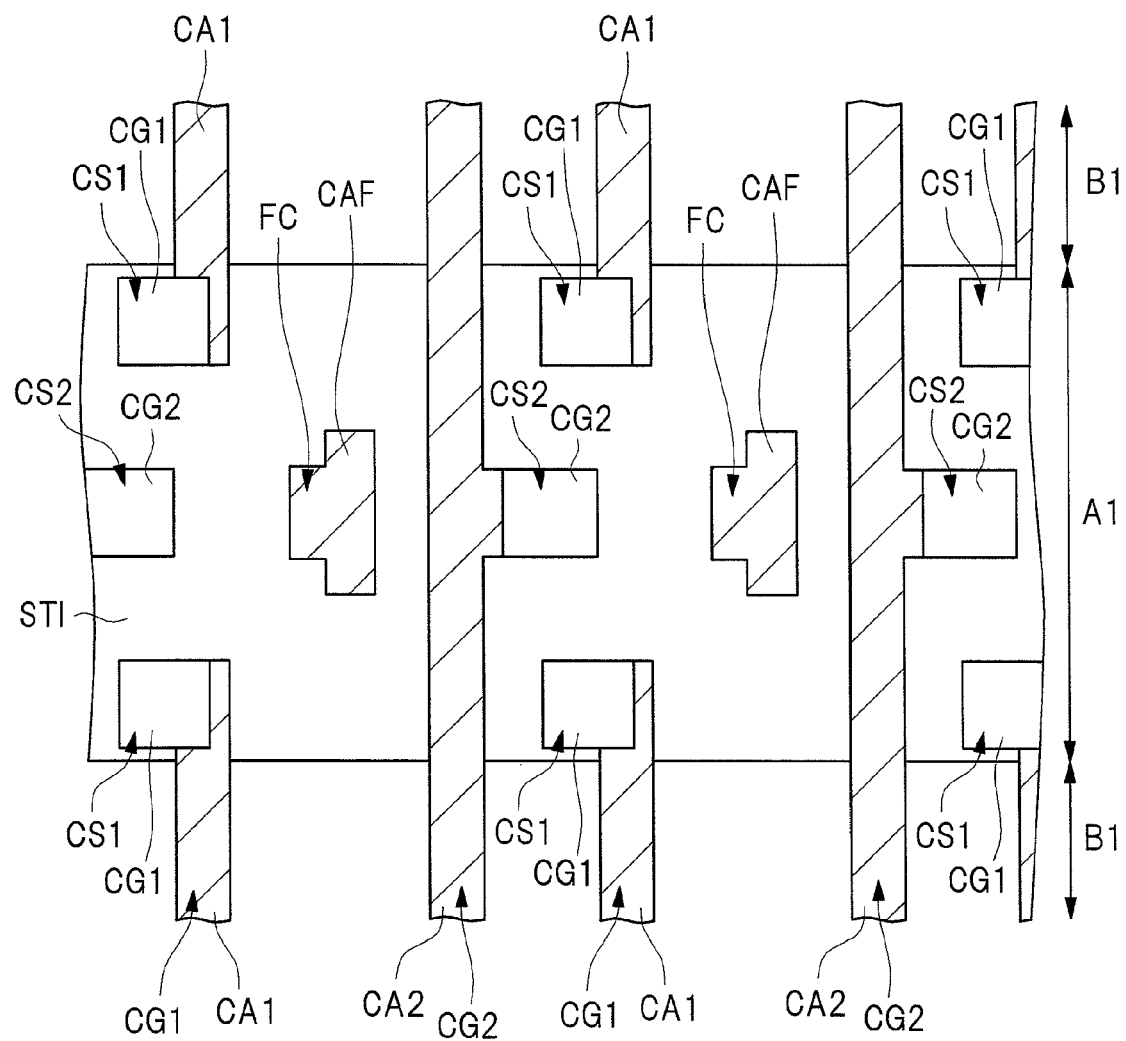
FIG. 13 is a plan view of a principal part illustrating the method of manufacturing the semiconductor device, continued from FIG. 12.
Figure 14:
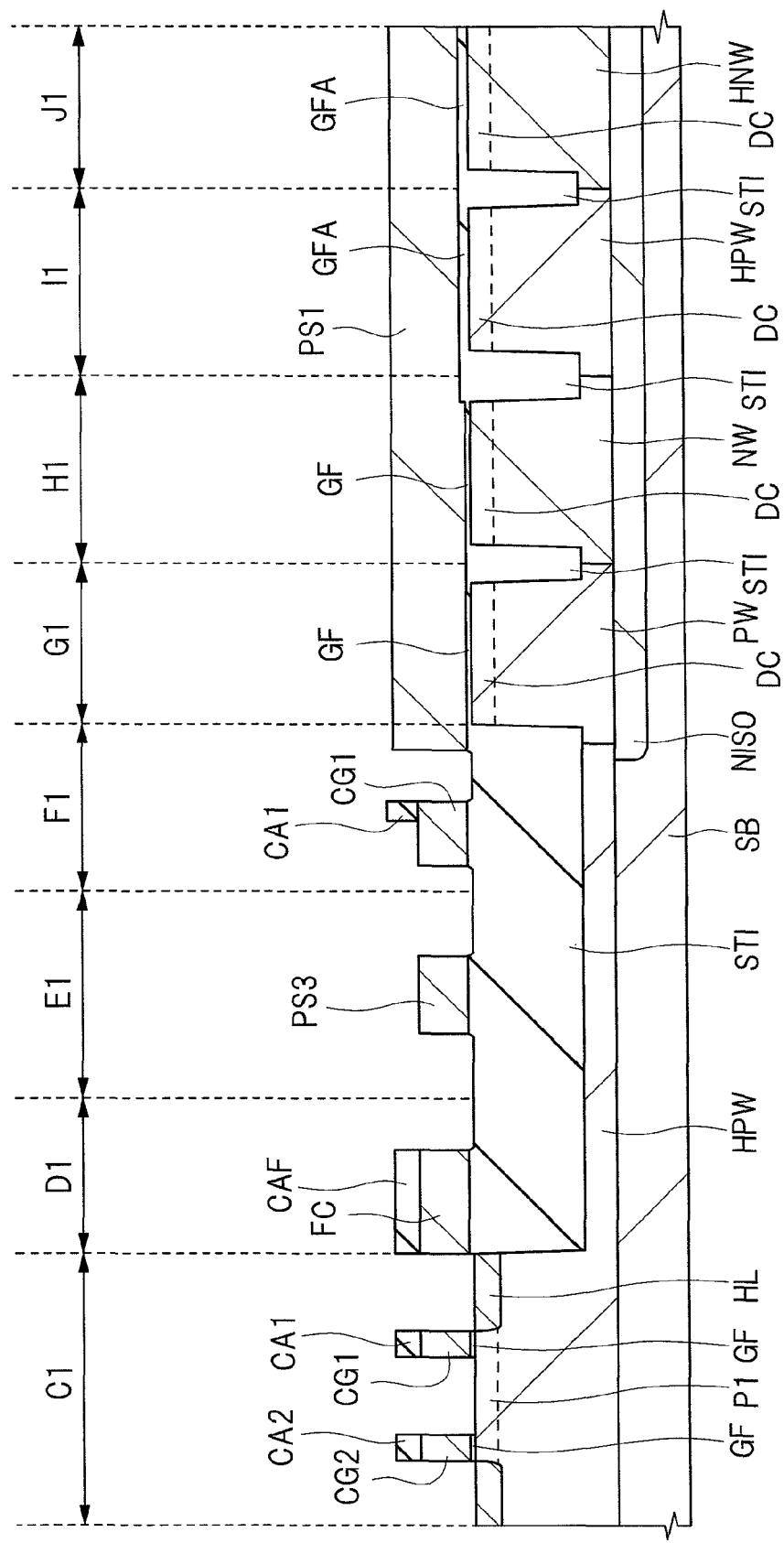
FIG. 14 is a cross-sectional view of a principal part illustrating the method of manufacturing the semiconductor device, continued from FIG. 12.

Next, as illustrated in FIGS. 13 and 14, the insulating film CAP in a part of the shunt region of the power supply region F1, the capacitive element region E1 and the peripheral circuit region is removed by an etching process using the resist pattern RP1 (see FIG. 12) as the mask. Then, the resist pattern RP1 (see FIG. 12) is removed. In FIG. 13, hatching is added to the cap insulating films CA1, CA2 and CAF which have remained on the selection gate electrodes CG1, CG2 and FC in the power supply region F1 (see FIG. 14). In this case, in the peripheral circuit region, it is required to form a silicide layer on each gate electrode of the low breakdown-voltage type nMIS, the low breakdown-voltage type pMIS, the high breakdown-voltage type nMIS and the high breakdown-voltage type pMIS to be formed in the later processes. Therefore, in this process, it is required to remove the insulating film CAP in the peripheral circuit region.

Moreover, in the capacitive element region E1 illustrated in FIG. 14, when the insulating film CAP remains, the dielectric film between the lower electrode PS3 and the upper electrode to be formed in the later process is formed to be too thick, and therefore, the capacitance value is reduced. Therefore, in this process, it is required to remove the insulating film CAP in the capacitive element region E1. On the other hand, in the power supply region D1, the insulating film CAP is formed so as to remain. This is because a silicide layer is undesirably formed on the selection gate electrode FC in the later process by removing the insulating film CAP. Since the power supply region D1 is a region where a portion for supplying the power to the memory gate electrode MG2 is formed in the later process, no silicide layer is required on the selection gate FC. Therefore, it is preferred that the insulating film CAP remains in order to prevent the formation of an unnecessary silicide layer. Moreover, by this process, the cap insulating films CA1 and CG2 are formed on the selection gate electrode CG1 and the selection gate electrode CG2.

Note that, FIG. 14 illustrates only the cap insulating film CA1 on the selection gate electrode CG1 in the power supply region F1 in FIG. 14. In the power supply region F1, the cap insulating film CA1 covers only the upper surface of the selection gate electrode CG1 on the second side wall on the side opposite to the first side wall, and the upper surface of the selection gate electrode CG1 on the first side wall is exposed from the cap insulating film CA1. Moreover, in this process, the insulating film CAP illustrated in FIG. 11 and a part of an insulating film (not illustrated) formed between the insulating film and the selection gate electrodes CG1 and CG2, the lower electrode PS3 and the conductive film PS1 located below are also removed. Thus, a part of each upper surface of the selection gate electrodes CG1 and CG2 and each upper surface of the lower electrode PS3 and the conductive film PS1 are exposed.

Next, by ion-implanting an n-type impurity such as As (arsenic) or P (phosphorus) into the main surface of the semiconductor substrate SB in the memory region C1 by using the cap insulating films CA1 and CA2, the selection gate electrodes CG1 and CG2 and the resist pattern RP1 (see FIG. 12) as a mask, an n-type semiconductor region HL for forming the channel of the memory nMISQM1 (see FIG. 2) is formed.

As illustrated in FIG. 13, the end portion of the selection gate electrode CG1 in the first direction is located in the power supply region A1, and the selection gate electrode CG2 is arranged so as to cross the power supply region A1. At the end portion in the first direction of the selection gate electrode CG1, a region having a wide width to be connected to a contact plug and being exposed from the cap insulating film CA1, that is, the shunt portion CS1, is formed.

This is because, as explained by using FIG. 12, the cap insulating film CA1 on the region along the second side wall is not removed but left by performing the etching process in a state that the resist pattern RP1 covers the region adjacent to the second side wall at the end portion of the selection gate electrode CG1 and that the region on the first side wall side on the opposite side is exposed thereat. Note that, the shunt portion CS1 is formed so as to protrude from the first side wall in a direction opposite to the second side wall side in the second direction.

The power supply region F1 in FIG. 14 illustrates a cross-sectional surface obtained by cutting the region including the shunt portion CS1 and a part of the cap insulating film CA1 in the second direction. By the process explained by using FIG. 14, on the selection gate electrode CG1, the cap insulating film CA1 from which the shunt portion CS1 is exposed is formed.

As illustrated in FIG. 13, a part of the cap insulating film CA1 covers the upper surface of the selection gate electrode CG1 positioned on the second side wall side with respect to the shunt portion CS1. That is, the region adjacent to the second side wall corresponding to the upper surface of the end portion of the selection gate electrode CG1 in the first direction is covered with the cap insulating film CA1 continuously formed so as to extend in the first direction.

Moreover, the selection gate electrode CG2 is not separated in the first direction, and the cap insulating film CA2 on the selection gate electrode CG2 is located so as to extend in the first direction along the upper surface of the selection gate electrode CG2. In the power supply region A1, a part of the selection gate electrode CG2 forms a portion which corresponds to the side wall of the selection gate electrode CG2 and which protrudes in the second direction from the third side wall of the third side wall and the fourth side extending in the first direction, that is, forms the shunt portion CS2. The upper surface of the shunt portion CS2 is exposed from the cap insulating film CA2.

Figure 15:
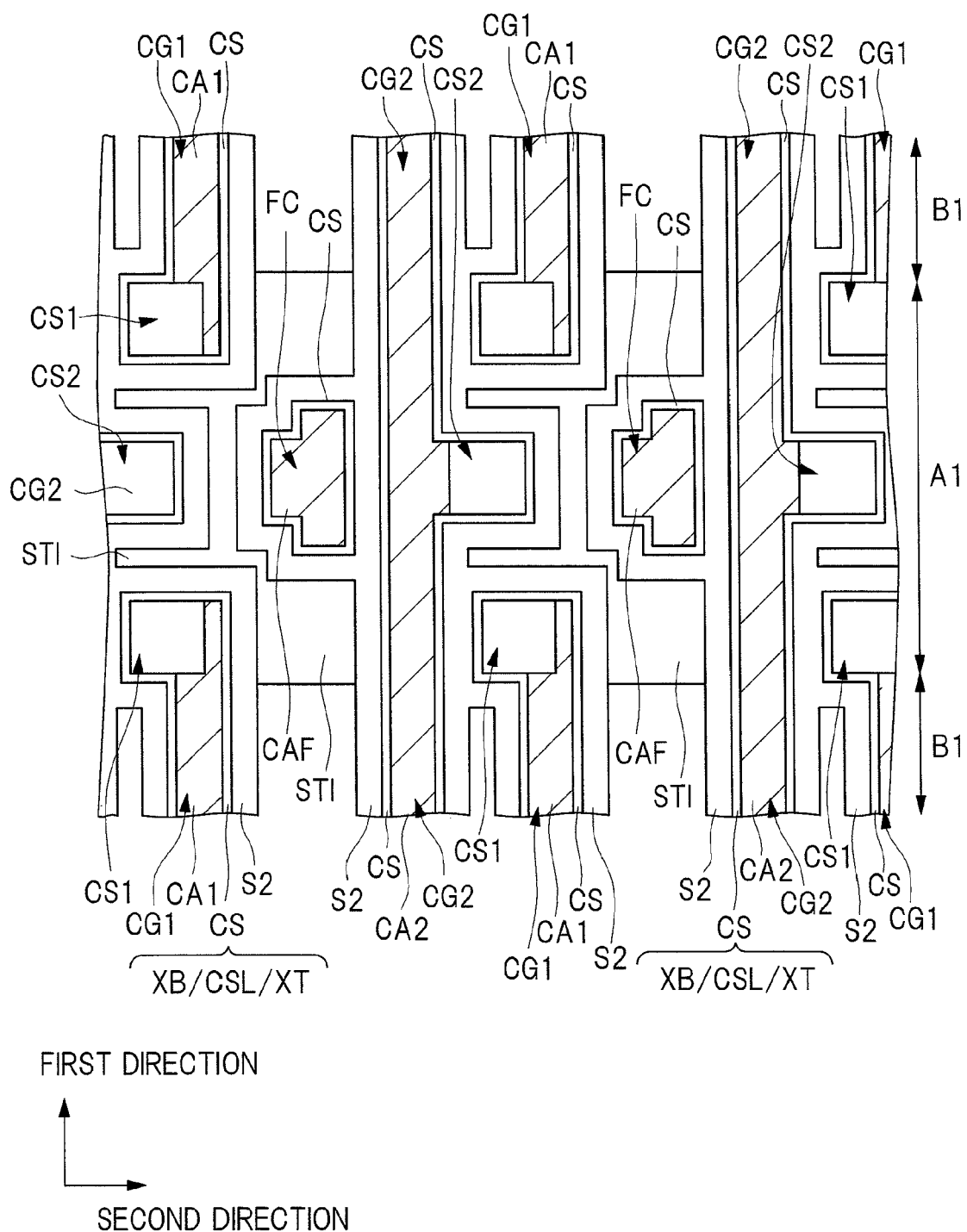
FIG. 15 is a plan view of a principal part illustrating the method of manufacturing the semiconductor device, continued from FIG. 13.
Figure 16:
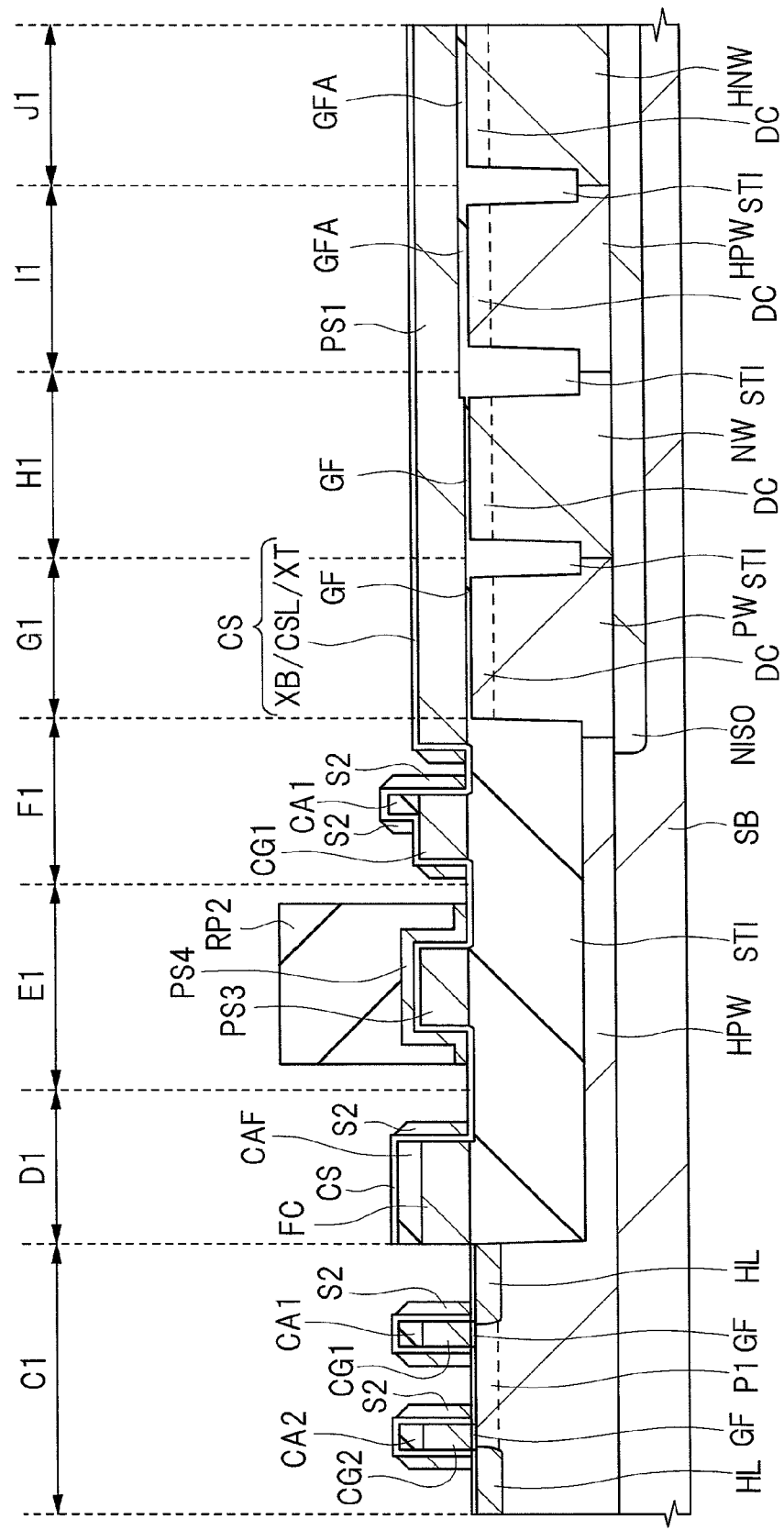
FIG. 16 is a cross-sectional view of a principal part illustrating the method of manufacturing the semiconductor device, continued from FIG. 13.

Next, as illustrated in FIGS. 15 and 16, for example, the insulating film XB made of silicon oxide, the charge storage layer CSL made of silicon nitride and the insulating film XT made of silicon oxide are sequentially formed on the main surface of the semiconductor substrate SB. As an example, the insulating film XB is formed by, for example, a thermal oxidizing method or an ISSG oxidizing method, and its thickness is set to, for example, about 1 to 10 nm, the charge storage layer CSL is formed by, for example, a CVD method, and its thickness is set to, for example, about 5 to 20 nm, and the insulating film XT is formed by, for example, a CVD method or an ISSG oxidizing method, and its thickness is set to, for example, 4 to 15 nm. Moreover, the insulating films XB and XT may be made of silicon oxide containing nitrogen. The insulating film XB, the charge storage layer CSL and the insulating film XT forms an ONO film CS.

Next, on the main surface of the semiconductor substrate SB illustrated in FIG. 16, a conductive film for forming a memory gate, which is made of low-resistance polycrystal silicon, is deposited. This conductive film is formed by a CVD method, and its thickness is set to, for example, about 50 to 100 nm. Sequentially, the conductive film is subjected to an etch-back process by using an anisotropic dry etching method, by using a lithography technique and a dry etching technique.

Thus, in each of the memory region C1, the power supply region D1 and the power supply region F1, a sidewall S2 made of the conductive film is formed via the ONO film CS on both side surfaces of each of a stacked film including the cap insulating film CA1 and the selection gate electrode CG1, a stacked film including the cap insulating film CA2 and the selection gate electrode CG2 and a stacked film including the cap insulating film CAF and the selection gate electrode FC. Simultaneously, in the capacitive element region E1, an upper electrode PS4 is formed so as to cover the lower electrode PS3 by using the resist pattern RP2 as a mask. Note that, in the power supply region D1 of FIG. 16, only one of the side walls of the pattern made of the stacked film including the cap insulating film CAF and the selection gate electrode FC is illustrated, and the other side wall, the ONO film CS adjacent to this side wall and the sidewall S2 are not illustrated.

Moreover, although not illustrated in the drawing, the ONO film CS and the sidewall S2 are also formed in a region right above the shunt portion CS1 of the selection gate electrode CG1 corresponding to the region adjacent to the side wall of the cap insulating film CA1 and in a region right above the shunt portion CS2 of the selection gate electrode CG2 corresponding to the region adjacent to the side wall of the cap insulating film CA2.

At this time, the upper surface of the sidewall S2 to be formed adjacent to the side wall including the second side wall of the selection gate electrode CG1 in the power supply region F1 corresponding to the side wall of the stacked film having the selection gate electrode CG1 and the cap insulating film CA1 formed on the selection gate electrode CG1 is higher than the upper surface of the sidewall S2 formed adjacent to the first side wall of the selection gate electrode CG1. Moreover, the sidewall S2 is also formed right above the upper surface of the selection gate electrode CG1 so as to be adjacent to the side wall of the cap insulating film CA1 on the selection gate electrode CG1.

As illustrated in FIG. 15, in this process, the ONO film CS and the sidewall S2 are formed on each of the side walls of the pattern including the selection gate electrodes CG1, CG2 and FC and the cap insulating films CA1, CA2 and CAF. Thus, the periphery of the pattern including the selection gate electrodes CG1, CG2 and FC and the cap insulating films CA1, CA2 and CAF is surrounded by the sidewalls S2 via the ONO film CS in a plan view.

Note that FIG. 15 illustrates a structure in which the sidewall S2 formed to be adjacent to the first side wall of the shunt portion CS1 and the sidewall S2 formed to be adjacent to the third side wall of the selection gate electrode CG2 facing the first side wall are integrally formed as one unit. On the other hand, in the power supply region F1 of FIG. 16, the selection gate electrode CG1 including the shunt portion CS1 is mainly illustrated, and the illustration of the adjacent selection gate electrode CG2 is omitted. Therefore, the sidewall S2 formed on the first side wall of the shunt portion CS1 is illustrated so as not to be in contact with the sidewall 52 formed on the facing side wall.

Figure 17:
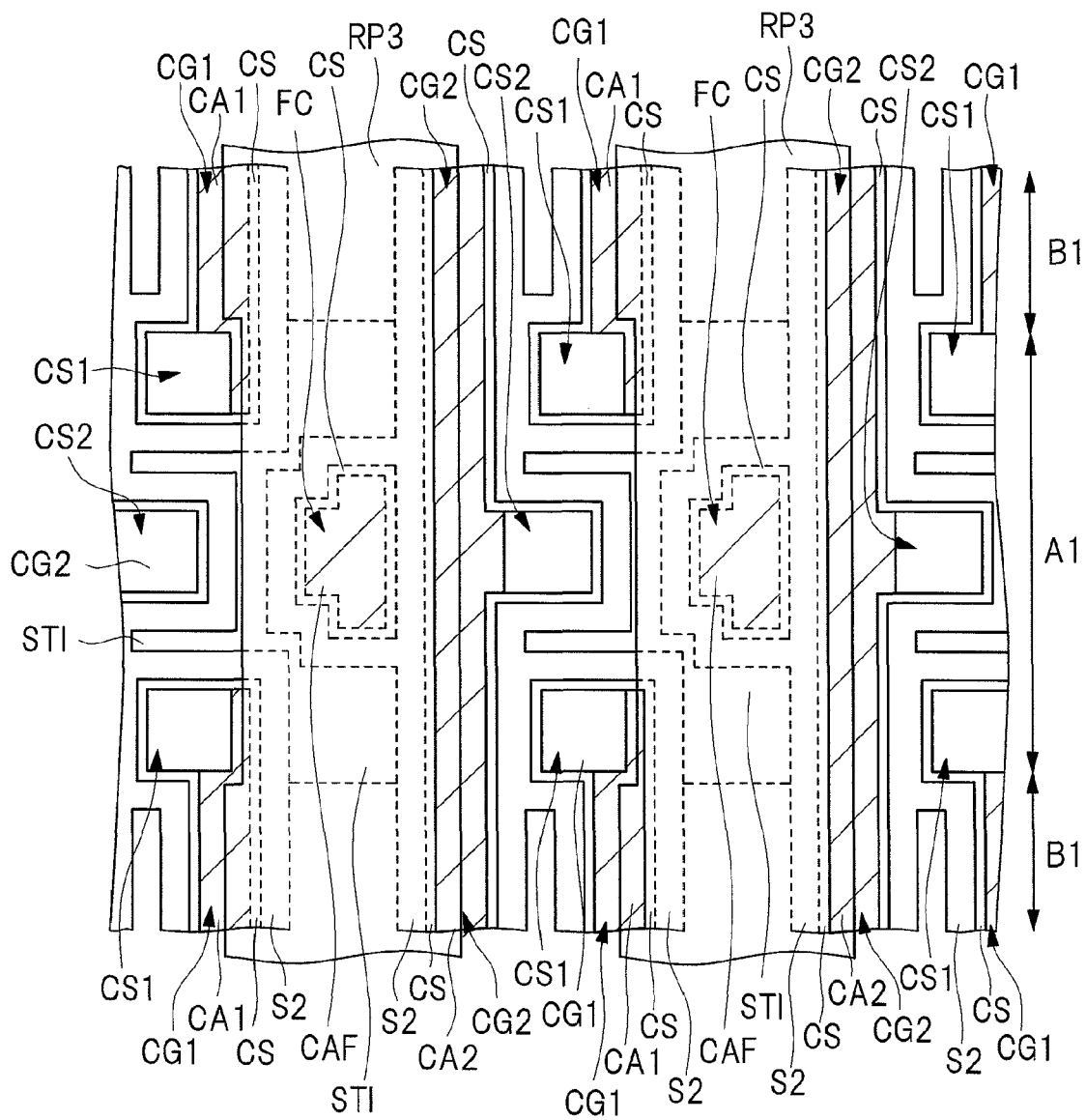
FIG. 17 is a plan view of a principal part illustrating the method of manufacturing the semiconductor device, continued from FIG. 16.

Next, as illustrated in FIG. 17, in the power supply region A1 and the active region B1, a resist pattern RP3 is formed so as to cover each of the selection gate electrode FC and a part of the selection gate electrodes CG1 and CG2 and a part of the sidewall S2. The resist pattern RP3 from which a region adjacent to the first side wall of the selection gate electrode CG1 is exposed covers a region adjacent to the second side wall of the selection gate electrode CG1. Similarly, the resist pattern RP3 from which a region adjacent to the third side wall of the selection gate electrode CG2 covers a region adjacent to the fourth side wall of the selection gate electrode CG2.

Thus, the sidewall S2 formed along the first side wall and the third side wall is exposed from the resist pattern RP3, and the sidewall S2 formed along the second side wall, the fourth side wall and the side wall of the selection gate electrode FC is covered with the resist pattern RP3, and the resist pattern RP3 is a mask pattern provided for partially removing the sidewall S2 by using an isotropic etching process, in the succeeding process. In the drawing, the outline of the pattern of the region covered with the resist pattern PR3 is denoted by a broken line.

At this time, it is preferred to completely expose the sidewall S2 that is adjacent to the shunt portion CS1 is exposed from the resist pattern RP3. This is because the sidewall S2 adjacent to the shunt portion CS1 is provided from being left upon partially removing the sidewall S2 by an etching process in the later process to be explained by using FIGS. 18 and 19. Note that, since the isotropic etching is used in this etching process, the sidewall S2 adjacent to the shunt portion CS1 can be totally removed depending on the length of the etching time even when the shunt portion CS1 is partially covered with the resist pattern RP3.

Note that, even in the sidewall S2 in the vicinity of the shunt portion CS1, the sidewall S2 formed on the shunt portion CS1 via the cap insulating film CA1 in a plan view may be not required to be covered with the resist pattern RP3, and may be not removed but remain in the later etching process.

Figure 18:
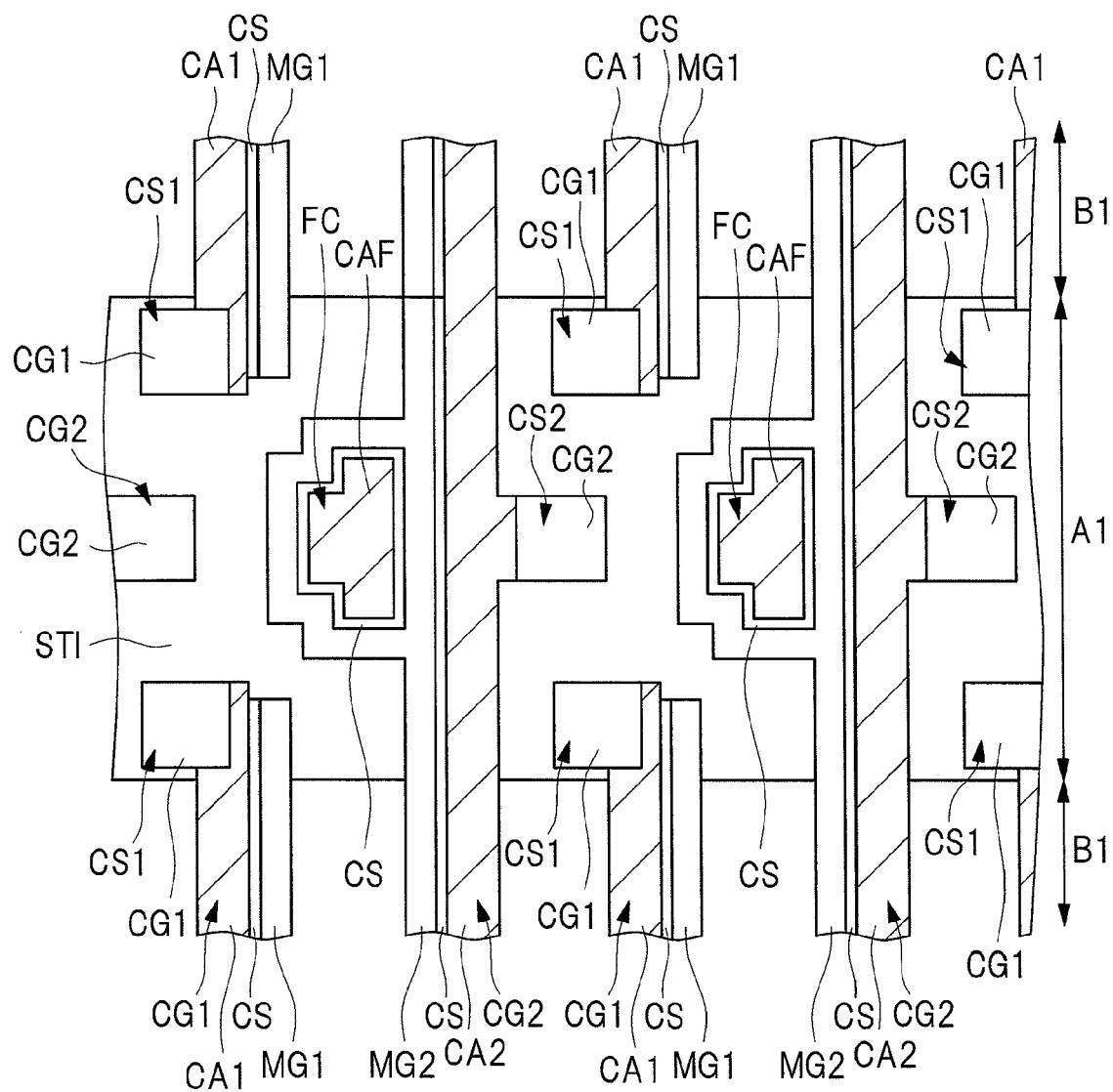
FIG. 18 is a plan view of a principal part illustrating the method of manufacturing the semiconductor device, continued from FIG. 17.
Figure 19:
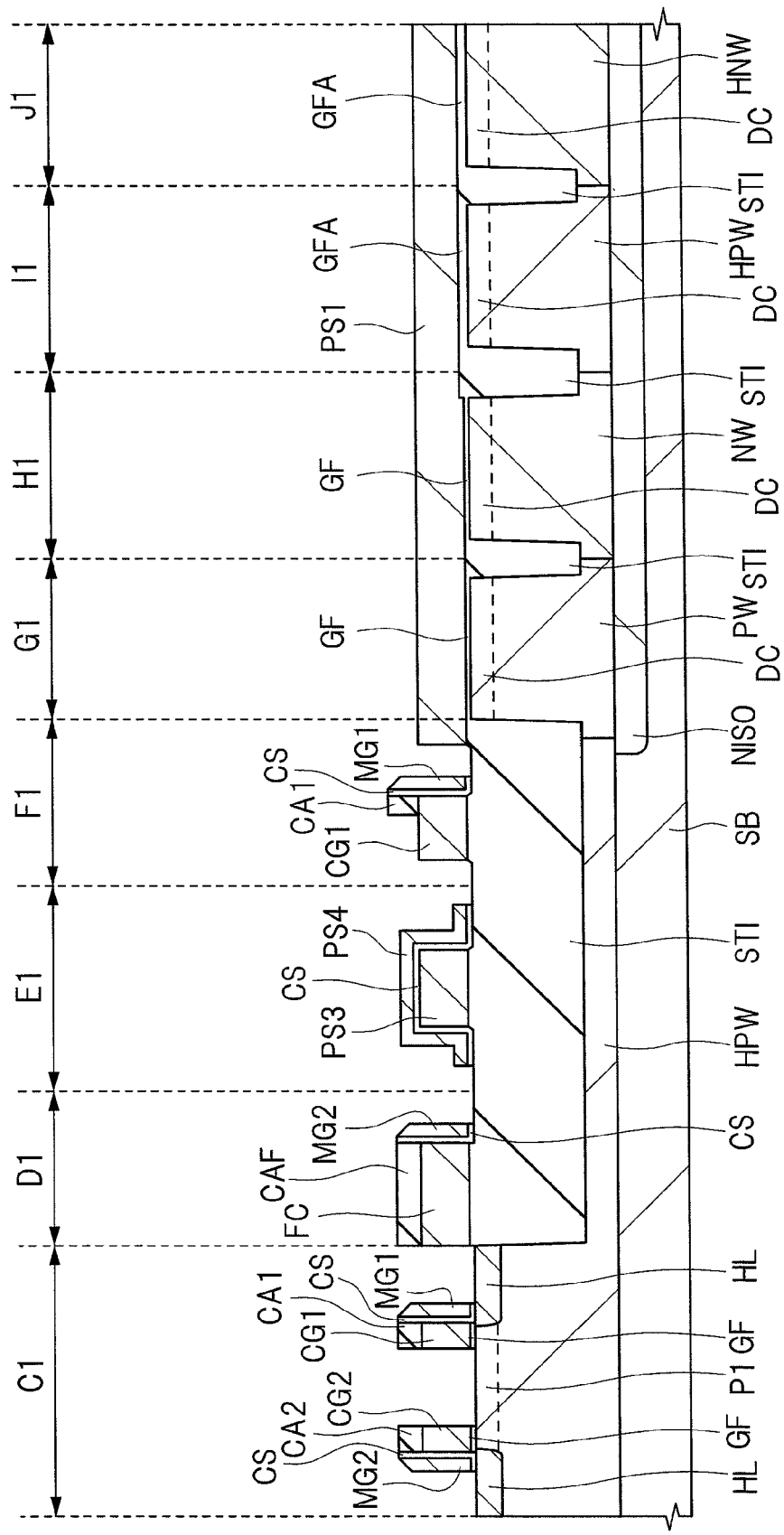
FIG. 19 is a cross-sectional view of a principal part illustrating the method of manufacturing the semiconductor device, continued from FIG. 17.

Next, as illustrated in FIGS. 18 and 19, by using the resist pattern RP3 (see FIG. 17) as a mask, the sidewall S2 exposed from the masks is removed by isotropic etching such as a wet etching process. Then, the resist pattern RP3 is removed. Thus, in the memory region C1 and the power supply region F1 illustrated in FIG. 19, the memory gate electrode MG1 of the memory nMISQM1 (see FIG. 2) is formed on only one side surface of the stacked film formed of the cap insulating film CA1 and the selection gate electrode CG1 of the selection nMISQC1 (see FIG. 2), that is, only on the second side wall.

Similarly, in the memory region C1, the memory gate electrode MG2 of the memory nMISQM2 is formed on only one side surface of the stacked film formed of the cap insulating film CA2 and the selection gate electrode CG2 of the selection nMISQC2, that is, only on the fourth side wall. In other words, the memory gate electrodes MG1 and MG2 are made of the sidewalls S2. The gate length of each of the memory gate electrodes MG1 and MG2 is set to, for example, about 65 nm.

At this time, in the power supply region F1, the sidewall S2 of the first side wall of the selection gate electrode CG1 is removed, and besides, the sidewall S2 which is formed right above the selection gate electrode CG1 and is adjacent to the side wall of the cap insulating film CA1 is also removed.

Moreover, in the power supply region D1, the memory gate electrode MG2 remains so as to surround the stacked film formed of the cap insulating film CAF and the selection gate electrode FC. Note that, in the power supply region D1 of FIG. 19, only one of the side walls of the pattern in the first direction formed of the stacked film including the cap insulating film CAF and the selection gate electrode FC is illustrated, and the other side wall, the ONO film CS adjacent to this side wall and the memory gate electrode MG2 are not illustrated.

Next, in the memory region C1, the ONO film CS except for being formed in a region between the memory gate electrode MG1 and the stacked film formed of the cap insulating film CA1 and the selection gate electrode CG1 and in a region between the semiconductor substrate SB and the memory gate electrode MG1 is selectively etched and removed. Moreover, in the memory region C1, the ONO film CS except for being formed in a region between the memory gate electrode MG2 and the stacked film formed of the cap insulating film CA2 and the selection gate electrode CG2 and in a region between the semiconductor substrate SB and the memory gate electrode MG2 is selectively etched and removed.

Similarly, while the ONO film CS located between the lower electrode PS3 and the upper electrode PS4 in the capacitive element region E1 is left, and while the ONO films CS located between the selection gate electrode CG1 and the memory gate electrode MG1 and between the element isolation region STI and the memory gate electrode MG1 in the power supply region F1 are left, the ONO film CS in the other regions is selectively etched and removed.

In the memory region C1, the sidewall-shaped memory gate electrode MG1 is formed on both side surfaces of the stacked film formed of the cap insulating film CA1 and the selection gate electrode CG1 via the ONO film CS. Therefore, the height of the memory gate electrode MG1 from the main surface of the semiconductor substrate SB is formed to be higher than the height of the selection gate electrode CG1 from the main surface of the semiconductor substrate SB, and besides, to be equal to or lower than the height of the cap insulating film CA1. The same goes for the power supply region F1. Moreover, similarly, the height of the memory gate electrode MG2 from the main surface of the semiconductor substrate SB is formed to be higher than the height of the selection gate electrode CG2 from the main surface of the semiconductor substrate SB, and besides, to be equal to or lower than the height of the cap insulating film CA2.

Moreover, since the ONO film CS is formed between the memory gate electrode MG1 and the stacked film formed of the cap insulating film CA1 and the selection gate electrode CG1, the height of the ONO film CS is formed to be higher than the height of the selection gate electrode CG1 from the main surface of the semiconductor substrate SB. The same goes for the ONO film CS formed on the side wall of the selection gate electrode CG2.

In the capacitive element region E1, by using the ONO film CS as the capacitive insulating film, that is, as a dielectric film, a capacitive element is formed, the capacitive element being formed of the lower electrode PS3 made of the conductive film in the same layer as those of the selection gate electrodes CG1 and CG2 of the selection nMISQC1 and QC2 (see FIG. 2) and the upper electrode PS4 made of the conductive film in the same layer as those of the memory gate electrodes MG1 and MG2 of the memory nMISQM1 and QM2 (see FIG. 2). The capacitive element constitutes, for example, a charge pump circuit used for a power supply circuit that outputs a voltage higher than an input voltage. The charge pump circuit can raise the voltage by switching connection states of a plurality of capacitive elements by using a switch or others.

Moreover, the capacitive element is formed on the element isolation region STI formed on the semiconductor substrate SB, and can stably perform the above-described operations since its parasitic capacity formed of the substrate portion and the lower electrode PS3 is as small as ignorable. Moreover, even when a position of a contact hole reaching the upper electrode PS4 and a position of a contact hole reaching the lower electrode PS3 to be formed in the later process is shifted by the positional misalignment of the photomask or other, they are only shifted into the element isolation region STI, and therefore, there is no possibility of the short circuit between the wire and the semiconductor substrate SB via the contact hole.

As illustrated in FIG. 18, in the above-described etching process for the sidewall S2, the memory gate electrode MG1 is formed only on the second side wall side of the selection gate electrode CG1, and the sidewall S2 on the first side wall side is removed. Similarly, the memory gate electrode MG2 is formed only on the fourth side wall side of the selection gate electrode CG2, and the sidewall S2 on the third side wall side is removed.

In this case, the sidewall S2 exposed from the resist pattern RP3 in FIG. 17 is removed. Moreover, since the etching process is isotropic etching, even the sidewall S2 on a region covered with the resist pattern RP3 can be etched and removed so as to be dug from the region side exposed from the resist pattern RP3. That is, the sidewall S2 can be partially removed by performing a side etching process utilizing the isotropic property of etching.

As illustrated in FIG. 18, the memory gate electrode MG1 is terminated on the second side wall side so as to be closer than a border between the region where the selection gate electrode CG1 is covered with the cap insulating film CA1 and the region where the upper surface of the selection gate electrode CG1 is exposed from the cap insulating film CA1, that is, the border with respect to the shunt portion CS1. This process forms a structure in which the cap insulating film CA1 is formed between the memory gate electrode MG1 and the shunt portion CS1 of the selection gate electrode CG1 adjacent to the memory gate electrode MG1. Moreover, the removal of the sidewall S2 on the third side wall side of the selection gate electrode CG2 forms a structure the cap insulating film CA2 is formed between the memory gate electrode MG2 adjacent to the selection gate electrode CG2 and the shunt portion CS2 of the selection gate electrode CG2.

Moreover, in a plan view, the selection gate electrode FC is surrounded by the ONO film CS and the memory gate electrode MG2. The memory gate electrode MG2 in the region adjacent to the selection gate electrode FC is used as a power supply portion of the memory gate electrode MG2.

Note that, when the memory gate electrode MG1 is partially removed as described above, the first side wall side of the selection gate electrode CG1 is exposed, and an isotropic etching process is performed by using the resist pattern covering the second side wall side. Therefore, in this etching process, the memory gate electrode MG1 is removed from the first side wall side toward the second side wall side so as to go round behind the periphery of the end portion of the selection gate electrode CG1 in the first direction.

Figure 20:
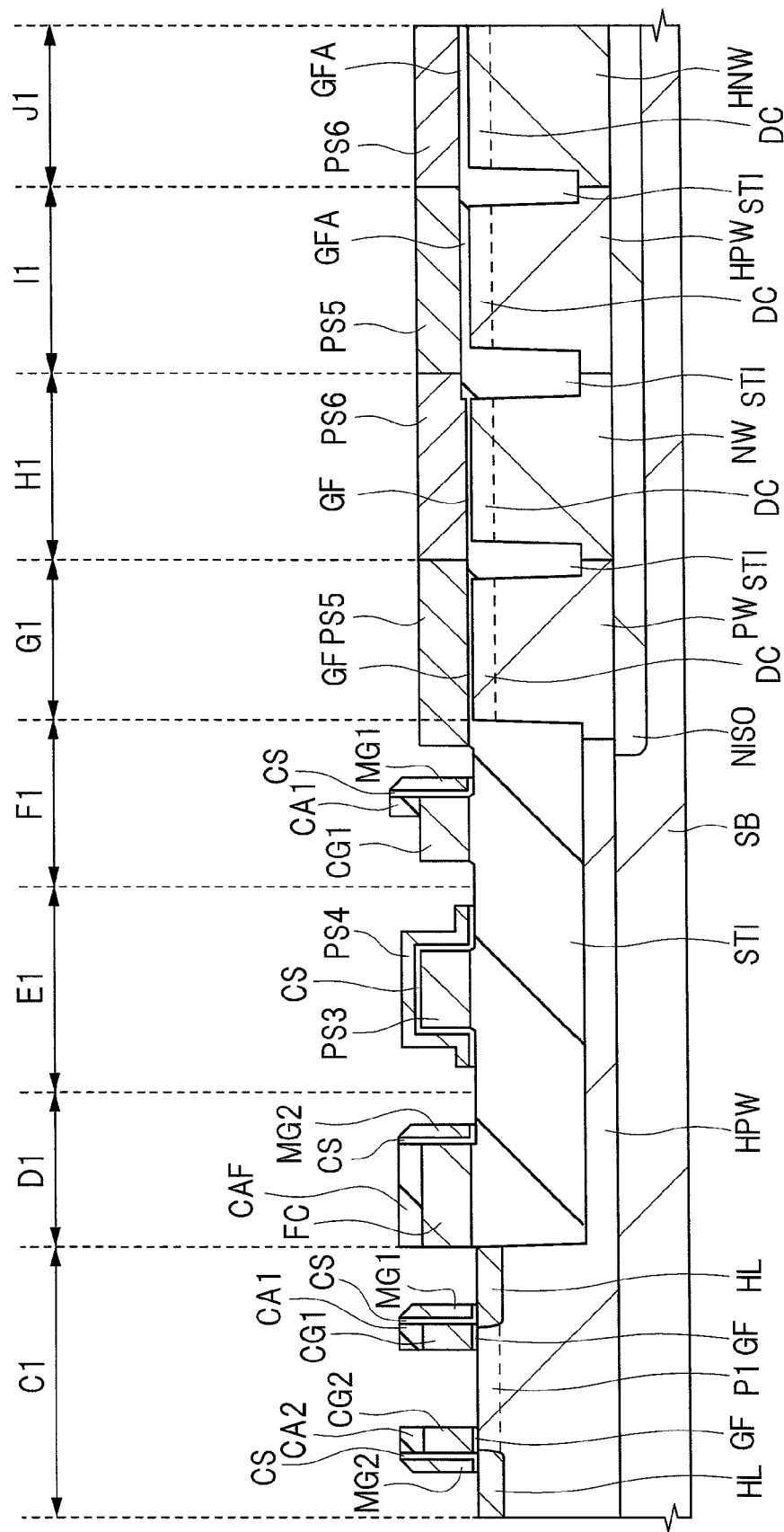
FIG. 20 is a cross-sectional view of a principal part illustrating the method of manufacturing the semiconductor device, continued from FIG. 19.

Next, as illustrated in FIG. 20, an n-type conductive film PS5 is formed by implanting an n-type impurity into the conductive film PS1 of the low breakdown-voltage type nMIS region G1 and the high breakdown-voltage type nMIS region I1 in the peripheral circuit region by using an ion implanting method or others. Moreover, a p-type conductive film PS6 is formed by implanting a p-type impurity into the conductive film PS1 of the low breakdown-voltage type pMIS region H1 and the high breakdown-voltage type pMIS region J1 in the peripheral circuit region by using an ion implanting method or others.

Figure 21:
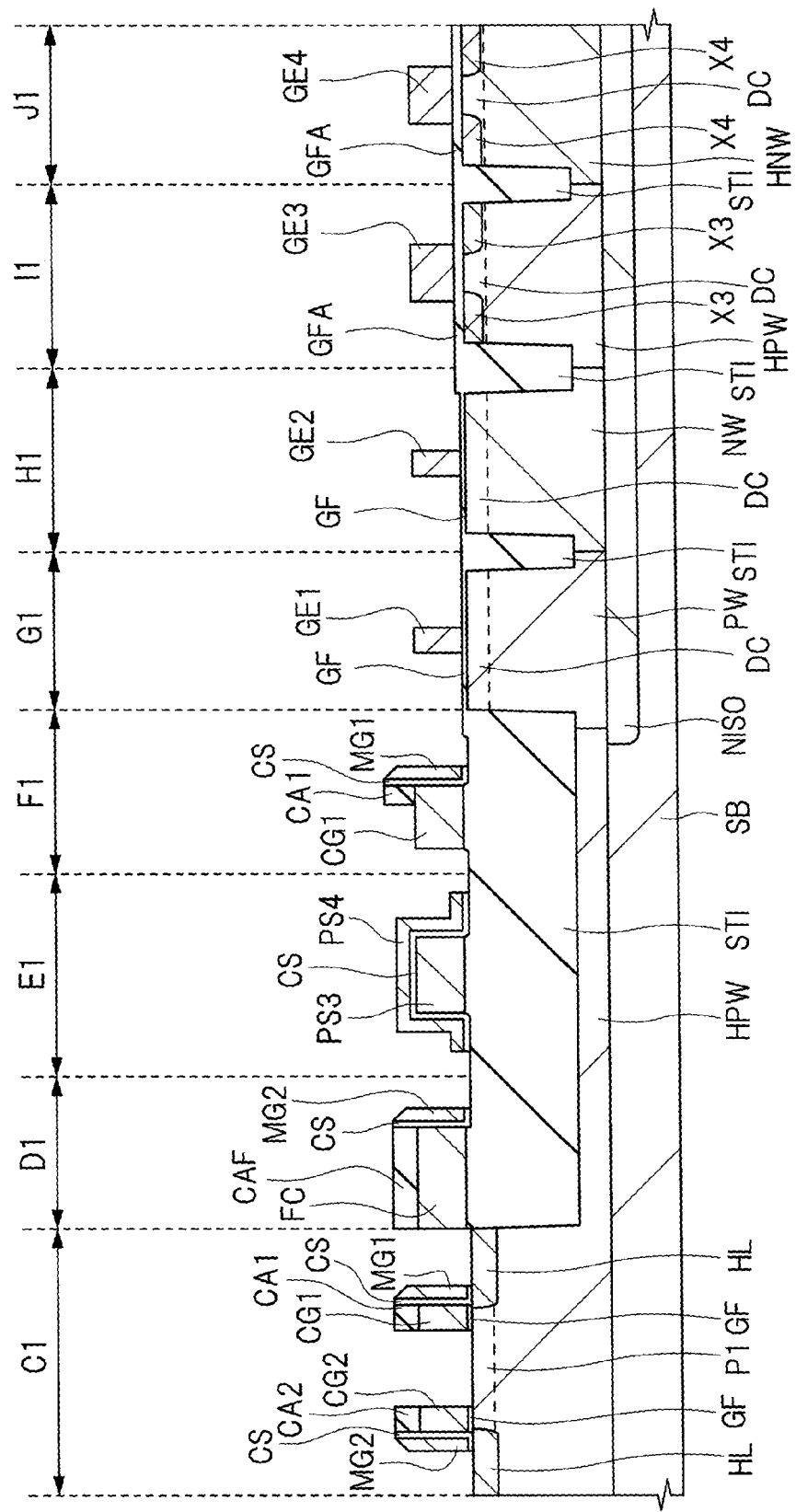
FIG. 21 is a cross-sectional view of a principal part illustrating the method of manufacturing the semiconductor device, continued from FIG. 20.

Next, as illustrated in FIG. 21, by patterning the conductive films PS5 and PS6 in the peripheral circuit region by using a lithography technique and a dry etching technique, a gate electrode GE1 of a low breakdown-voltage type nMIS formed of the conductive film PS5, a gate electrode GE2 of a low breakdown-voltage type pMIS formed of the conductive film PS6, a gate electrode GE3 of a high breakdown-voltage type nMIS formed of the conductive film PS5 and a gate electrode GE4 of a high breakdown-voltage type pMIS formed of the conductive film PS6 are formed. The gate lengths of the gate electrode GE1 of the low breakdown-voltage type nMIS and the gate electrode GE2 of the low breakdown-voltage type pMIS in the active region are, for example, about 100 nm, and the gate lengths of the gate electrode GE3 of the high breakdown-voltage type nMIS and the gate electrode GE4 of the high breakdown-voltage type pMIS are, for example, about 400 nm.

Next, an $n^-$-type semiconductor region X3 is formed in self alignment on the gate electrode GE3 of the main surface of the semiconductor substrate SB in the high breakdown-voltage type nMIS region I1 in the peripheral circuit region by ion-implanting an n-type impurity such as As (arsenic, into the main surface of the semiconductor substrate SB in the high breakdown-voltage type nMIS region I1 in the peripheral circuit region by using a resist pattern as a mask. Similarly, a $p^-$-type semiconductor region X4 is formed in self alignment on the gate electrode GE4 of the main surface of the semiconductor substrate SB in the high breakdown-voltage type pMIS region J1 in the peripheral circuit region by ion-implanting a p-type impurity such as boron fluoride into the main surface of the semiconductor substrate SB in the high breakdown-voltage type pMIS region J1 in the peripheral circuit region by using a resist pattern as a mask.

Figure 22:
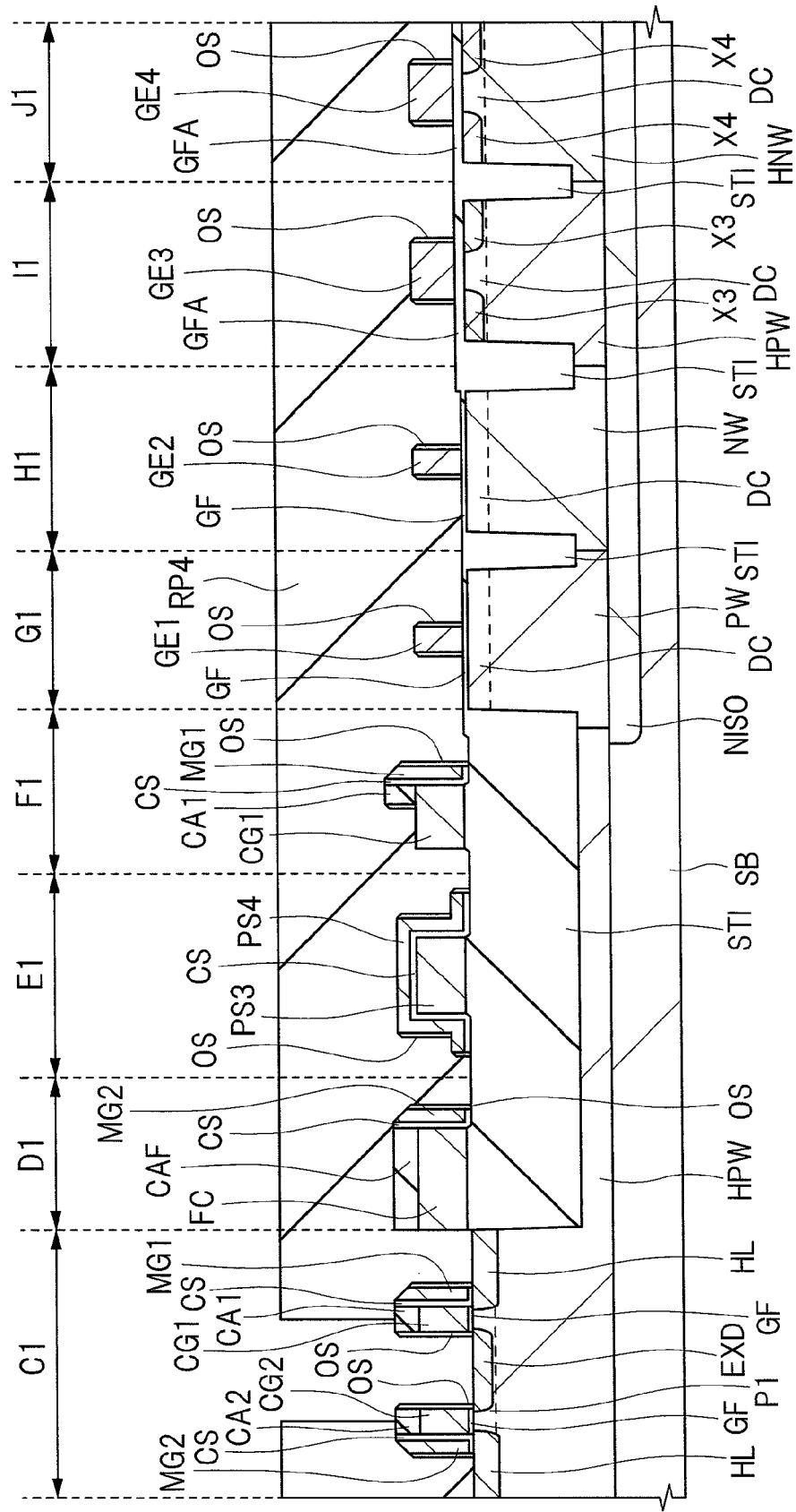
FIG. 22 is a cross-sectional view of a principal part illustrating the method of manufacturing the semiconductor device, continued from FIG. 21.

Next, as illustrated in FIG. 22, for example, an insulating film made of silicon oxide and having a thickness of about 10 nm is deposited on the main surface of the semiconductor substrate SB by a CVD method, and then, this insulating film is subjected to an etch-back process by using an anisotropic dry etching method. Thus, in the memory region C1 and the power supply region F1, a sidewall SW is formed on each of the side surface of the memory gate electrode MG1 and the side surface on the side opposite to the memory gate electrode MG1 of the stacked film formed of the cap insulating film CA1 and the selection gate electrode CG1. Similarly, in the memory region C1, a sidewall OS is formed on each of the side surface of the memory gate electrode MG2 and the side surface on the side opposite to the memory gate electrode MG2 of the stacked film formed of the cap insulating film CA2 and the selection gate electrode CG2.

The sidewall OS is formed on the side surface of the upper electrode PS4 in the capacitive element region E1 and on both side surfaces of the gate electrode GE1 of the low breakdown-voltage type nMIS, the gate electrode GE2 of the low breakdown-voltage type pMIS, the gate electrode GE3 of the high breakdown-voltage type nMIS and the gate electrode GE4 of the high breakdown-voltage type pMIS in the peripheral circuit region. The spacer length of the sidewall OS is, for example, about 6 nm.

By forming this sidewall OS, effective channel lengths of the n⁻-type semiconductor region and the p⁻-type semiconductor region are increased in a process of forming an n⁻-type semiconductor region in the low breakdown-voltage type nMIS region G1 and a step of forming a p⁻-type semiconductor region in the low breakdown-voltage type pMIS region H1 in the peripheral circuit region to be described later, and therefore, the short-channel effect of the low breakdown-voltage type nMIS and the low breakdown-voltage type pMIS can be suppressed. Note that FIG. 2 does not illustrate the shape of this sidewall OS.

Next, a resist pattern RP4 whose end portion is positioned on the upper surface of the selection gate electrode CG1 in the memory region C1 and which covers a part of the selection gate electrode CG1 on the memory gate electrode MG1 side and the memory gate electrode MG1 is formed. Also, the other end of the resist pattern RP4 is positioned on the upper surface of the selection gate electrode CG2 in the memory region C1, and covers a part of the selection gate electrode CG2 on the memory gate electrode MG2 side. In other words, the resist pattern RP4 is a pattern in which a region between the first side wall of the selection gate electrode CG2 and the third side wall of the selection gate electrode CG2 is opened in the active region but the other region is covered.

Then, by ion-implanting an n-type impurity such as As (arsenic) into the main surface of the semiconductor substrate SB by using the selection gate electrodes CG1 and CG2 and the resist pattern RP4 as masks, an n⁻-type semiconductor region EXD is formed in self alignment with respect to the selection gate electrode CG on the main surface of the semiconductor substrate SB.

Figure 23:
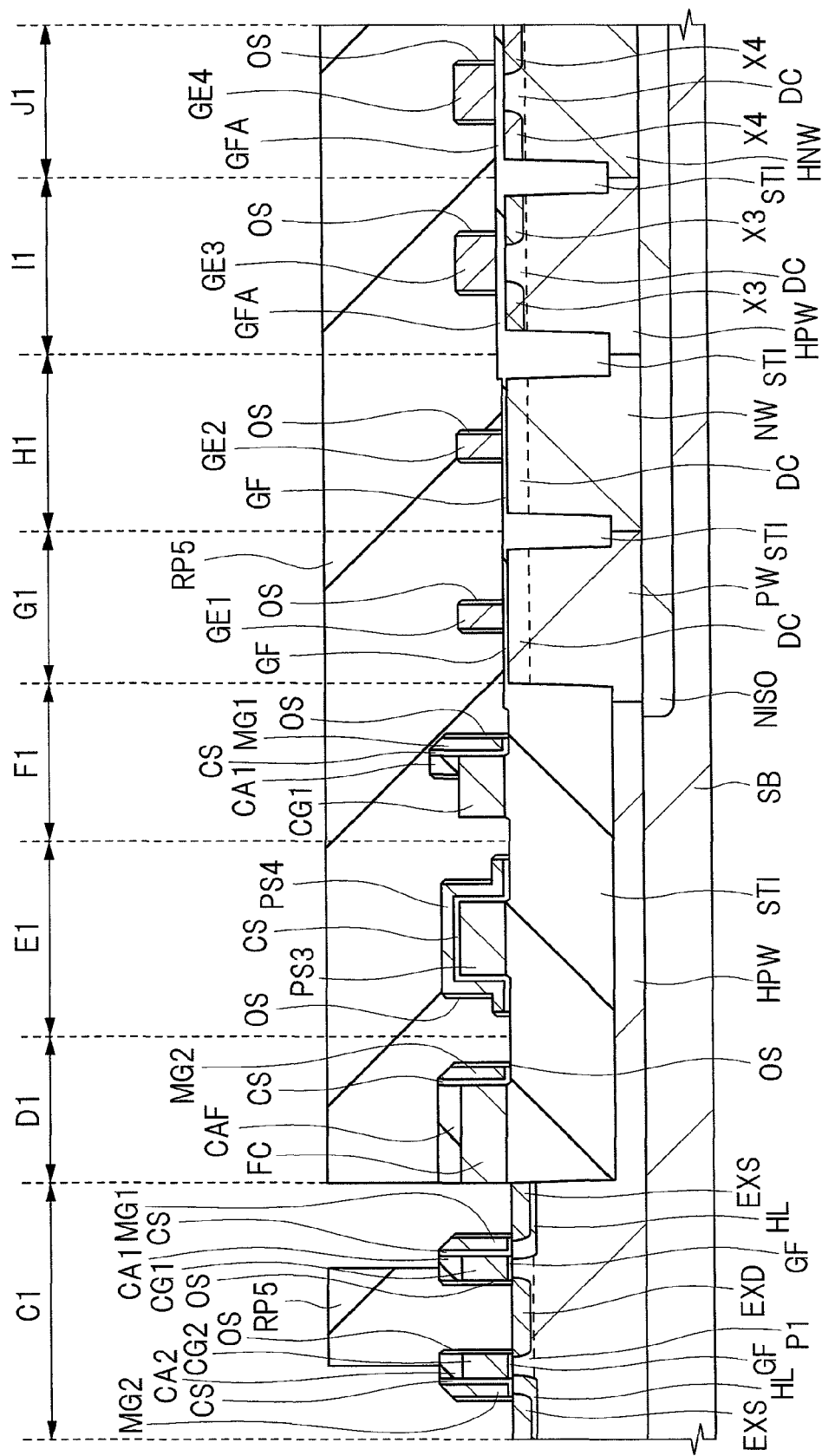
FIG. 23 is a cross-sectional view of a principal part illustrating the method of manufacturing the semiconductor device, continued from FIG. 22.

Next, as illustrated in FIG. 23, the resist pattern RP4 is removed, and then, a resist pattern RP5 whose end portion is positioned on the upper surface of the selection gate electrode CG1 in the memory region C1 and which covers a part of the selection gate electrode CG1 on the side opposite to the memory gate electrode MG1 is formed. The end portion of the resist pattern RP5 is positioned in the upper surface of the selection gate electrode CG2 in the memory region C1, and covers a part of the selection gate electrode CG2 on the side opposite to the memory gate electrode MG2. In other words, from the resist pattern RP5, the active region on the second side wall side of the selection gate electrode CG1 and the fourth side wall side of the selection gate electrode CG2 are exposed.

Then, by ion-implanting an n-type impurity such as As (arsenic) into the main surface of the semiconductor substrate SB by using the selection gate electrodes CG1, CG2, the memory gate electrodes MG1, MG2 and the resist pattern RP5 as a mask, an n⁻-type semiconductor region EXS is formed on the main surface of the semiconductor substrate SB in self alignment with respect to the memory gate electrodes MG1, MG2.

In this case, the n⁻-type semiconductor region EXD is formed first, and then, the n⁻-type semiconductor region EXS is formed. However, the n⁻-type semiconductor region EXS may be formed first, and then, the n⁻-type semiconductor region EXD may be formed. Moreover, the ion implantation of the n-type impurity for forming the n⁻-type semiconductor region EXD may be followed by ion implantation of a p-type impurity such as B (boron) into the main surface of the semiconductor substrate SB for forming a p-type semiconductor region so as to surround the lower portion of the n⁻-type semiconductor region EXD.

Figure 24:
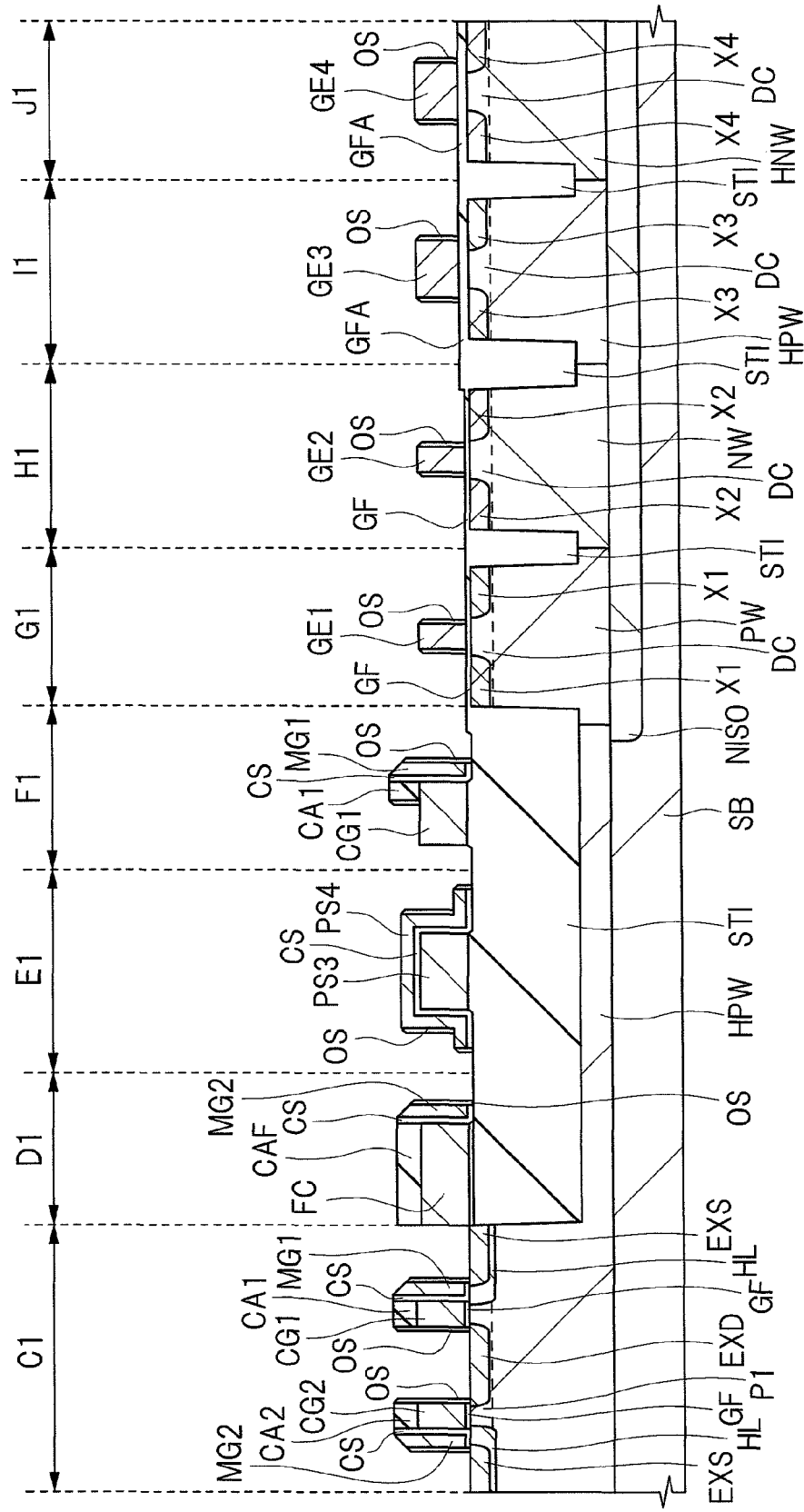
FIG. 24 is a cross-sectional view of a principal part illustrating the method of manufacturing the semiconductor device, continued from FIG. 23.

Next, as illustrated in FIG. 24, an n⁻-type semiconductor region X1 is formed in self alignment on the gate electrode GE1 of the main surface of the semiconductor substrate SB in the low breakdown-voltage type nMIS region G1 in the peripheral circuit region by ion-implanting an n-type impurity such as As (arsenic) into the main surface of the semiconductor substrate SB in the low breakdown-voltage type nMIS region G1 in the peripheral circuit region by using a resist pattern as a mask. Similarly, a p⁻-type semiconductor region X2 is formed in self alignment on the gate electrode GE2 of the main surface of the semiconductor substrate SB in the low breakdown-voltage type pMIS region H1 in the peripheral circuit region by ion-implanting a p-type impurity such as boron fluoride into the main surface of the semiconductor substrate SB in the low breakdown-voltage type pMIS region H1 in the peripheral circuit region by using a resist pattern as a mask.

Figure 25:
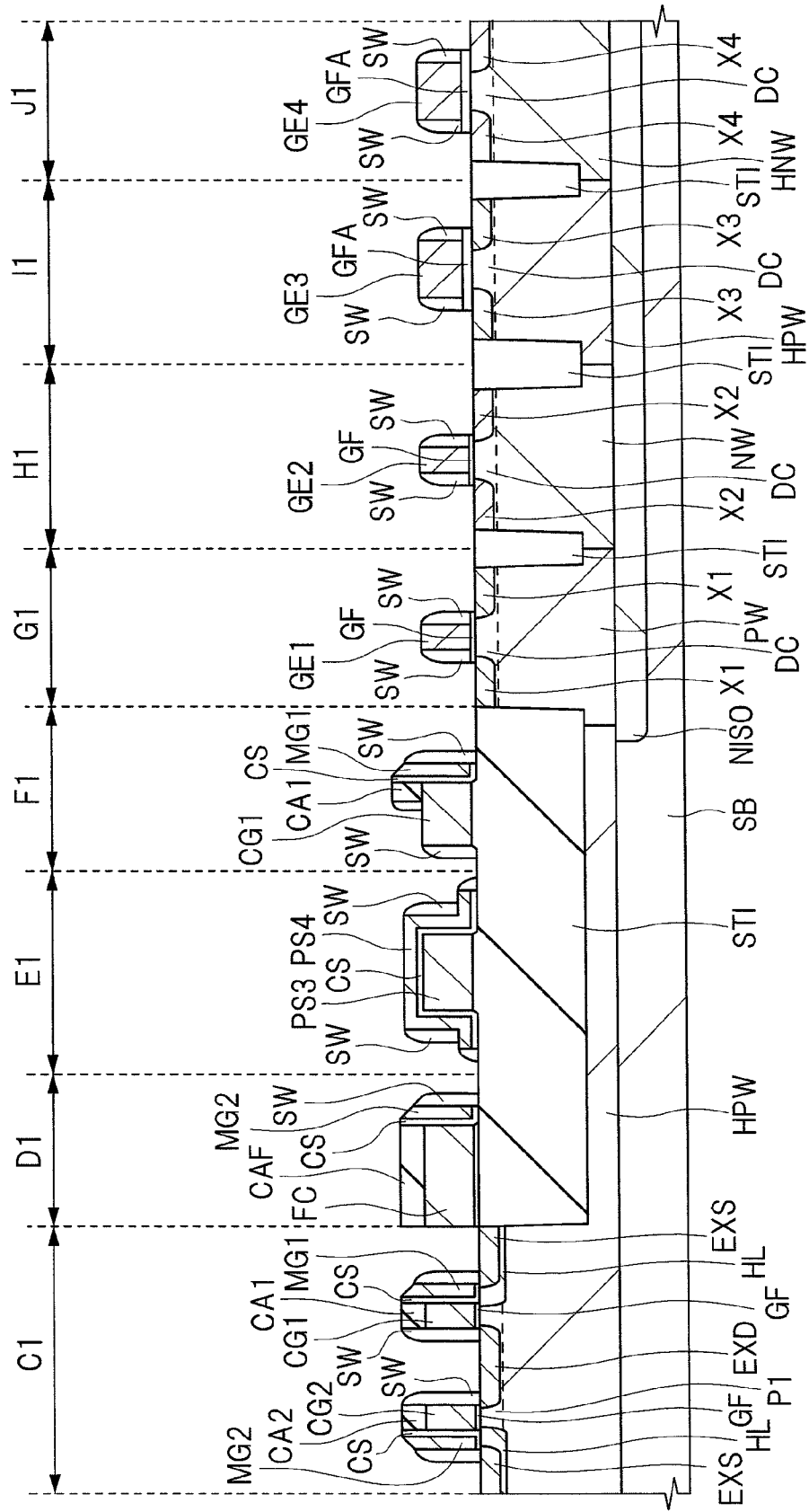
FIG. 25 is a cross-sectional view of a principal part illustrating the method of manufacturing the semiconductor device, continued from FIG. 24.

Next, as illustrated in FIG. 25, for example, a silicon oxide film OB (see FIG. 2) and a silicon nitride film NT (see FIG. 2) are sequentially deposited on the main surface of the semiconductor substrate SB by a CVD method, and these films are subjected to an etch-back process by using an anisotropic dry etching method. Thus, in the memory region C1 and the power supply region F1, a sidewall SW made of the silicon oxide film OB and the silicon nitride film NT is formed on the side surface on the side opposite to the memory gate electrode MG1 of the stacked film formed of the cap insulating film CA1 and the selection gate electrode CG1 and on the side surface of the memory gate electrode MG1. Similarly, in the memory region C1, a sidewall SW made of the silicon oxide film OB and the silicon nitride film NT is formed on the side surface on the side opposite to the memory gate electrode MG2 of the stacked film formed of the cap insulating film CA2 and the selection gate electrode CG2 and on the side surface of the memory gate electrode MG2.

Similarly, a sidewall SW is formed on the side surface of the upper electrode PS4 in the capacitive region E1 and on both side surfaces of each of the gate electrodes GE1 to GE4 in the peripheral circuit region. The thickness of the silicon oxide film OB is, for example, about 20 nm, and the thickness of the silicon nitride film NT is, for example, about 25 nm. Note that, in order to easily understand the drawing, each shape of the silicon oxide film OB and the silicon nitride film NT is not specifically illustrated, and the shape of the sidewall SW corresponding to the stacked film of these films is illustrated.

Figure 26:
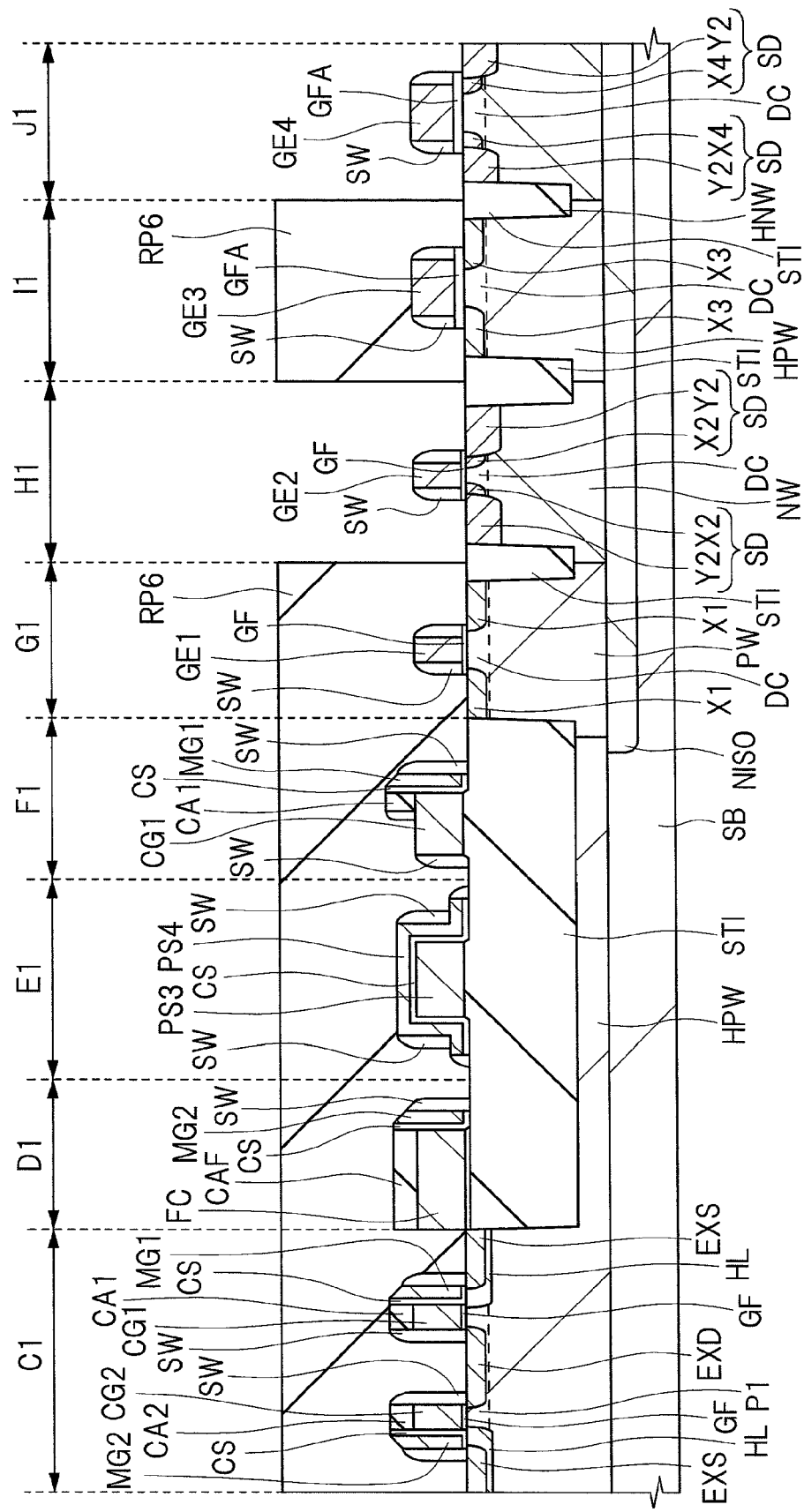
FIG. 26 is a cross-sectional view of a principal part illustrating the method of manufacturing the semiconductor device, continued from FIG. 25.

Next, as illustrated in FIG. 26, a p⁺-type semiconductor region Y2 is formed in self alignment on the gate electrode GE2 of the low breakdown-voltage type pMIS and the gate electrode GE4 of the high breakdown-voltage type pMIS by ion-implanting a p-type impurity such as B (boron) into the main surface of the semiconductor substrate SB in the low breakdown-voltage type nMIS region H1 and the high breakdown-voltage type pMIS region J1 in the peripheral circuit region by using the resist pattern RP6 as a mask. Thus, a source/drain region SD of a high breakdown-voltage type pMIS formed of the p⁻-type semiconductor region X4 and the p⁺-type semiconductor region Y2 is formed, and a source/drain region SD of a low breakdown-voltage type pMIS formed of the p⁻-type semiconductor region X2 and the p⁺-type semiconductor region Y2 is also formed.

In this process, in the low breakdown-voltage type pMIS region H1, a low breakdown-voltage type nMIS including the gate electrode GE2 and the source/drain region SD is formed. Moreover, in the high breakdown-voltage type pMIS region J1, a low breakdown-voltage type nMIS including the gate electrode GE4 and the source/drain region SD is formed.

Figure 27:
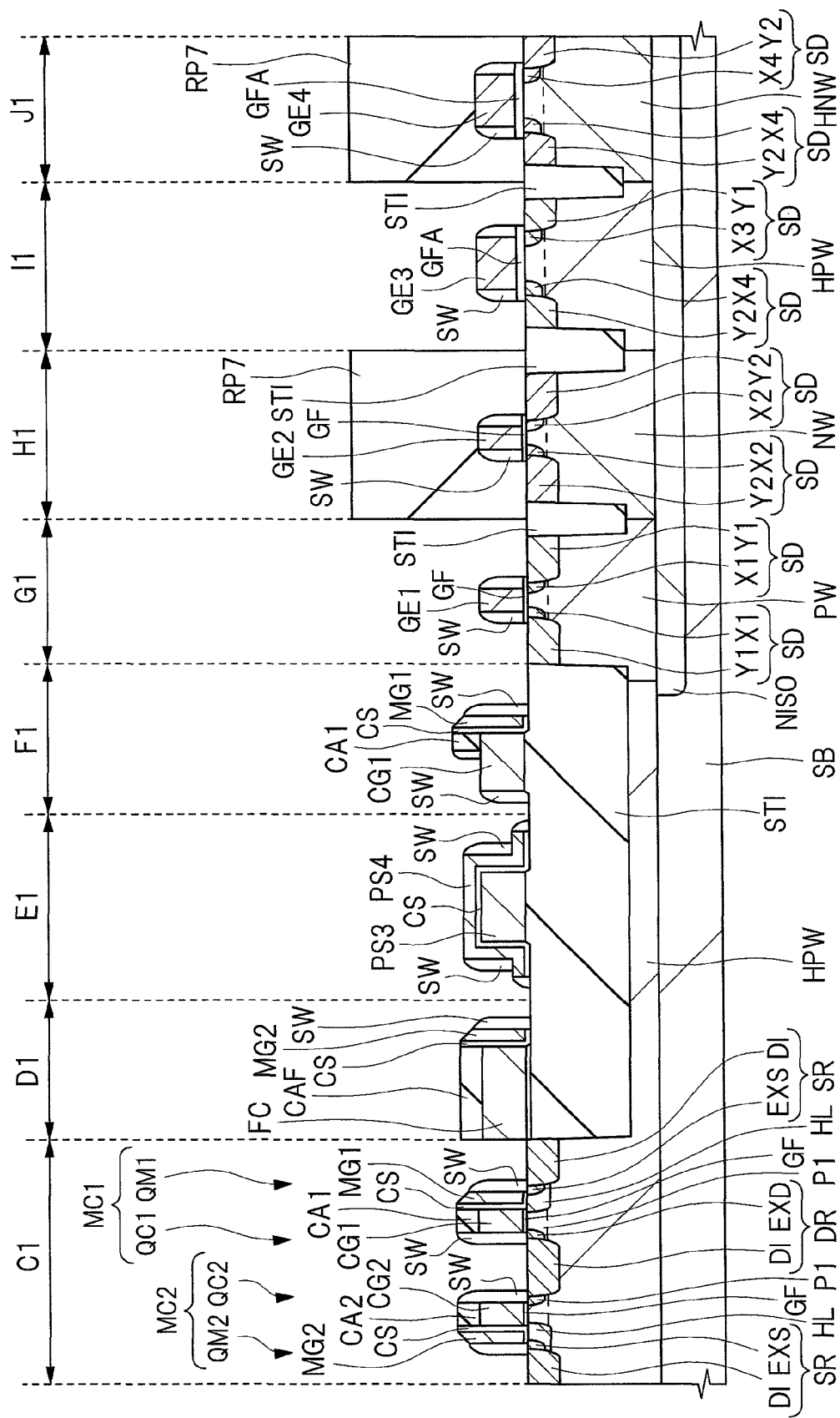
FIG. 27 is a cross-sectional view of a principal part illustrating the method of manufacturing the semiconductor device, continued from FIG. 26.

Next, as illustrated in FIG. 27, an n-type impurity such as As (arsenic) or P (phosphorus) is ion-implanted to the main surface of the semiconductor substrate SB in the memory region C1, the low breakdown-voltage type nMIS region G1 and the high breakdown-voltage type nMIS region I1 in the peripheral circuit region by using a resist pattern RP7 as a mask. Thus, an $n^+$-type semiconductor region DI is formed in self alignment on the selection gate electrodes CG1, CG2 and the memory gate electrodes MG1, MG2 in the memory region C1, and an $n^+$-type semiconductor region Y1 is formed in self alignment on the gate electrode GE1 of the low breakdown-voltage type nMIS and the gate electrode GE3 of the high breakdown-voltage type nMIS in the peripheral circuit region.

Thus, in the memory region C1, a drain region DR formed of the $n^-$-type semiconductor region EXD and the $n^+$-type semiconductor region DI is formed, and a source region SR formed of the $n^-$-type semiconductor region EXS and the $n^+$-type semiconductor region DI is formed. Moreover, in the peripheral circuit region, a source/drain region SD of the high breakdown-voltage type nMIS formed of the $n^-$-type semiconductor region X3 and the $n^+$-type semiconductor region Y1 is formed, and a source/drain region SD of the low breakdown-voltage type nMIS formed of the $n^-$-type semiconductor region X1 and the $n^+$-type semiconductor region Y1 is formed.

By this process, in the memory region C1, the selection nMISQC1 formed of the selection gate electrode CG1, the source region SR and the drain region DR, and the selection nMISQC2 formed of the selection gate electrode CG2, the source region SR and the drain region DR are formed. Moreover, in the memory region C1, the memory nMISQM1 formed of the memory gate electrode MG1, the source region SR and the drain region DR, and the memory nMISQM2 formed of the memory gate electrode MG2, the source region SR and the drain region DR are formed. The selection nMISQC1 and the memory nMISQM1 configures a memory cell MC1 of the MONOS memory with the split gate structure, and the selection nMISQC2 and the memory nMISQM2 configures a memory cell MC2 of the MONOS memory with the split gate structure.

Moreover, in the low breakdown-voltage type nMIS region G1, a low breakdown-voltage type nMIS including the gate electrode GE1 and the source-drain region SD is formed. Furthermore, in the high breakdown-voltage type nMIS region I1, a low breakdown-voltage type nMIS including the gate electrode GE3 and the source/drain region SD is formed.

Figure 28:
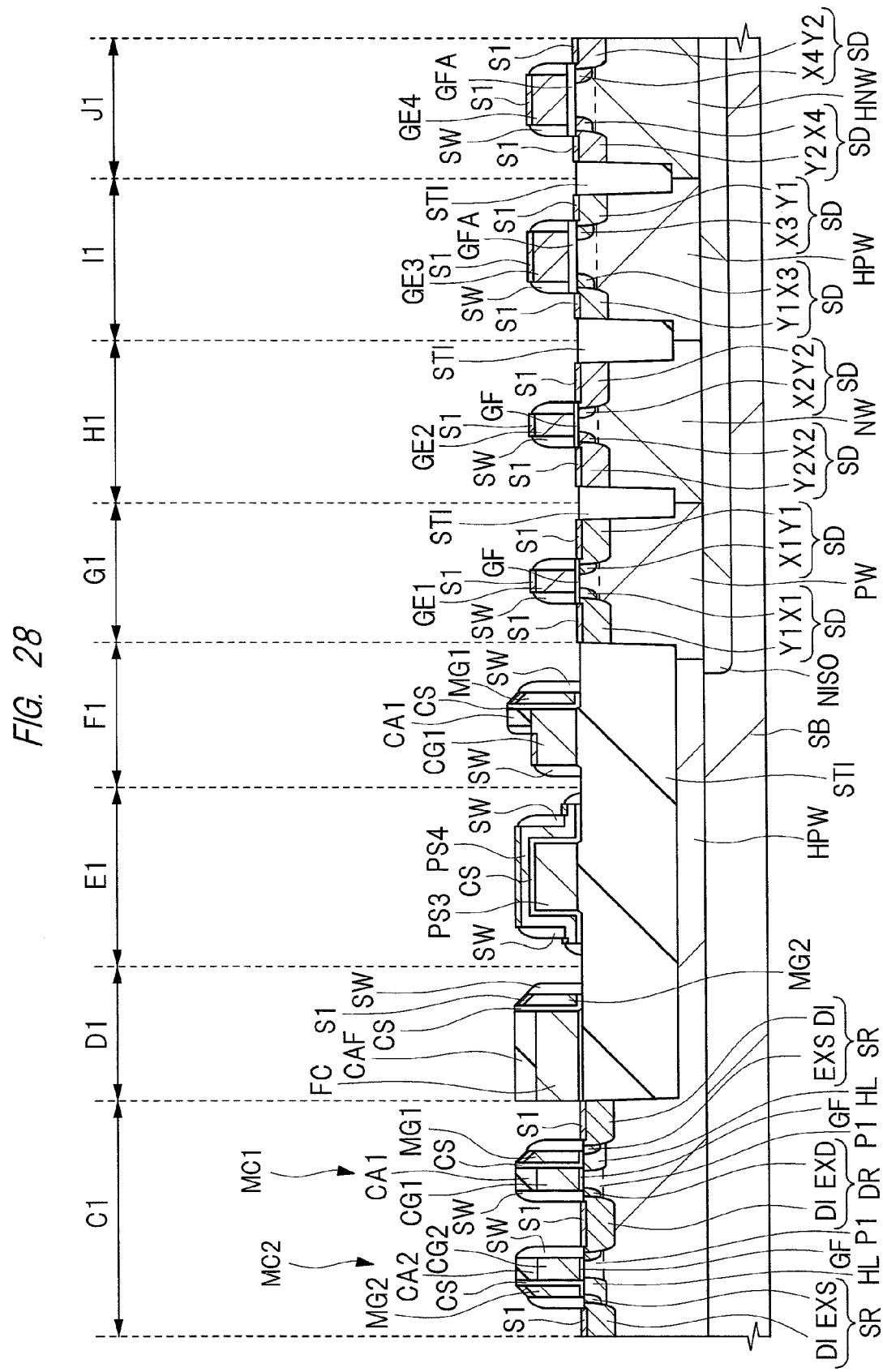
FIG. 28 is a cross-sectional view of a principal part illustrating the method of manufacturing the semiconductor device, continued from FIG. 27.

Next, as illustrated in FIG. 28, in the memory region C1, a silicide layer S1 is formed on each upper surface of the memory gate electrodes MG1, MG2 and the $n^+$-type semiconductor region DI. Moreover, in the power supply region F1, the silicide layer S1 is formed on the upper surface of the memory gate electrode MG1 and the upper surface of the selection gate electrode CG1. In the power supply region D1, the silicide layer S1 is formed on the upper surface of the memory gate electrode MG2. In the capacitive element region E1, the silicide layer S1 is formed on the upper surface of the upper electrode PS4 in a region that is not overlapped with the sidewall SW in plane, and on the upper surface of the lower electrode PS3 that is exposed from the upper electrode PS4 in a region not illustrated.

In the peripheral circuit region, the silicide layer S1 is formed on the upper surface of the gate electrode GE1 of the low breakdown-voltage type nMIS as well as on the upper surface of the $n^+$-type semiconductor region Y1, on the upper surface of the gate electrode GE2 of the low breakdown-voltage type pMIS as well as on the upper surface of the $p^+$-type semiconductor region Y2, on the upper surface of the gate electrode GE3 of the high breakdown-voltage type nMIS as well as on the upper surface of the $n^+$-type semiconductor region Y1, and on the upper surface of the gate electrode GE4 of the high breakdown-voltage type pMIS as well as on the upper surface of the $p^+$-type semiconductor region Y2. The silicide layer S1 is formed by a salicide process (Salicide:Self Align Silicide). As the material for the silicide layer S1, for example, nickel silicide, cobalt silicide or others is used.

By forming the silicide layer S1, contact resistance between the silicide layer S1 and a plug or others formed thereon can be reduced. Moreover, in the memory region C1, resistances of the memory gate electrodes MG1, MG2, the source region SR and the drain region DR themselves can be reduced. Furthermore, in the peripheral circuit region, resistances of the gate electrode GE1 of the low breakdown-voltage type nMIS, the gate electrode GE2 of the low breakdown-voltage type pMIS, the gate electrode GE3 of the high breakdown-voltage type nMIS and the gate electrode GE4 of the high breakdown-voltage type pMIS themselves and resistance of the source/drain region SD itself can be reduced.

Figure 29:
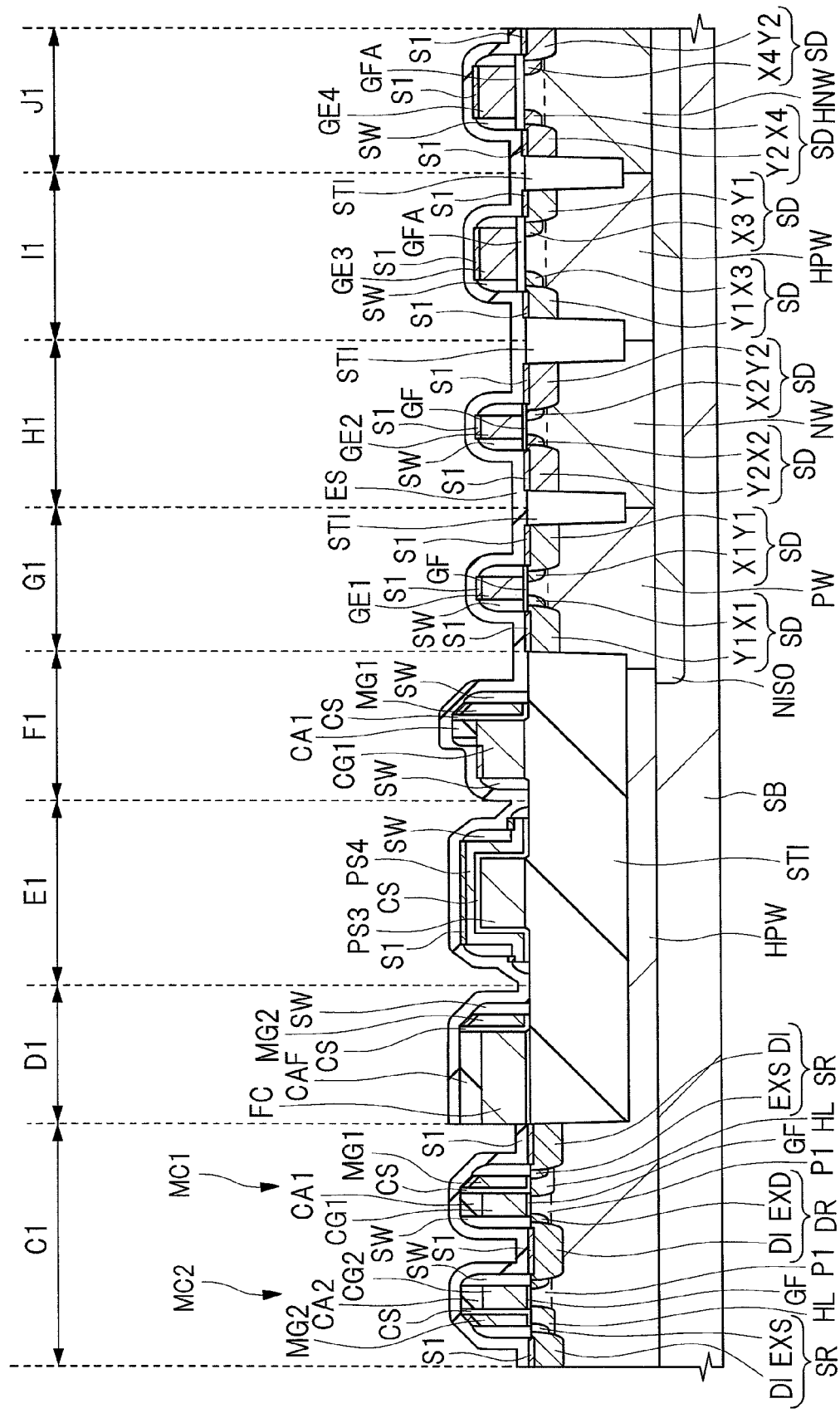
FIG. 29 is a cross-sectional view of a principal part illustrating the method of manufacturing the semiconductor device, continued from FIG. 28.

Next, as illustrated in FIG. 29, on the main surface of the semiconductor substrate SB, a silicon nitride film ES serving as an insulating film is deposited by a CVD method. This silicon nitride film ES functions as an etching stopper when a contact hole described later is formed.

Figure 30:
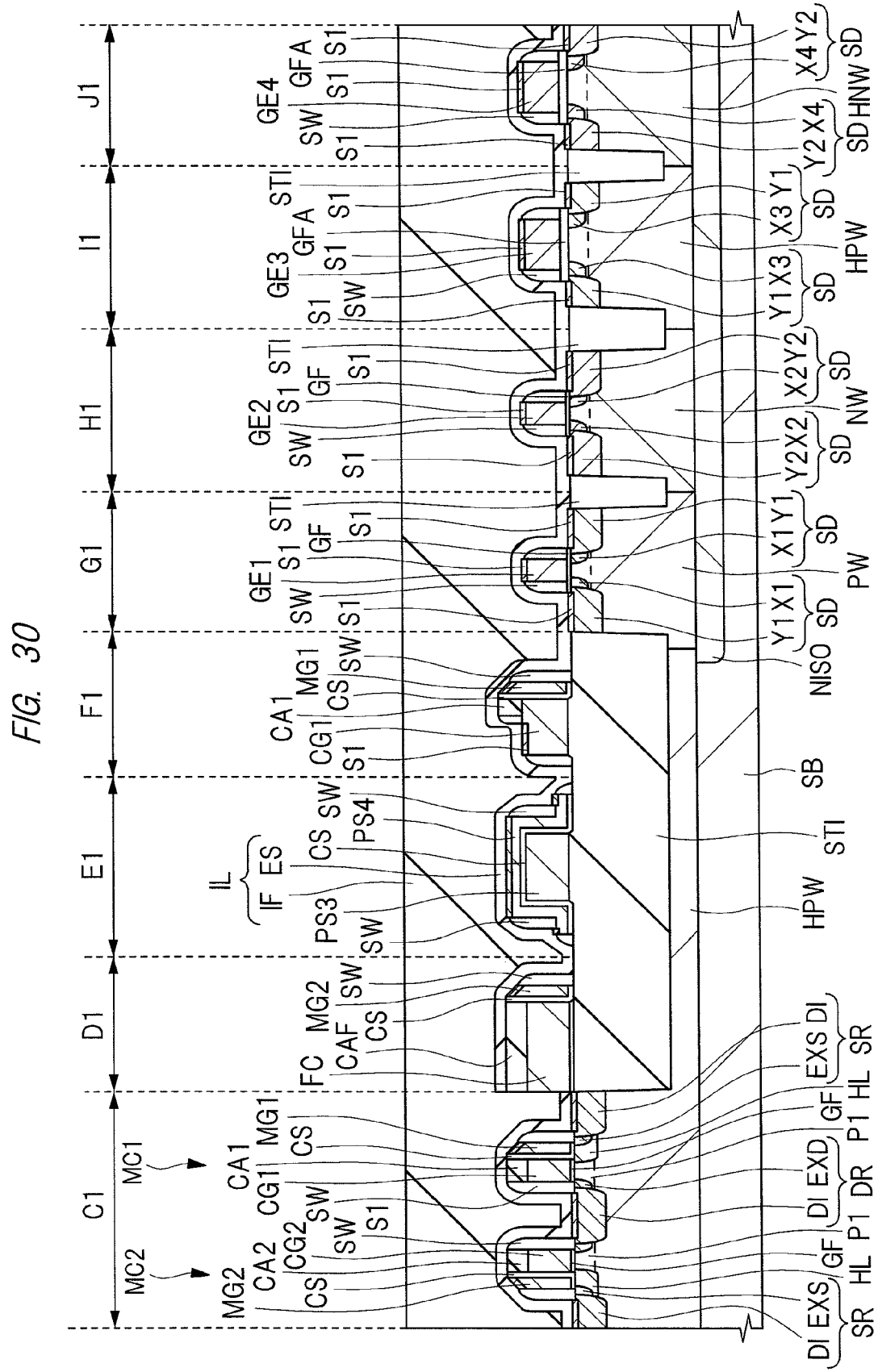
FIG. 30 is a cross-sectional view of a principal part illustrating the method of manufacturing the semiconductor device, continued from FIG. 29.

Next, as illustrated in FIG. 30, a silicon oxide film IF serving as an insulating film is deposited by a CVD method so that the interlayer insulating film IL formed of the silicon nitride film ES and the silicon oxide film IF is formed.

Figure 31:
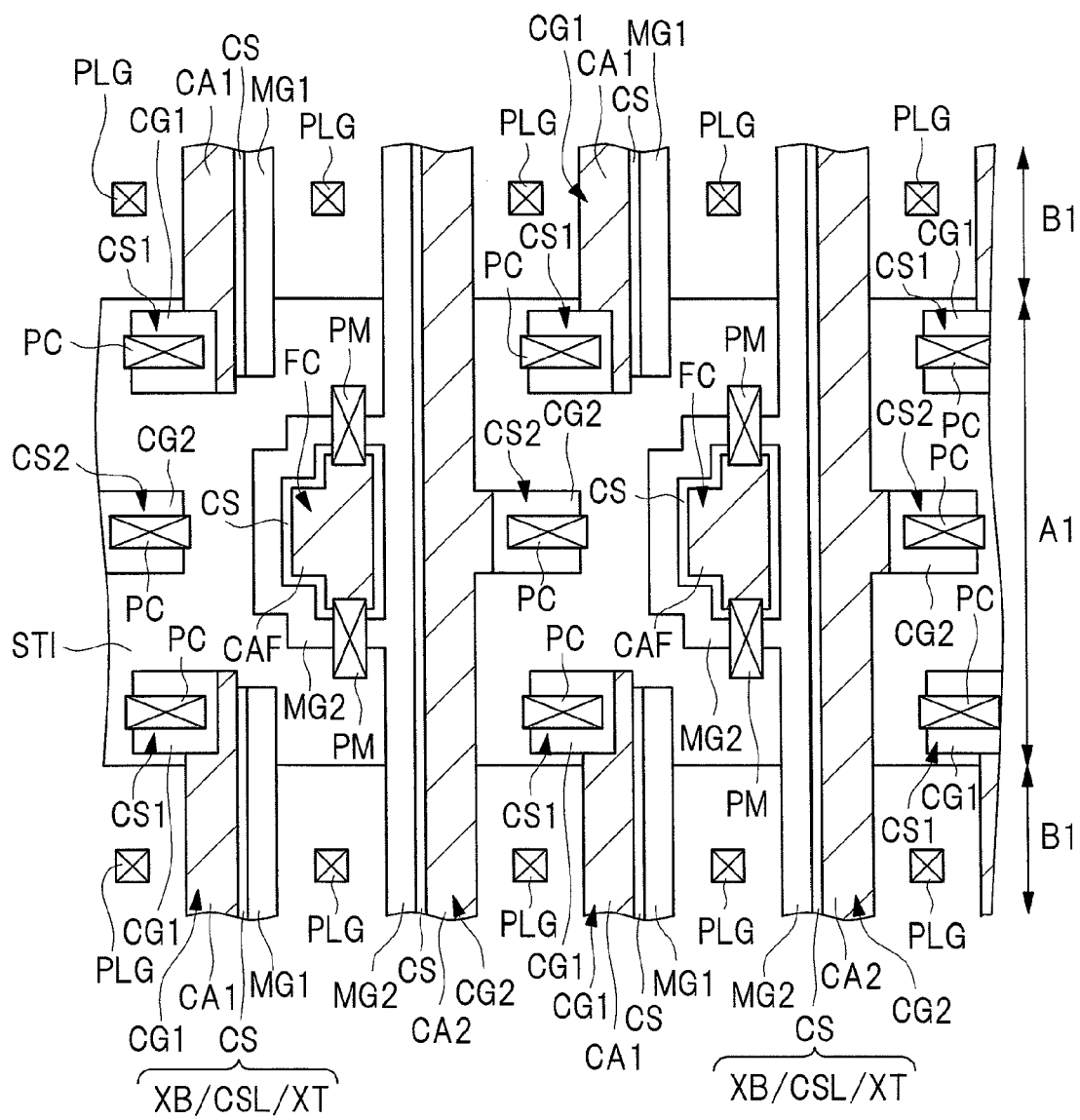
FIG. 31 is a plan view of a principal part illustrating the method of manufacturing the semiconductor device, continued from FIG. 30.

Next, as illustrated in FIGS. 31 and 32, in the memory region C1, a contact hole CNT that reaches the silicide layer S1 on the drain region DR is formed in the interlayer insulating film IL. Simultaneously, in the power supply region F1, a contact hole CC that reaches the silicide layer S1 on the selection gate electrode CG1 corresponding to the shunt portion is formed. Moreover, in a region not illustrated, a contact hole that reaches the silicide layer S1 on the selection gate electrode CG2 is formed in the shunt portion of the selection gate electrode CG2, and a plug is buried into the contact hole. Inside the contact hole CNT and the contact hole CC, plugs PLG and PC are buried, respectively.

Moreover, in the power supply region D1, a contact hole CM that reaches the silicide layer S1 on the memory gate electrode MG2 is formed in the interlayer insulating film IL, and a plug PM is buried into the contact hole. Similarly, in a region not illustrated, a contact hole that reaches the silicide layer 51 on the memory gate electrode MG1 is formed in the interlayer insulating film IL, and a plug is buried into the contact hole.

In the power supply region D1, the contact hole CM formed in the shunt portion of the memory gate electrode MG2 is formed in a shape ridden above the selection gate electrode FC in consideration of the positional alignment margin and the margin for the variation in the dimension between the memory gate electrode MG2 and the contact hole CM or others. At this time, in the process of forming the contact hole CM, the cap insulating film CAF and the insulating film OX (see FIG. 4) below the cap insulating film, and the ONO film CS formed on the side walls of the removed cap insulating film CAF and the removed insulating film OX below the cap insulating film, are removed. For this reason, the plug PM to be connected to the memory gate electrode MG2 is formed so as to be connected to the selection gate electrode FC. Therefore, a part of the upper surface of the selection gate electrode FC is exposed from the cap insulating film CAF and the insulating film OX, and is in contact with the plug PM.

Moreover, since the ONO film CS formed on the side walls of the removed cap insulating film CAF and the removed insulating film OX is also removed, the plug PM is also in contact with the side surface on the selection gate electrode FC side of the silicide layer S1 formed on the memory gate electrode MG2. Thus, the contact area between the plug PM and the silicide layer 51 can be increased, and the contact resistance between the plug PM and the memory gate electrode MG2 can be reduced. Since the selection gate electrode FC located at a position below the plug PM is not connected to the selection gate electrode CG2 but is kept in the floating state, the electrical short circuit between the selection gate electrode CG2 and the memory gate electrode MG2 does not occur even when the plug PM used for supplying power to the memory gate electrode MG is in contact with the selection gate electrode FC as described above.

Moreover, in the capacitive element region E1, a contact hole CB that reach the silicide layers S1 on each upper surface of the upper electrode PS4 and the lower electrode PS3 is formed in portions where the upper electrode PS4 and the lower electrode PS3 are not overlapped in plane with each other, and then, a plug PB is buried into each contact hole CB. FIG. 32 exemplifies the contact hole CB that reaches the upper electrode PS4 for simple explanation.

Moreover, in the peripheral circuit region, a contact hole CA that reaches the silicide layer S1 on each of the gate electrodes GE1 to GE4 and the source-drain region SD is formed in the low breakdown-voltage type nMIS, the low breakdown-voltage type pMIS, the high breakdown-voltage type nMIS and the high breakdown-voltage type pMIS, and the insides of these contact holes CA are buried with plugs PA. FIG. 32 exemplifies the contact hole CA and the plug PA which reach the source/drain region SD of the low breakdown-voltage type nMIS and the low breakdown-voltage type pMIS, for simple explanation.

Each of the plugs PLG, PC, PM, PA and PB is formed by a stacked film including a relatively-thin barrier film made of a stacked film of, for example, Ti (titanium) and TiN (titanium nitride), and a relatively-thick conductive film made of W (tungsten) or Al (aluminum) formed so as to be covered with the barrier film. Then, by forming a first layer wire (whose illustration is omitted) mainly containing, for example, Cu (copper) or Al (aluminum) on the interlayer insulating film IL, a semiconductor device of the present embodiment is completed. After this process, a semiconductor device having a nonvolatile memory is manufactured through normal manufacturing processes of a semiconductor device.

In FIG. 31, illustrations of insulating films on the semiconductor element such as interlayer insulating films and sidewalls are omitted. As illustrated in FIG. 31, the plug PLG has its lengths of the sides in the first direction and the second direction are substantially the same as each other in a plan view. On the other hand, the plug PC has a rectangular shape or an elliptical shape extending in the second direction. Moreover, the plug PM has a rectangular shape or an elliptical shape extending in the first direction.

As illustrated in FIG. 31, the plug PC that has the rectangular shape extending in the second direction in a plan view is connected to the shunt portions CS1 and CS2. Moreover, the plug PM that has the rectangular shape extending in the first direction in a plan view is connected to the shunt portion of the memory gate electrode MG2. The shunt portion of the memory gate electrode MG2 corresponds to a memory gate electrode MG2 in a region adjacent to the side wall of a stacked film including the selection gate electrode FC that is kept in the electrically floating state and the cap insulating film CAF located thereon.

The plug PM has a rectangular shape that extends in a direction orthogonal to the extending direction of the memory gate electrode MG2 of the corresponding shunt portion, and is formed as to bridge over the memory gate electrode MG2. The plug PM is also connected to the upper surface of the cap insulating film CAF covering the upper surface of the selection gate electrode FC.

Next, effects of the method of manufacturing the semiconductor device of the present embodiment will be explained. As similar to the comparative example explained by using FIGS. 62 and 63, it is considered that the shunt portion CSE that is a region from which the upper surface of the selection gate electrode CGE is exposed and the memory gate electrode MGE adjacent to the selection gate electrode CGE are adjacent to each other so as not to form any insulating film between the shunt portion CSE and the memory gate electrode MGE. In this case, there is a risk that the selection gate electrode CG1 and the memory gate electrode MGE that are close to each other are conducted to each other via the silicide layer S1 (see FIG. 63) formed on the upper surfaces thereof.

Therefore, in the present embodiment, as illustrated in FIG. 31, the cap insulating film CA1 is formed so as to extend right above the selection gate electrode CG1 in the region adjacent to the shunt portion CS1 in the second direction, so that the shunt portion CS1 and the memory gate electrode MG1 on the second side wall side of the selection gate electrode CG1 are separated from each other. Therefore, even when the silicide layer S1 (see power supply region F1 of FIG. 32) is formed on the upper surface of the memory gate electrode MG1 adjacent to the shunt portion CS1 via the cap insulating film CA1, the memory gate electrode MG1, the silicide layer S1 formed thereon and the shunt portion CS1 are insulated from one another by the cap insulating film CA1, ant therefore, the short circuit can be prevented.

In this manner, by covering the upper surface of the selection gate electrode CG1 in the region to which the memory gate electrode MG1 is adjacent, that is, the region adjacent to the second side wall of the selection gate electrode CG1 with the cap insulating film CA1, the memory gate electrode MG1 is insulated from the selection gate electrode CG1 by the ONO film CS and the cap insulating film CA1. Even when the silicide layer 51 on the upper surface of the memory gate electrode MG1 is swelled across the ONO film CS, the silicide layer S1 and the upper surface of the selection gate electrode CG1 in the region adjacent to the second side wall of the selection gate electrode CG1 are covered with the cap insulating film CA1, and therefore, the conduction of the memory gate electrode MG1 to the selection gate electrode CG1 via the silicide layer 51 is prevented.

Therefore, such a problem that the MONOS memory including the selection gate electrode CG1 and the memory gate MG1 is not normally operated due to the above-described conduction can be prevented, so that the reliability of the semiconductor device having the MONOS memory can be improved.

Moreover, one of the causes for the short circuit in the comparative example explained by using FIGS. 62 and 63 is the insufficient etching amount in the etching process of the memory gate electrode MG1 explained by using FIGS. 18 and 19. For this cause, in the present embodiment, the formation region of the cap insulating film CA1 in the first direction is extended so that the region for covering the upper surface of the selection gate electrode CG1 in the region adjacent to the second side wall of the selection gate electrode CG1 is extended. Thus, the margin for excessiveness or insufficiency of the etching amount can be expanded.

In other words, such a problem that the shunt portion CSE and the memory gate electrode MGE are adjacent to each other due to the too small amount of the above-described etching amount as explained by using FIG. 63 can be prevented. Moreover, such a problem that the memory gate electrode MG1 in the active region B1 is removed due to the too large amount of the etching amount, which results in disabling the desired performance of the MONOS memory, can be prevented. Therefore, the reliability of the semiconductor device can be improved by expanding the margin for the etching amount of the memory gate electrode MG1.

Next, as a modified example of the present embodiment, by using FIGS. 33 to 36, a semiconductor device having a structure in which the pattern of the selection gate electrode, the cap insulating film or the memory gate electrode is changed will be explained. FIGS. 33 to 36 are plan views of a principal part of the memory cell including the selection gate electrode CG1 in the vicinity of the shunt portion CS1 illustrated in FIG. 1, the cap insulating film CA1 on the selection gate electrode CG1, the memory gate electrode MG1 adjacent to the selection gate electrode CG1, and the ONO film CS interposed between these selection gate electrode CG1 and memory gate electrode MG1.

Figure 33:
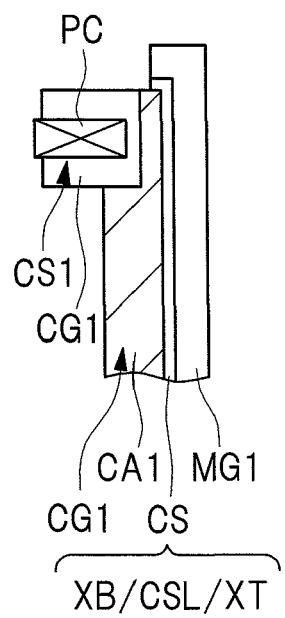
FIG. 33 is a plan view of a principal part of a semiconductor device according to a modification example of the first embodiment of the present invention.

First, as illustrated in FIG. 33, it is considered that the memory gate electrode MG1 and the ONO film CS are formed not only in a region of the side wall extending of the selection gate electrode CG1 in the first direction but also formed so as to go round behind a region adjacent to the side wall extending of the selection gate electrode CG1 in the second direction at the end portion of the selection gate electrode CG1. In a case that the etching is insufficient in the process of removing the memory gate electrode MG1 and the ONO film CS explained by using FIGS. 18 and 19, the memory gate electrode MG1 is formed so as to go round behind the end portion of the selection gate electrode CG1 in the first direction as described above.

Even in such a case, since the cap insulating film CA1 and the ONO film CS are interposed between the memory gate electrode MG1 and the selection gate electrode CG1 in the region whose upper surface is exposed from the cap insulating film CA1, the short circuit between the memory gate electrode MG1 and the selection gate electrode CG1 can be prevented.

Figure 34:
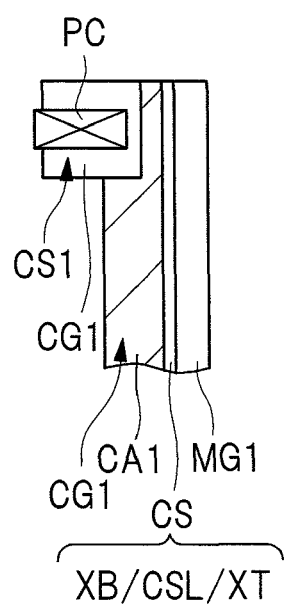
FIG. 34 is a plan view of a principal part of a semiconductor device according to a modification example of the first embodiment of the present invention.

Moreover, as illustrated in FIG. 34, it is considered that the farthest end portions of the shunt portion CS1, the selection gate electrode CG1, the cap insulating film CA1 and the memory gate electrode MG1 in the first direction are aligned to one another in the second direction. Also in this case, as similar to the modified example illustrated in FIG. 33, since the cap insulating film CA1 and the ONO film CS are interposed between the memory gate electrode MG1 and the selection gate electrode CG1 in the region whose upper surface is exposed from the cap insulating film CA1, the short circuit between the memory gate electrode MG1 and the selection gate electrode CG1 can be prevented.

Figure 35:
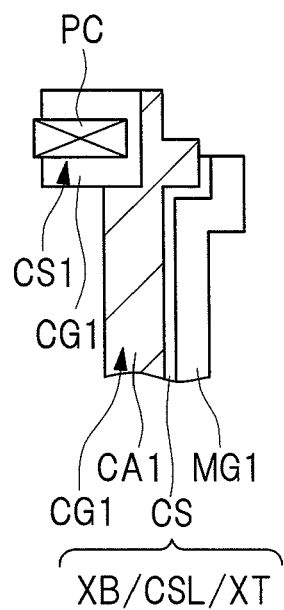
FIG. 35 is a plan view of a principal part of a semiconductor device according to a modification example of the first embodiment of the present invention.

Furthermore, as illustrated in FIG. 35, it is considered that the end portion of the cap insulating film CA1 in the first direction does not reach the farthest end portion of the selection gate electrode CG1 in the same direction. Even in such a case, since the cap insulating film CA1 and the ONO film CS are interposed between the shunt portion CS1 and the memory gate electrode MG1, the short circuit between the memory gate electrode MG1 and the selection gate electrode CG1 can be prevented.

Figure 36:
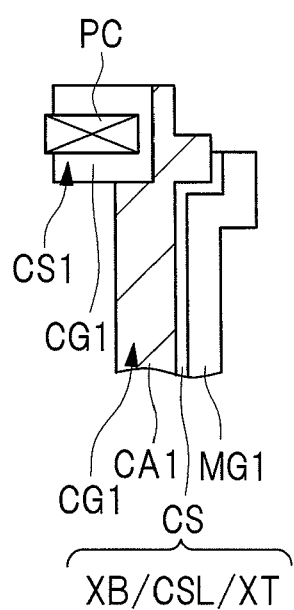
FIG. 36 is a plan view of a principal part of a semiconductor device according to a modification example of the first embodiment of the present invention.

Moreover, as illustrated in FIG. 36, it is considered that the pattern formed of the stacked film of the selection gate electrode CG1 and the cap insulating film CA1 located right above thereon partially protrudes toward the second side wall side in the vicinity of the shunt portion CS1. A reason why the region protruding from the second side wall in the second direction is formed on the stacked film as described above is that the margin for the insufficiency or excessiveness of the etching amount in the process of removing the memory gate electrode MG1 and the ONO film CS explained by using FIGS. 18 and 19 is expanded.

That is, as illustrated in FIG. 36, by forming the side wall of the selection gate electrode CG1 so as to be unevenness, the length of the side wall of the selection gate electrode CG1 with which the memory gate electrode MG1 is made in contact in the power supply region A1 can be extended. Therefore, the problem that the shunt portion CSE and the memory gate electrode MGE are adjacent to each other due to the too small amount of the etching amount as explained by using FIG. 63 can be prevented. Moreover, the problem that the memory gate electrode MG1 in the active region B1 is removed due to the too large amount of the etching amount, which results in disabling the desired performance of the MONOS memory, can be prevented.

Moreover, by forming a convex portion on the side wall of the cap insulating film CA1 as illustrated in FIG. 36, the width of the cap insulating film CA1 in the second direction is partially increased, and therefore, it can be prevented to entirely remove the cap insulating film CA1 to be left between the memory gate electrode MG1 and the shunt portion CS1 caused when the position at which the resist pattern (see FIG. 12) used for exposing the shunt portion CS1 is formed is shifted.

As described above, the reliability of the semiconductor device can be improved by expanding the margin for the etching upon processing the cap insulating film CA1 and the etching of the memory gate electrode MG1. By applying the present embodiment even to the memory cell having the selection gate electrode CG1 and the cap insulating film CA1 in such a pattern, the short circuit between the memory gate electrode MG1 and the selection gate electrode CG1 can be prevented.

Figure 37:
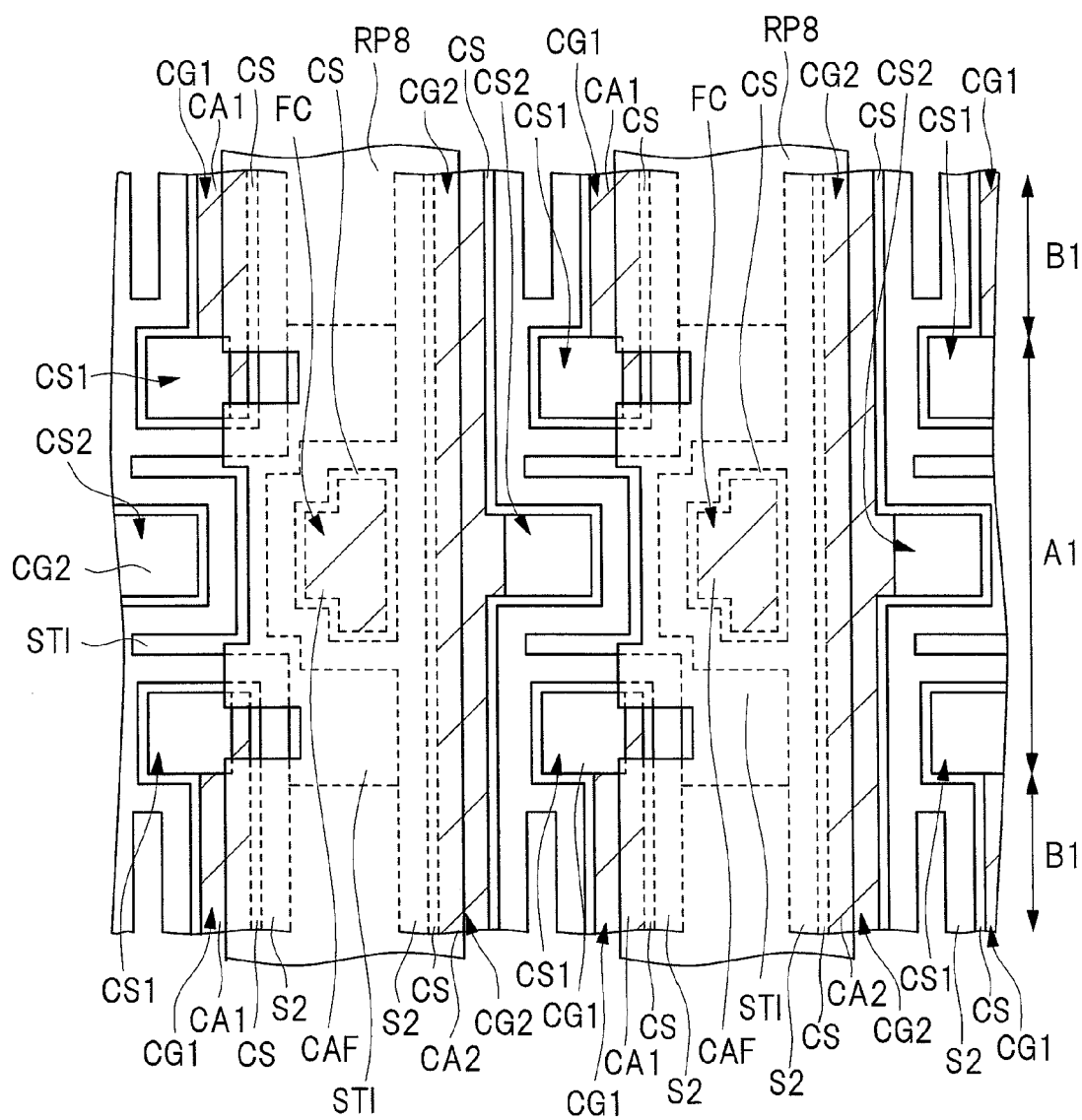
FIG. 37 is a plan view of a principal part illustrating a method of manufacturing the semiconductor device according to the modification example of the first embodiment of the present invention.
Figure 38:
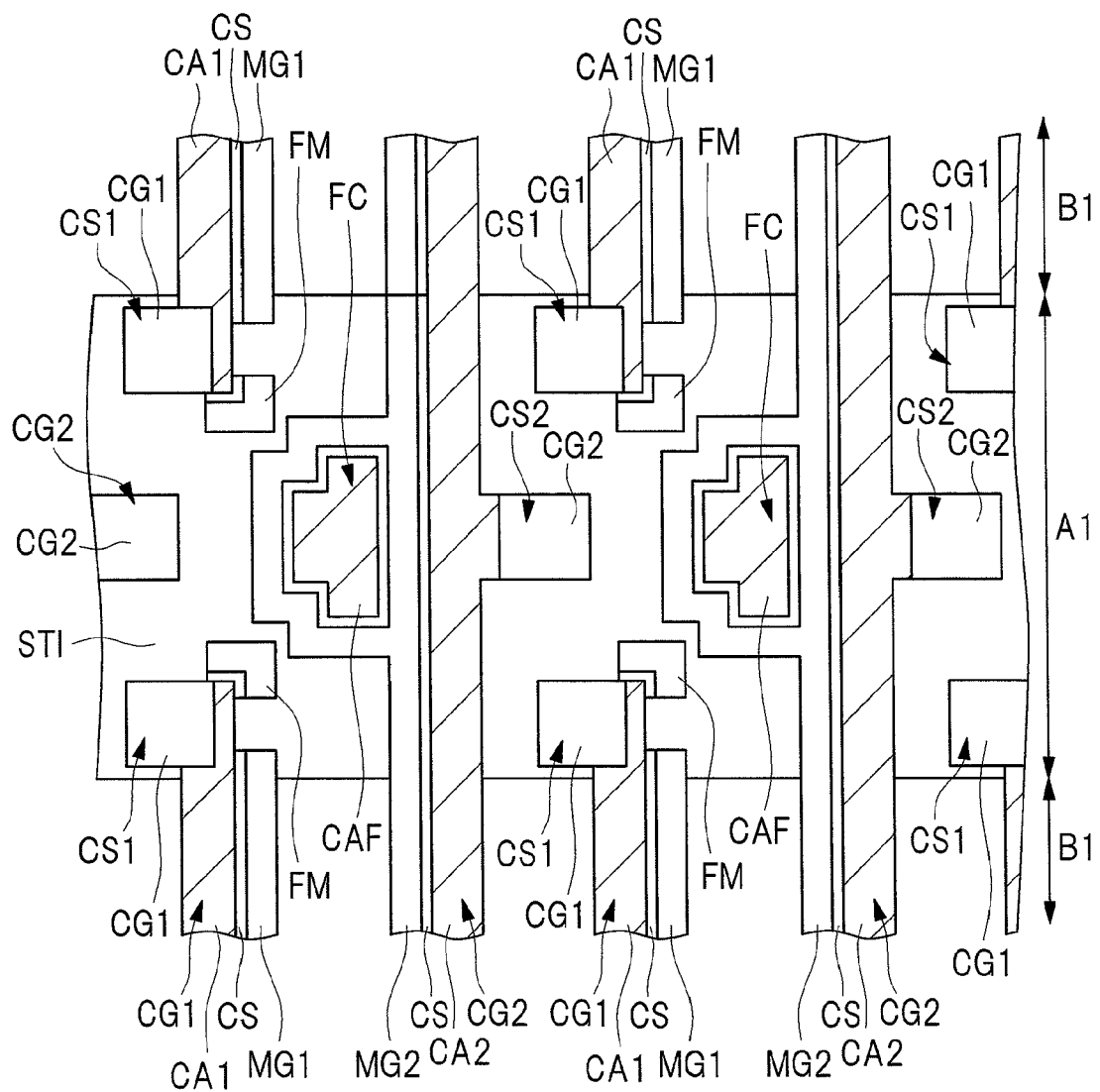
FIG. 38 is a plan view of a principal part illustrating the method of manufacturing the semiconductor device, continued from FIG. 37.

Moreover, hereinafter, as a modified example of the present embodiment, a method of partially removing the sidewall S2 (see FIG. 15) by using not the isotropic etching but the anisotropic etching process in the process of forming the memory gate electrodes MG1 and MG2 explained by using FIGS. 15 to 19 will be explained by using FIG. 37 and FIG. 38. FIG. 37 and FIG. 38 correspond to FIG. 17 and FIG. 18, respectively. That is, FIG. 37 and FIG. 38 are plan views of a principal part illustrating a semiconductor device during manufacturing processes in the modified example.

The modified example is different from the method of manufacturing the semiconductor device explained by using FIGS. 6 to 32 in the shape of the resist pattern illustrated in FIG. 17 and the shape of the memory gate electrode processed by the subsequent etching process. In this case, first, the same processes as those explained by using FIGS. 6 to 16 are performed.

Next, as illustrated in FIG. 37, a resist pattern RP8 is formed. As similar to the resist pattern RP3 (see FIG. 17), the resist pattern RP8 is a film used for exposing the sidewalls S2 adjacent to the first side wall of the selection gate electrode CG1, the third side wall of the selection gate electrode CG2, the side wall of the shunt portion CS1 and the side wall of the CS2. In this case, the resist pattern RP8 also partially exposes the sidewall S2 on the second side wall side of the selection gate electrode CG1.

In the later process, the sidewall S2 exposed from the resist pattern RP8 is removed by using the resist pattern RP8 as a mask. However, in the later process of removing the sidewall S2, the sidewall S2 is processed by using the anisotropic etching process as different from the method explained by using FIG. 18 and FIG. 19.

In other words, by forming the resist pattern RP8 as described above, and then, removing the sidewall S2 exposed from the resist pattern RP8 by the anisotropic etching process using the resist pattern RP8 as the mask as illustrated in FIG. 38, the memory gate electrodes MG1, MG2 and FM are formed, and then, the resist pattern RP8 is removed. Since the anisotropic etching is used, the sidewalls S2 covered with the resist pattern RP8 (see FIG. 37) are not removed but remains in this process, and they are the memory gate electrode MG1, MG2 and FM.

Since the sidewall S2 in the region adjacent to the shunt portion CS1 is removed in order to avoid the short circuit between the memory gate electrode and the selection gate electrode CG1 in the process explained by using FIG. 37, it seems that the sidewall S2 in this region is required to be entirely exposed from the resist pattern RP8. However, it is not always required to entirely expose the sidewall S2 adjacent to the shunt portion CS1. That is, as illustrated in FIG. 37, even when the etching process explained by using FIG. 38 is performed in a state that the sidewall S2 adjacent to the shunt portion CS1 is covered with the resist pattern RP8, it is only required that the memory gate electrode FM (see FIG. 38) made of the sidewall S2 remaining through this etching process is in an electrically floating state.

In the modified example, in order to form the memory gate electrode FM in the floating state, as illustrated in FIG. 37, the sidewall S2 along the second side wall between the sidewall S2 adjacent to the shunt portion CS1 and the sidewall S2 covered with the resist pattern RP8 in the active region B1 is partially exposed from the resist pattern RP8. By removing the sidewall S2 exposed from the resist pattern RP8 having such a shape by the anisotropic etching, the sidewall S2 can be separated.

That is, since the sidewall S2 in the region adjacent to the second side wall in the power supply region A1 corresponding to the inactive region is exposed from the resist pattern RP8 illustrated in FIG. 37, the sidewall S2 in the region exposed from the resist pattern RP8 is removed by the anisotropic etching explained by using FIG. 38. For this reason, the memory gate electrode FM made of the sidewalls S2 separated from each other so as to sandwich the region exposed from the resist pattern RP8 in the first direction is the pattern in the floating state in the power supply region A1, and therefore, there is no problem even when the short circuit with the shunt portion CS1 occurs.

It is important that the memory gate electrodes FM separated from each other as described above are not formed in the active region B1. For this reason, in the region where the sidewall S2 is exposed by the resist pattern RP8, it is always required in the power supply region A1 to expose the sidewall S2 adjacent to the second side wall overlapped with the side wall of the cap insulating film CA1 in a plan view. Moreover, in order to completely separate the sidewall S2, it is required to entirely expose the sidewall S2 from the resist pattern RP8 in a direction orthogonal to the side wall adjacent to the sidewall S2, that is, the second side wall, that is, expose the sidewall S2 in the second direction from one of the end portions thereof to the other end portion.

By performing the anisotropic etching process by using the above-explained resist pattern as a mask, as illustrated in FIG. 38, the memory gate electrode MG1 that is formed in the active region B1 and is made of the sidewall S2 along the second side wall of the selection gate electrode CG1 can be separated from the memory gate electrode FM that is formed of the sidewall S2 adjacent to the shunt portion CS1. Since the memory gate electrode FM is in the electrically floating state, there is no problem even when the memory gate electrode FM conducts to the shunt portion CS1.

Second Embodiment

The above-described first embodiment has explained the structure for preventing the short circuit between the selection gate electrode and the memory gate electrode by extending the pattern of the cap insulating film so as to be longer than that of the comparative example illustrated in FIG. 62 and FIG. 63. The present embodiment will explain a technique of preventing the short circuit between the selection gate electrode and the memory gate electrode by forming the memory gate electrode so as to further recede while forming the shape of the cap insulating film as the same as that of the comparative example illustrated in FIG. 62 and FIG. 63.

Hereinafter, by using FIGS. 39 to 48, a method of manufacturing a semiconductor device according to the present embodiment will be explained. FIG. 39, FIG. 40, FIG. 42, FIG. 44, FIG. 45 and FIG. 47 are plan views of a principal part of the semiconductor device of the present embodiment during the manufacturing processes. FIG. 41, FIG. 43, FIG. 46 and FIG. 48 are cross-sectional views of a principal part of the semiconductor device of the present embodiment during the manufacturing processes.

The processes to be explained by using FIGS. 39 to 48 correspond to the processes explained by using FIGS. 12 to 19 and FIGS. 31 and 32, respectively. Therefore, detailed explanations of these processes will be sometimes omitted. The procedure of the manufacturing processes of each semiconductor element or others is common in each embodiment while the features of the above-described first embodiment and the present embodiment and the main difference therebetween lie in the shape of each pattern in a plan view, the etching condition upon processing the memory gate electrode, and others. Therefore, detailed explanations of the processes to be explained by using the cross-sectional views will be omitted.

Figure 39:
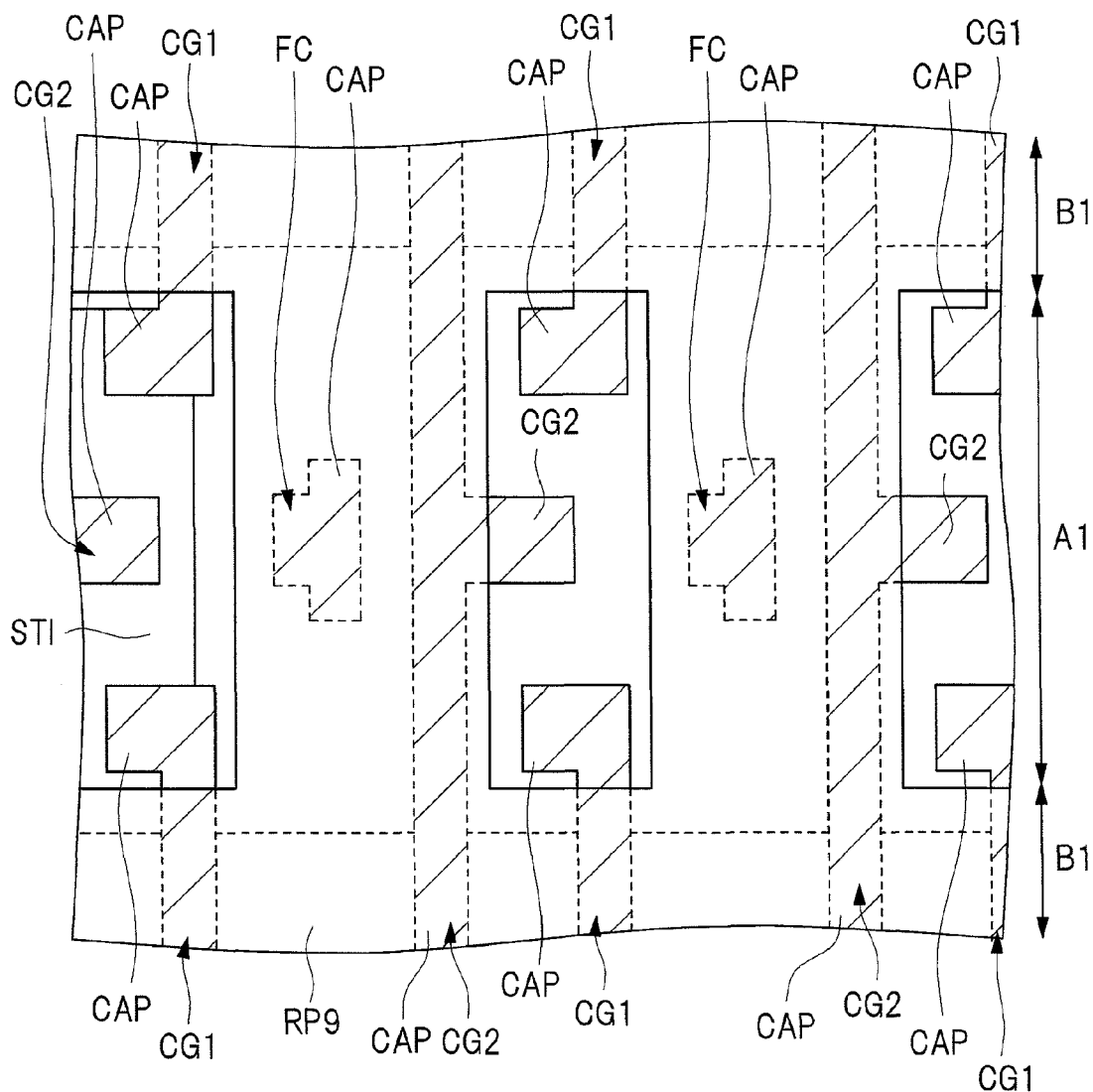
FIG. 39 is a plan view of a principal part illustrating a method of manufacturing a semiconductor device according to a second embodiment of the present invention.

First, the same processes as those explained by using FIGS. 6 to 11 are performed. Next, as illustrated in FIG. 39, a resist pattern RP9 is formed on the semiconductor substrate. As similar to the resist pattern RP1 illustrated in FIG. 12, from the resist pattern RP9, the region to be the shunt portion, that is, the insulating film CAP formed on the pattern on the end portion of the selection gate electrode CG1 in the first direction and the pattern protruded from the third side wall of the selection gate electrode CG2 in the power supply region A1, is exposed.

Although the above-described structure is the same as that of the resist pattern RP1, the resist pattern RP9 is different from that of the above-described first embodiment in that the entire upper surface of the insulating film CAP on the end portion of the selection gate electrode CG1 in the first direction is exposed. In other words, the entire upper surface of the end portion of the insulating film CAP in the first direction from one end thereof to the other end in the second direction is exposed from the resist pattern RP9.

That is, on the entire upper surface of the end portion of the insulating film CAP in the first direction from the region adjacent to the first side wall side of the selection gate electrode CG1 to the region adjacent to the second side wall side is exposed from the resist pattern RP9. This resist pattern RP9 has the same pattern as the resist pattern used for forming the cap insulating film CAE illustrated in FIG. 62 and FIG. 63 as the comparative example.

Note that the layout illustrated in a plan view of FIG. 39 has a larger distance from the region to be the shunt portion of the selection gate electrode CG1 to the active region B1 than that of the layout illustrated in FIG. 12.

Figure 40:
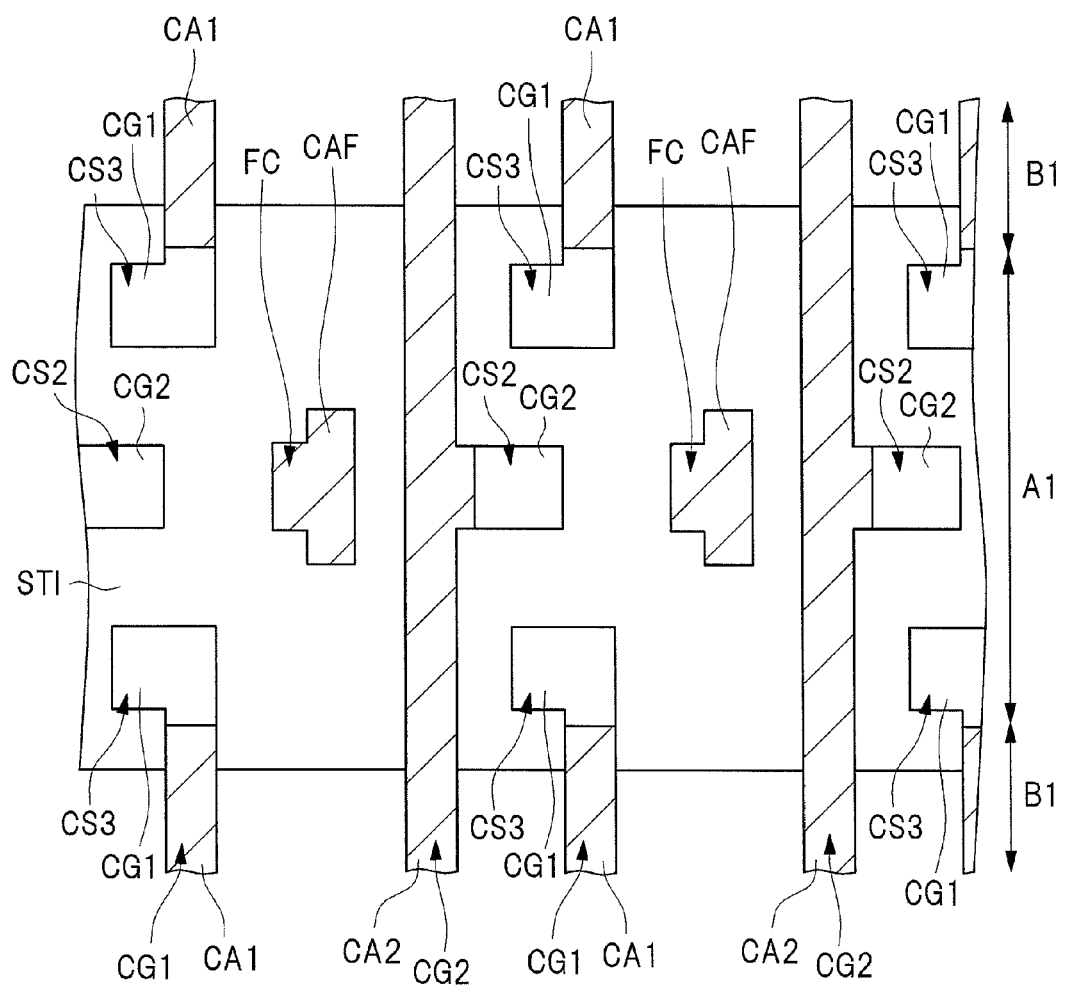
FIG. 40 is a plan view of a principal part illustrating the method of manufacturing the semiconductor device, continued from FIG. 39.
Figure 41:
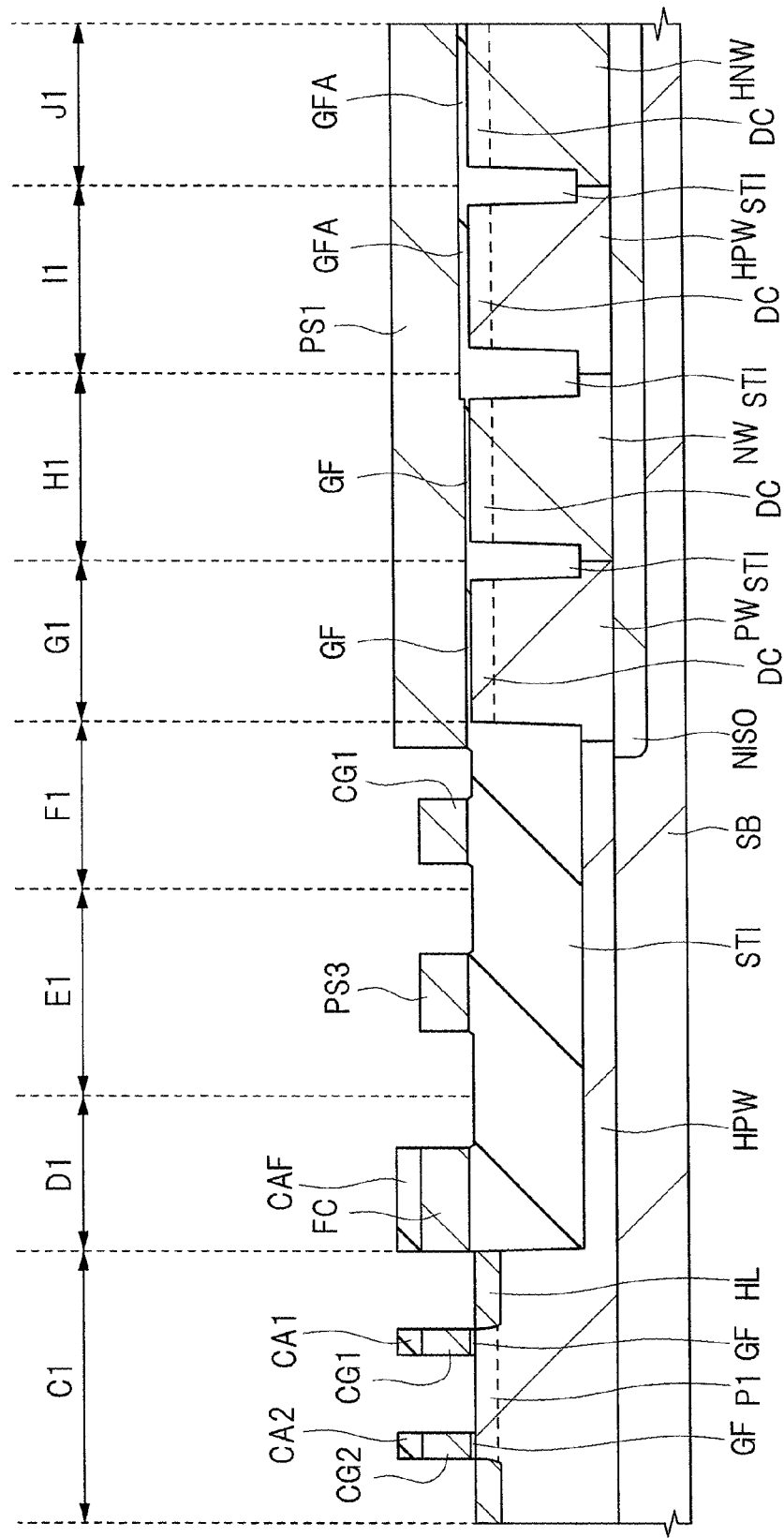
FIG. 41 is a cross-sectional view of a principal part illustrating the method of manufacturing the semiconductor device, continued from FIG. 39.

Next, as illustrated in FIG. 40 and FIG. 41, in a part of the shunt region in the power supply region F1 and the insulating films CAP in the capacitive element region E1 and the peripheral circuit region are removed by an etching process using the resist pattern RP9 (see FIG. 39) as a mask. Then, the resist pattern RP9 (see FIG. 39) is removed.

As different from the above-described first embodiment, the entire end portion of the selection gate electrode CG1 in FIG. 39 is exposed from the resist pattern RP9, and therefore, a shunt portion CS3 exposed from the cap insulating film CA1 is formed on the end portion of the selection gate electrode CG1 in the first direction as illustrated in FIG. 40 by removing the insulating film CAP in the region exposed from the resist pattern RP9. The shunt portion CS3 is a part of the selection gate electrode CG1 exposed from the first side wall of the cap insulating film CA1 along the second side wall at the end portion of the selection gate electrode CG1 in the first direction.

The pattern of the shunt portion CS3 of the selection gate electrode CG1 illustrated in FIG. 40 has the same shape as that of the shunt portion CSE illustrated in FIG. 62 and FIG. 63 as the comparative example. The structure illustrated in FIG. 41 is different from the structure illustrated in FIG. 14 of the above-described first embodiment in that no cap insulating film is formed right above the selection gate electrode CG1 in the power supply region F1.

Figure 42:
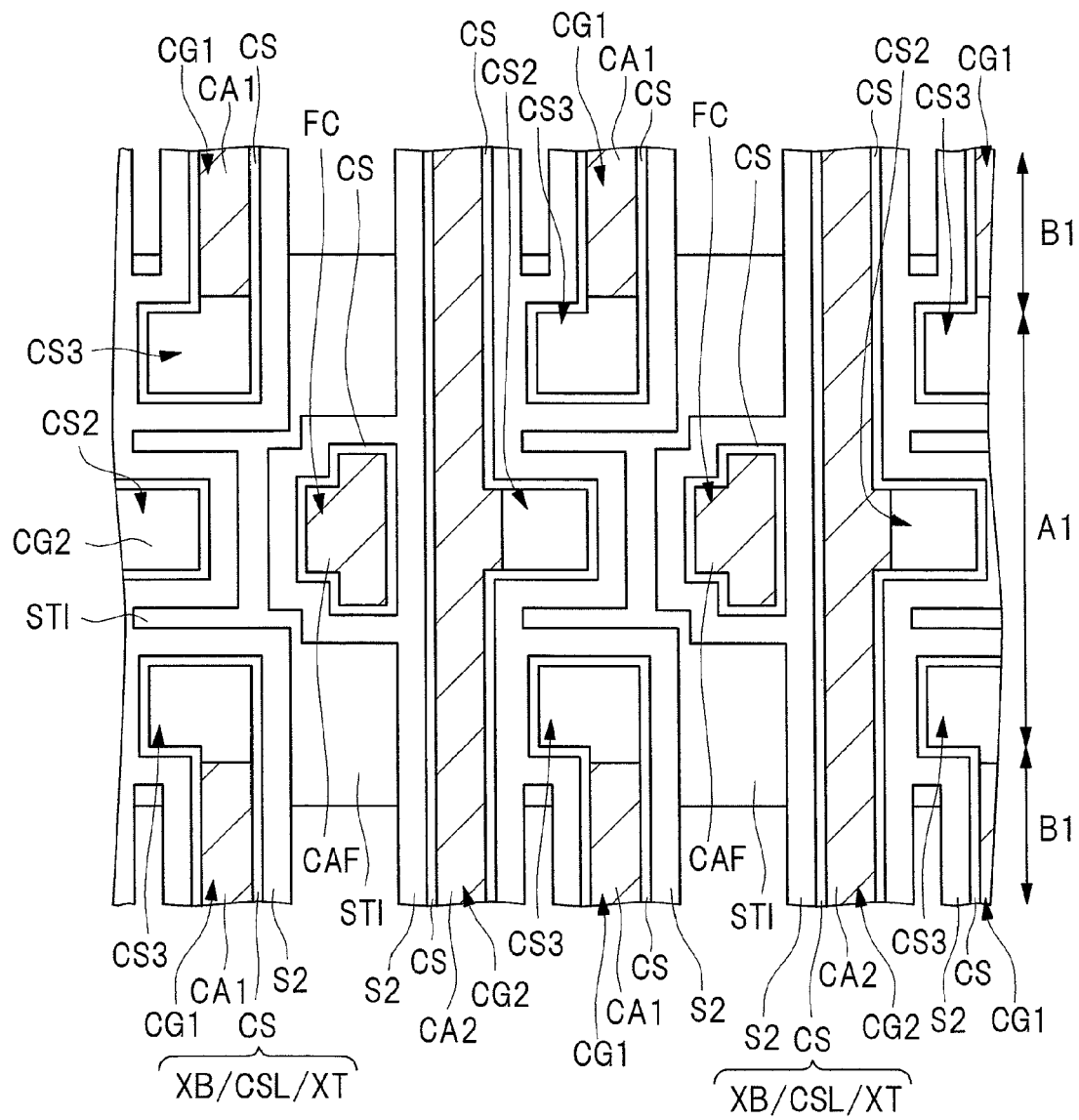
FIG. 42 is a plan view of a principal part illustrating the method of manufacturing the semiconductor device, continued from FIG. 40.
Figure 43:
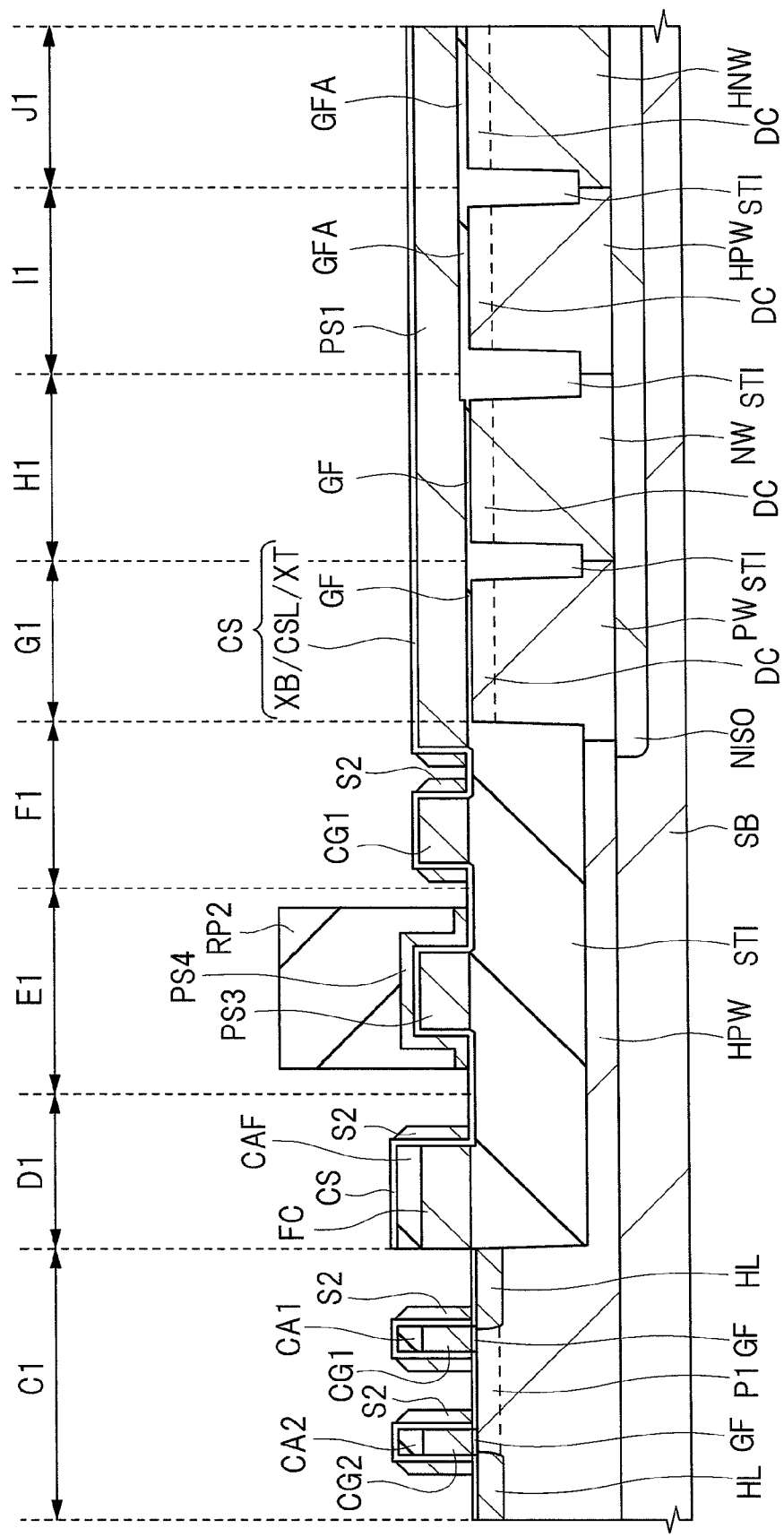
FIG. 43 is a cross-sectional view of a principal part illustrating the method of manufacturing the semiconductor device, continued from FIG. 40.

Next, as illustrated in FIG. 42 and FIG. 43, the ONO film CS and the sidewall S2 are formed on the semiconductor substrate by carrying out the same processes as those explained by using FIG. 15 and FIG. 16. The structure illustrated in FIG. 42 is different from the structure illustrated in FIG. 15 in that the end portion of the cap insulating film CA1 in the first direction is not extended to the end portion of the selection gate electrode CG1 in the same direction so that the shunt portion CS3 is wider in the second direction than the shunt portion CS1 (see FIG. 15). In this case, although not illustrated in the drawing, the ONO film CS and the sidewall S2 are also formed in a region right above the shunt portion CS3 of the selection gate electrode CG1, which is adjacent to the side wall of the cap insulating film CA1.

As described above, a part of the cap insulating film CA1 is not extended to a region adjacent to the shunt portion CS3 in the second direction as different from the structure of the above-described first embodiment. In other words, the border line between the shunt portion CS3 and the cap insulating film CA1 in a plan view is a line in parallel with the second direction.

Since no cap insulating film is formed on the selection gate electrode CG1 of the power supply region F1 illustrated in FIG. 43, the ONO film CS and the sidewall S2 are formed only on both side walls of the selection gate electrode CG1 in the cross-sectional surface of the power supply region F1.

Figure 44:
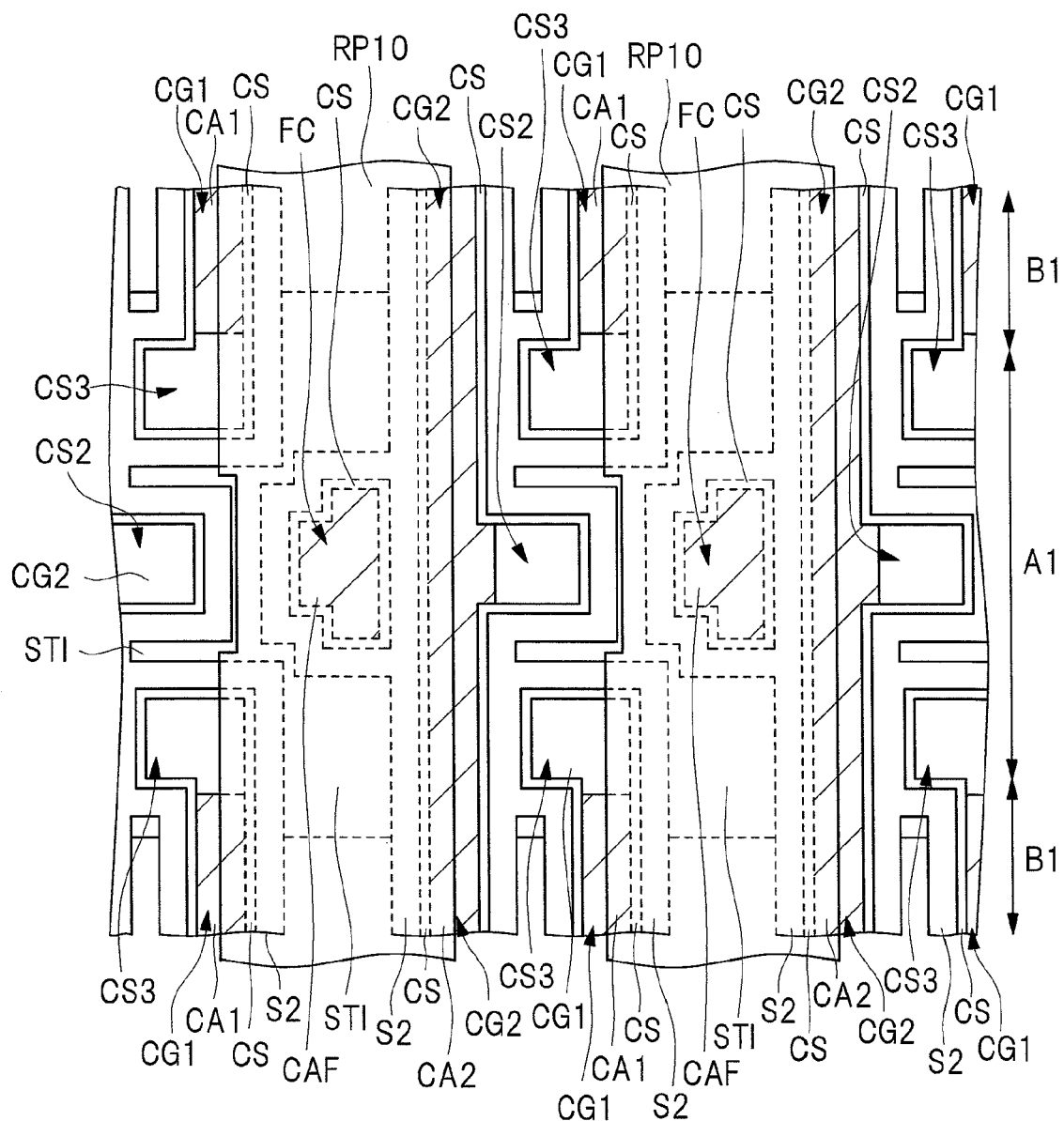
FIG. 44 is a plan view of a principal part illustrating the method of manufacturing the semiconductor device, continued from FIG. 42.

Next, as illustrated in FIG. 44, a resist pattern RP10 is formed on the semiconductor substrate. The resist pattern RP10 may be a pattern having the same shape as that of the resist pattern RP3 illustrated in FIG. 17. However, the resist pattern RP10 illustrated in FIG. 44 has a shape that covers the selection gate electrode CG1 more than being covered by the resist pattern RP3. Note that the resist pattern RP10 has the same shape as that of the resist pattern used for forming the memory gate electrode MGE illustrated in FIG. 62 and FIG. 63 as the comparative example.

Figure 45:
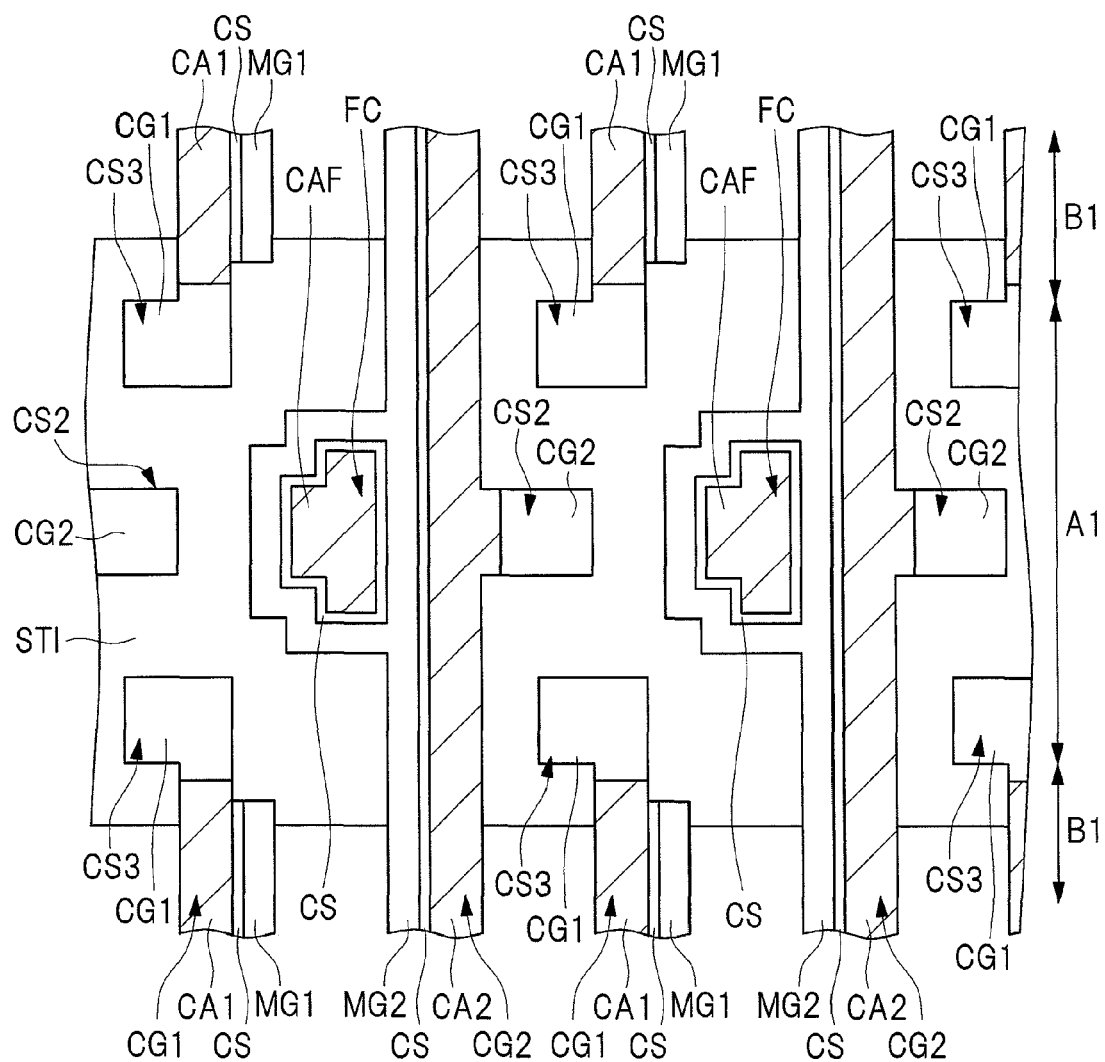
FIG. 45 is a plan view of a principal part illustrating the method of manufacturing the semiconductor device, continued from FIG. 44.
Figure 46:
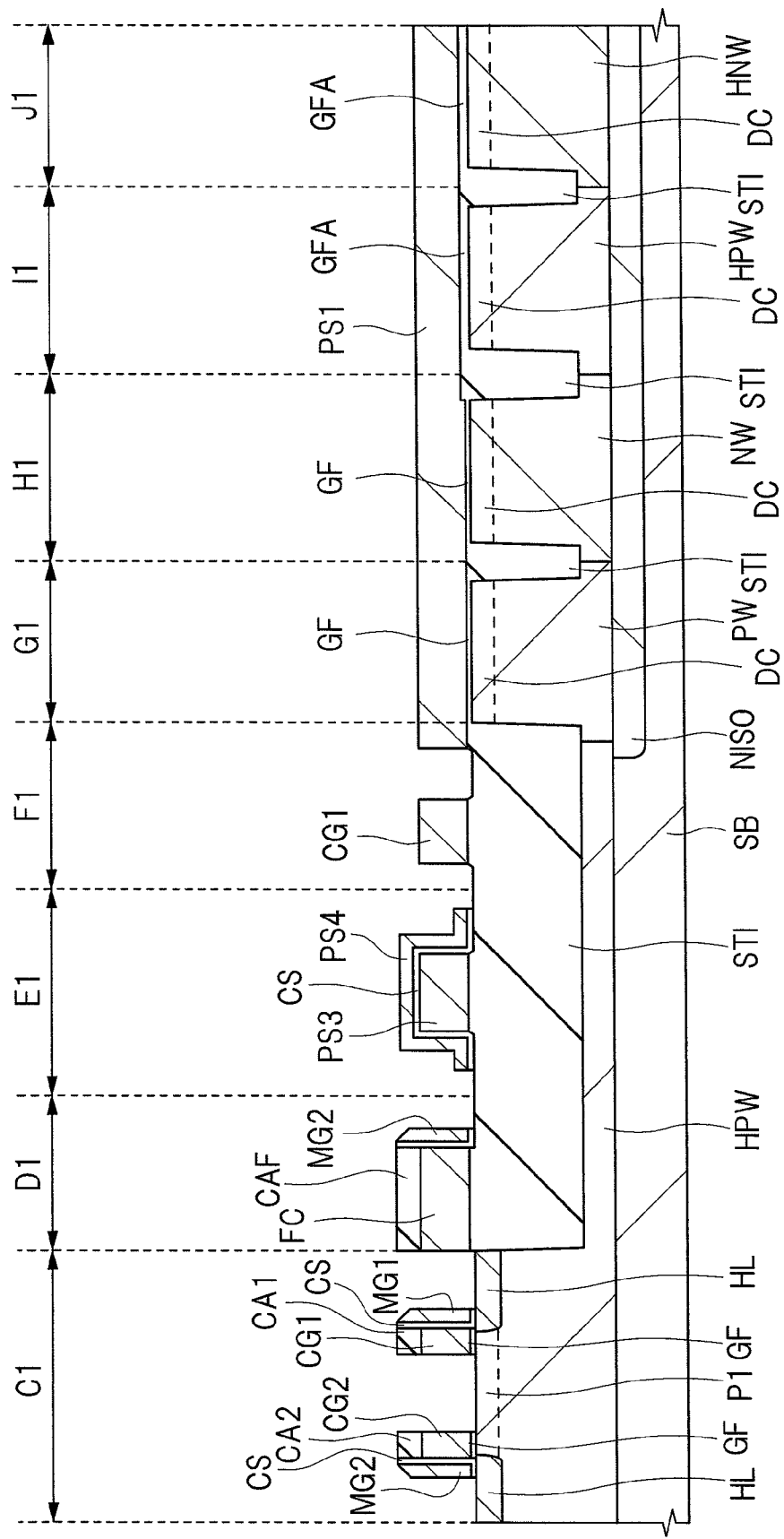
FIG. 46 is a cross-sectional view of a principal part illustrating the method of manufacturing the semiconductor device, continued from FIG. 44.

Next, as illustrated in FIG. 45 and FIG. 46, by using the resist pattern RP10 (see FIG. 44) as a mask, the sidewall S2 exposed from the corresponding mask is removed by an isotropic etching process such as wet etching. Then, the resist pattern RP10 is removed. Thus, in the memory region C1 illustrated in FIG. 46, the memory gate electrode MG1 is formed on one of two sides of a stacked film formed of the cap insulating film CA1 and the selection gate electrode CG1, that is, only on the second side wall thereof. Similarly, in the memory region C1, the memory gate electrode MG2 is formed on one of two sides of a stacked film formed of the cap insulating film CA2 and the selection gate electrode CG2, that is, only on the fourth side wall thereof. Moreover, in the power supply region D1, the memory gate electrode MG1 is formed on the side wall of a stacked film formed of the cap insulating film CAF and the selection gate electrode FC. At this time, in the power supply region F1, the entire sidewall S2 on the side wall of the selection gate electrode CG1 is removed.

Then, the ONO film CS that is not covered with the memory gate electrodes MG1, MG2 and the upper electrode PS4 is selectively etched and removed.

In this case, as illustrated in FIG. 45, the end portion of each of the memory gate electrode MG1 and the ONO film CS in the first direction recedes back to a region between the shunt portion CS3 and the active region B1 in the same direction by an isotropic etching process. That is, in the first direction, the cap insulating film CA1 is extended so as to be closer to the shunt portion CS3 side than the end portion of the memory gate electrode MG1.

In this manner, in the present embodiment, the memory gate electrode MG1 recedes so as to be closer to the active region B1 side than the structure illustrated in FIG. 17 in the above-described first embodiment. That is, the end portion of the memory gate electrode MG1 illustrated in FIG. 45 is terminated at a position farther apart from the shunt portion CS3 than the structure illustrated in FIG. 17. For this reason, in the present embodiment, the period of time for the isotropic etching for processing the sidewall S2 (see FIG. 44) is set to be longer than that of the above-described first embodiment, so that the etching amount for the sidewall S2 is increased.

As illustrated in FIG. 46, in this case, as different from FIG. 19 illustrated in the above-described first embodiment, the cap insulating film CA1 is not formed on the selection gate electrode CG1 in the power supply region F1, and neither the ONO film CS nor the memory gate electrode MG1 is formed on both side walls of the selection gate electrode CG1.

Figure 47:
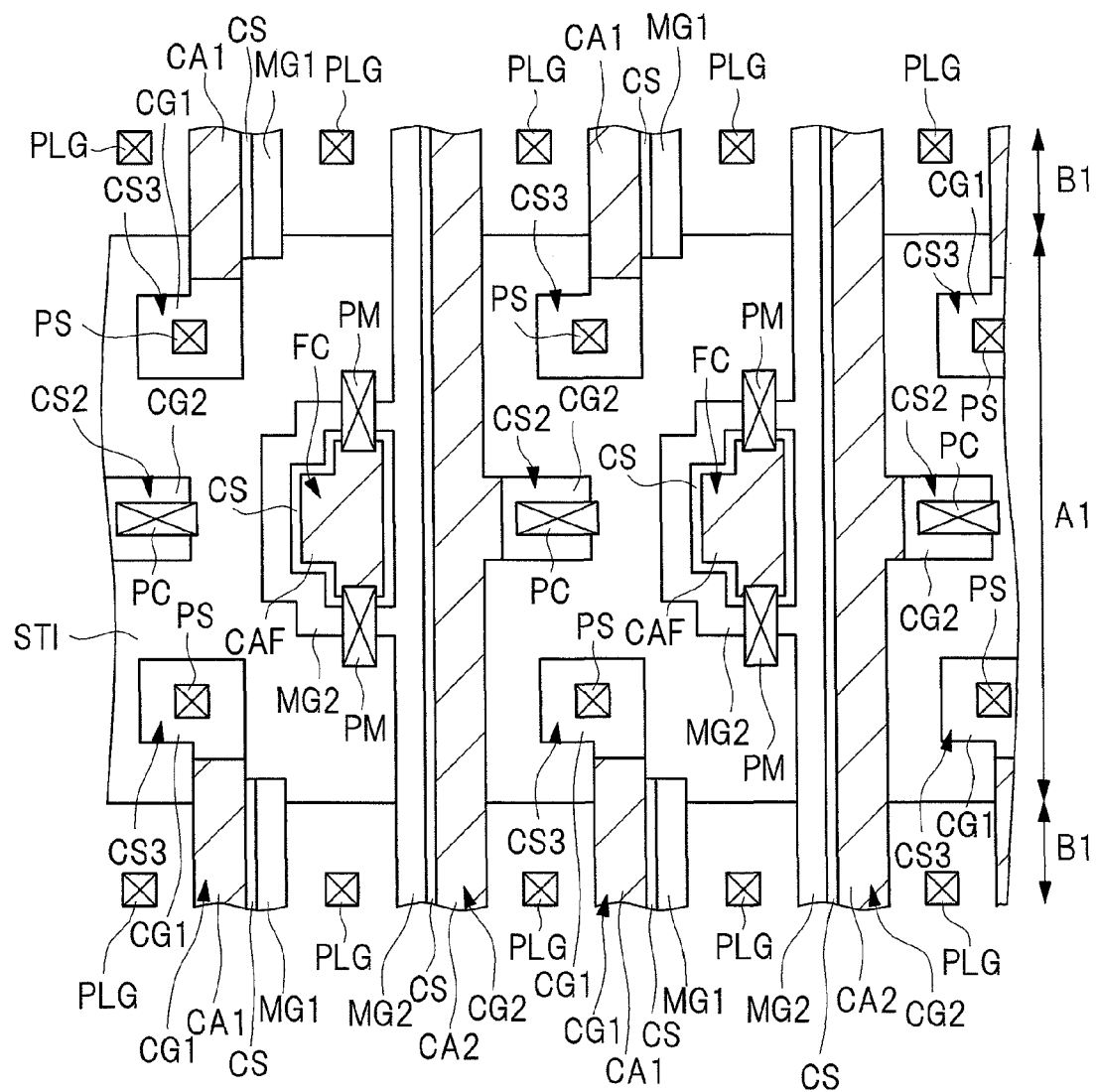
FIG. 47 is a plan view of a principal part illustrating the method of manufacturing the semiconductor device, continued from FIG. 45.
Figure 48:
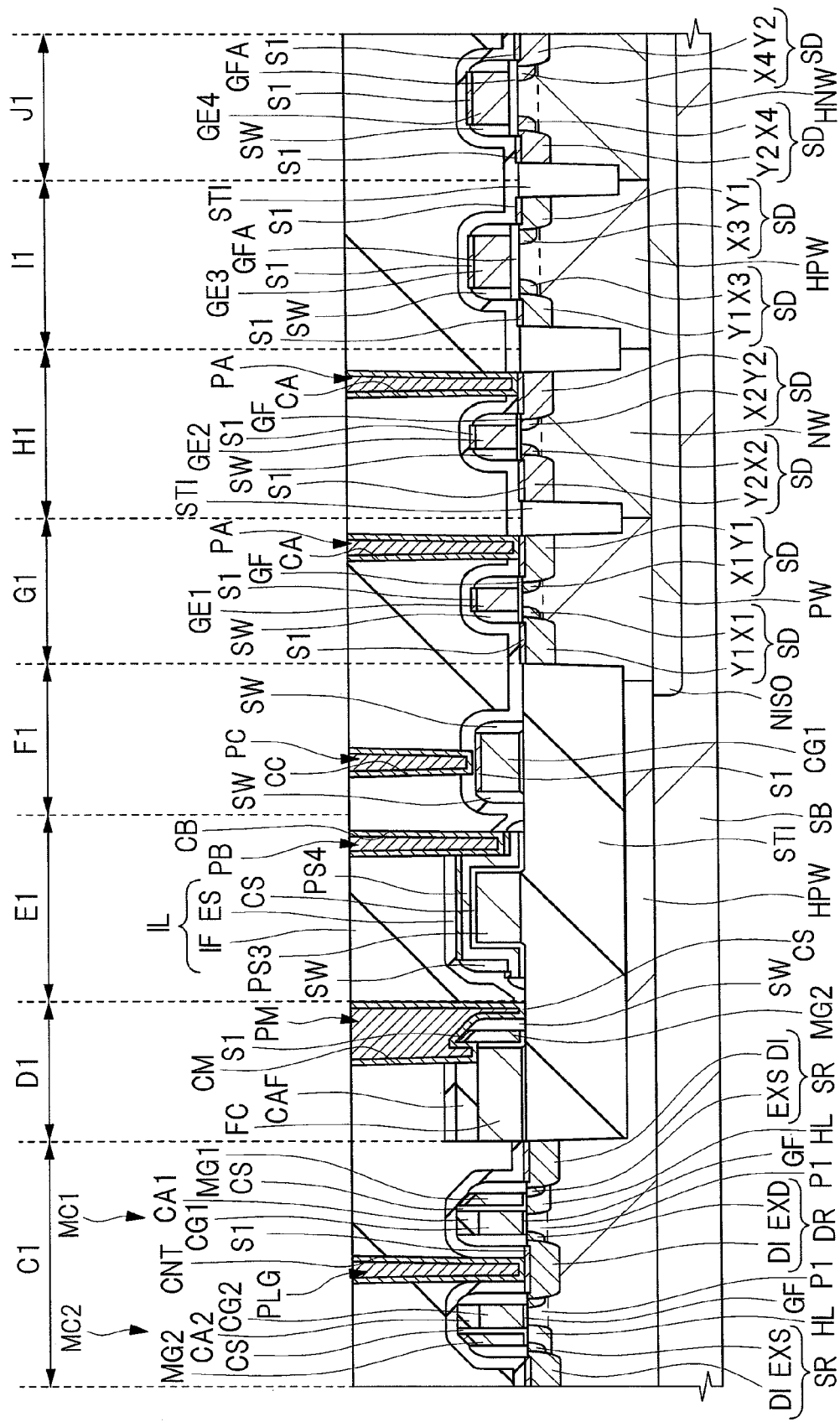
FIG. 48 is a cross-sectional view of a principal part illustrating the method of manufacturing the semiconductor device, continued from FIG. 45.

Next, the semiconductor elements are formed by performing the same processes as those explained by using FIGS. 20 to 30, and these semiconductor elements are covered with an interlayer insulating film, and then, plugs PA, PB, PS, PM and PLG, which is buried into contact holes CA, CB, CC, CM and CNT penetrating through the interlayer insulating film IL, respectively, are respectively formed as illustrated in FIG. 47 and FIG. 48. Moreover, a plug PC (see FIG. 47) that buries the contact hole for use in exposing the shunt portion CS2 is formed. In this case, as illustrated in FIG. 47, the plugs PC, PM and PS are formed in the power supply region A1 of the MONOS memory, and the plug PLG is formed in the active region B1 of the MONOS memory.

Then, by forming a first layer wire (illustration thereof is omitted) containing, for example, Cu (copper) or Al (aluminum) as a main component on the interlayer insulating film IL, the semiconductor device of the present embodiment is completed. By performing normal manufacturing processes of the semiconductor device after this process, a semiconductor device having a nonvolatile memory is manufactured.

In the present embodiment, as similar to the above-described first embodiment, by not forming the memory gate electrode MG1 so as to be adjacent to the shunt portion CS3 but terminating the memory gate electrode MG1 at a portion adjacent to the cap insulating film CA1 in a plan view, the short circuit between the memory gate electrode MG1 and the selection gate electrode CG1 can be prevented, so that the reliability of the semiconductor device can be improved.

The plug PS is a pillar-shaped conductor which corresponds to the plug PC illustrated in FIG. 31 in the above-described first embodiment and which is connected to the shunt portion CS3 in order to supply power to the selection gate electrode CG1. As illustrated by the power supply region F1 of FIG. 47 and FIG. 48, the plug PS is formed into a square shape or a round shape in a plan view as different from the plug PC (see FIG. 31 and FIG. 32), and does not extend in a direction along the main surface of the semiconductor substrate SB.

In the above-described first embodiment, since the cap insulating film CA1 is extended to a portion right above the farthermost end of the selection gate electrode CG1 in the first direction as illustrated in FIG. 31, the area of the shunt portion CS1 is reduced, and the margin for the positional misalignment of the plug formation is reduced. As a countermeasure for this, in the above-described first embodiment, the shape of the plug PC is formed into a shape that is extended in the second direction.

On the other hand, in the present embodiment, as illustrated in FIG. 47, since the cap insulating film CA1 is terminated on the active region B1 side so as to be closer than the shunt portion CS3 in the first direction, a larger area of the shunt portion CS3 than that of the shunt portion CS1 (see FIG. 31) of the above-described first embodiment can be ensured. Therefore, the margin for the misalignment of the plug formation is increased, so that the reduction in the contact area of the plug PS to the shunt portion CS3 due to the positional misalignment or the disconnection of the plug PS to the shunt portion CS3 can be prevented even when the shape of the plug PS in a plan view is made smaller than that of the above-described first embodiment. Therefore, the reduction in the reliability of the semiconductor device can be prevented.

Moreover, the reduction in the reliability of the semiconductor device due to the short circuit between the selection gate electrode CG1 and the memory gate electrode MG1 is prevented by preventing the memory gate electrode MG1 from being made adjacent to the shunt portion CS3 while preventing the area of the shunt portion CS3 from becoming smaller as described above, it is possible to prevent. In other words, since the area of the shunt portion CS3 is not narrowed so as to prevent the short circuits, it is not necessary to enlarge the area of the shunt portion CS3 in an attempt to expand the margin relative to the positional deviation caused upon connecting the plug PS to the shunt portion CS3. Therefore, it becomes possible to prevent the area of the semiconductor device from increasing.

Note that, in the present embodiment, the cap insulating film CA1 is terminated in a region closer to the active region E1 than the shunt portion CS3 in the first direction, and the memory gate electrode adjacent to the cap insulating film CA1 is terminated in a region further closer to the active region B1 than the terminal portion of the cap insulating film CA1. The position of the terminal portion of the memory gate electrode MG1 extending in the first direction is determined by the etching amount in the etching process explained by using FIG. 45 and FIG. 46. Although this etching amount is adjusted by the length of the period of time required for performing the etching or others, is difficult to be accurately controlled, and therefore, it is expected that there is a certain degree of variation.

In other words, upon terminating the memory gate electrode MG1 by the above-described etching process, if the end portion of the memory gate electrode MG1 is terminated on the shunt portion CS3 side so as to be closer than the end portion of the cap insulating film CA1 due to the variation in the above-described etching amount, the shunt portion CS3 that is not covered with the cap insulating film CA1 and the memory gate electrode MG1 are made adjacent to each other. For this reason, there is a risk of the short circuit between the shunt portion CS3 and the memory gate electrode MG1.

Moreover, upon terminating the memory gate electrode MG1 by the above-described etching process, if the memory gate electrode MG1 is terminated in the active region B1, a problem that the MONOS memory including the memory gate electrode MG1 is not normally operated raises.

Therefore, in the present embodiment, the memory gate electrode MG1 is easily terminated in a region between the end of the cap insulating film CA1 and the active region B1 in the same direction by extending the distance from the shunt portion CS3 in the first direction to active region B1 where the selection gate electrode CG1 having the shunt portion CS3 is formed so as to be longer than that of the above-described first embodiment. That is, the region where no problem is caused even if the end portion of the memory gate electrode MG1 is formed is expanded by expanding the margin for the variation in the etching amount, so that the short circuit between the shunt portion CS3 and the memory gate electrode MG1 or the occurrence of the operation failure of the MONOS memory can be prevented. Thus, the reliability of the semiconductor device can be improved.

Moreover, in this case, by increasing the etching amount in the etching process explained by using FIG. 45 and FIG. 46, the memory gate electrode MG1 is terminated in a region further apart from the shunt portion CS3 than that of the comparative example illustrated in FIG. 62 and FIG. 63, that is, a region where the selection gate electrode CG1 is covered with the cap insulating film CA1. In other words, since the short circuit between the selection gate electrode CG1 and the memory gate electrode MG1 can be prevented simply by increasing the etching amount, it is not required to newly prepare a mask in order to alter the patterns of the cap insulating film CA1 and the plugs in comparison with the above-described comparative example.

Similarly, it is not particularly required to prepare the resist pattern RP10 (see FIG. 44) to be used for forming the memory gate electrode MG1 by the etching process explained by using FIG. 45 and FIG. 46 in order to manufacture the semiconductor device of the present embodiment, and the resist pattern used for forming the memory gate electrode MGE (see FIG. 62) of the above-described comparative example can be utilized. As described above, since it is not required to newly design and prepare the mask, the manufacturing costs of the semiconductor device can be reduced.

Moreover, since the present embodiment has a feature of the increase in the etching amount, the sidewall made of the ONO film CS and the sidewall S2 that is formed on the side wall of the cap insulating film CA1 can be easily removed in the vicinity of the shunt portion CS3 right above the selection gate electrode CG1 as described in the comparative example in a stage in which the process explained by using FIG. 42 and FIG. 43 has been performed. In other words, since the etching amount in forming the memory gate electrode MG1 (see FIG. 45) is larger than that of the process of manufacturing the semiconductor device of the comparative example as explained by using FIG. 62 and FIG. 63, the short circuit caused by the fact that the memory gate electrode MG1 remain s right above the shunt portion CS3 (see FIG. 45) can be prevented.

Note that, also in the present embodiment, a pattern that protrudes toward the second side wall side of the selection gate electrode CG1 as illustrated in FIG. 36 as the modified example may be formed. When the pattern is applied to the present embodiment, it is considered that, for example, the protruding pattern is formed between the shunt portion CS3 and the active region B1 illustrated in FIG. 45, and the memory gate electrode MG1 extending along this protruding pattern including the selection gate electrode CG1 and the cap insulating film CA1 formed on the selection gate electrode CG1 is formed in the power supply region A1. With this structure, the margin for the variation in the etching amount in forming the memory gate electrode MG1 can be expanded.

Figure 49:
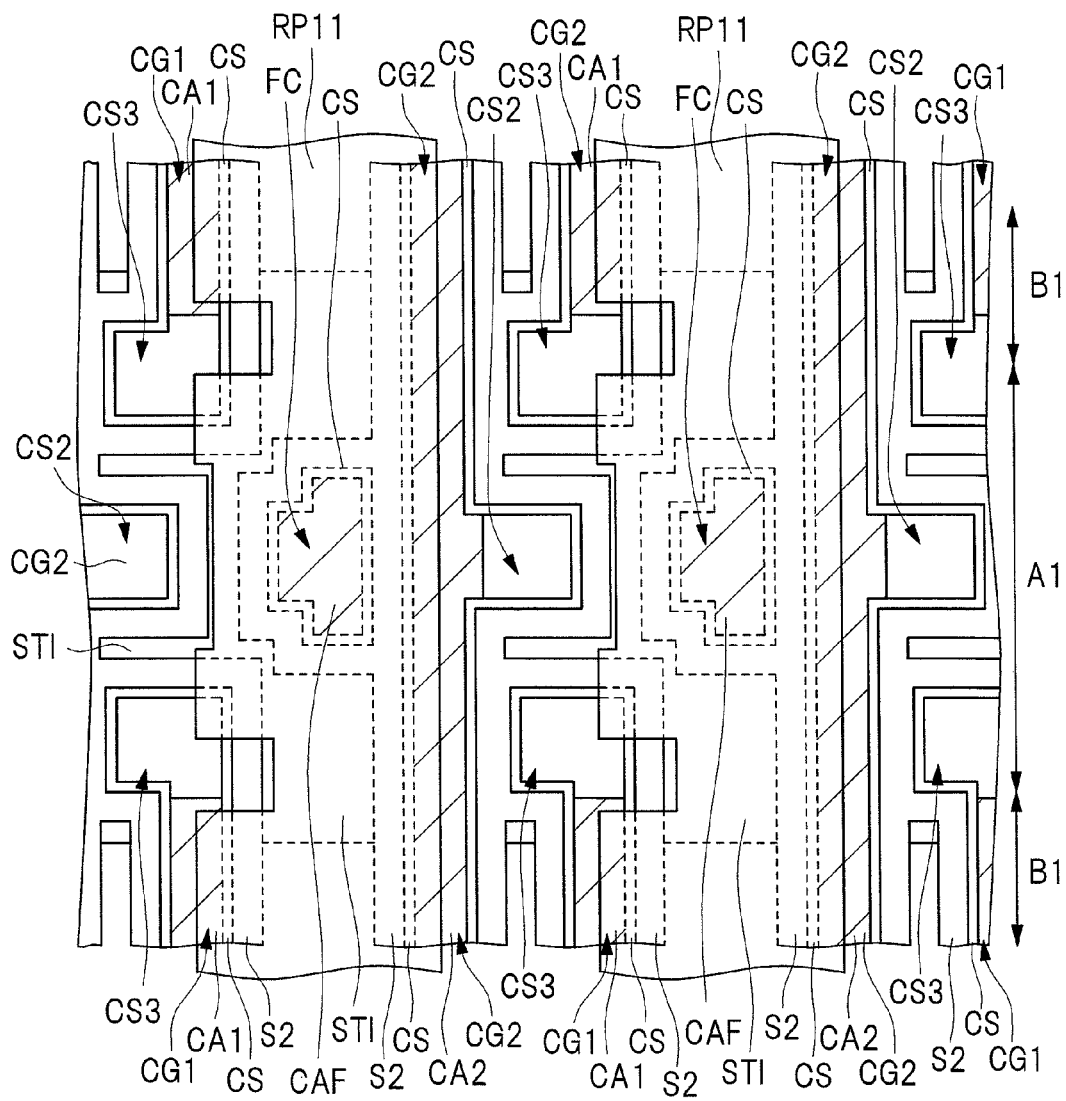
FIG. 49 is a plan view of a principal part illustrating a method of manufacturing a semiconductor device according to a modification example of the second embodiment of the present invention.
Figure 50:
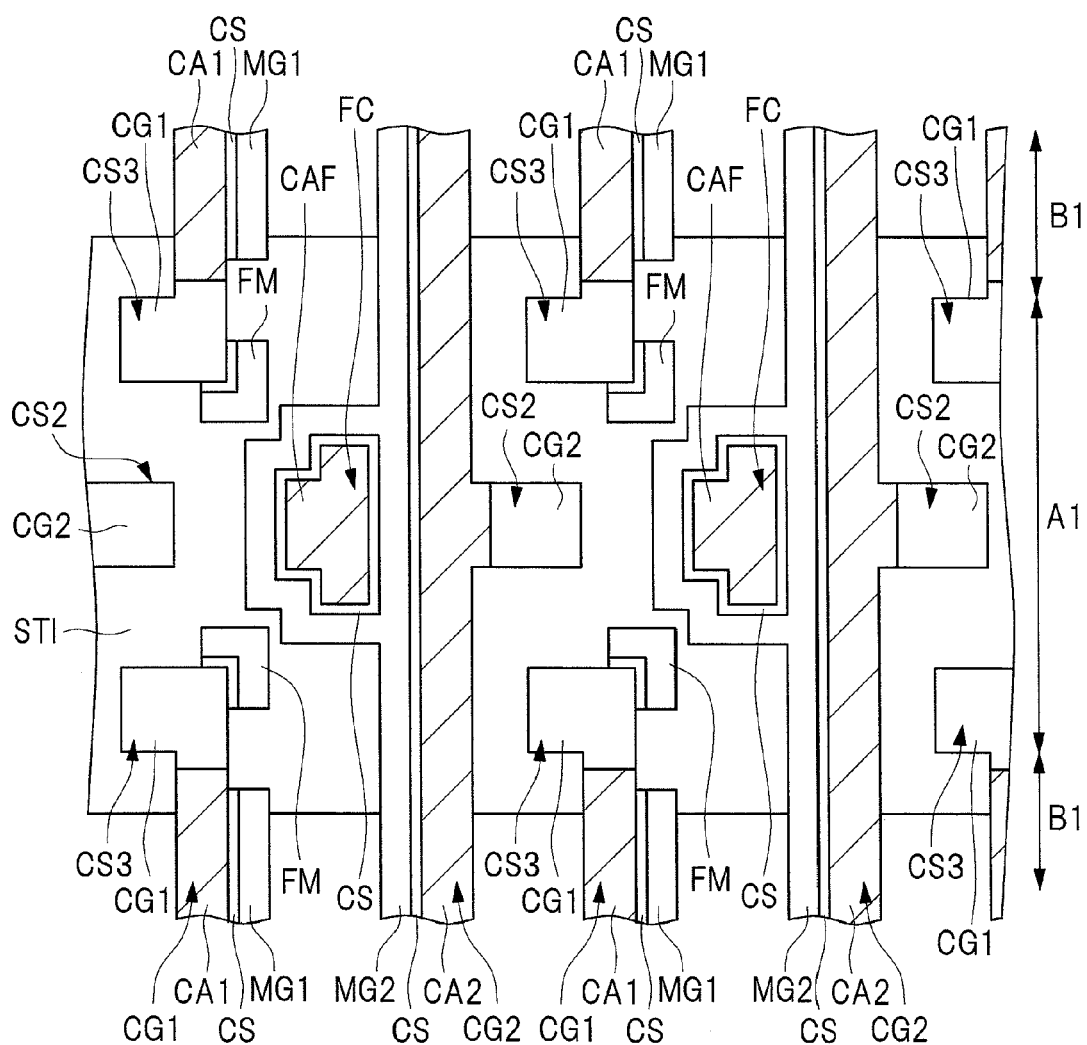
FIG. 50 is a plan view of a principal part illustrating the method of manufacturing the semiconductor device, continued from FIG. 49.

As a modified example of the present embodiment, a method of partially removing the sidewall S2 (see FIG. 42) by using not the isotropic etching process but the anisotropic etching process in the process of forming the memory gate electrodes MG1 and MG2 explained by using FIG. 42 and FIG. 46 will be explained by using FIG. 49 and FIG. 50. FIG. 49 and FIG. 50 correspond to FIG. 44 and FIG. 45, respectively. That is, FIG. 49 and FIG. 50 are plan views of a principal part illustrating a semiconductor device during the manufacturing processes according to the modified example.

The present modified example is different from the method of manufacturing the semiconductor device explained by using FIGS. 39 to 46 in the shape of the resist pattern illustrated in FIG. 44 and partially in the shape of the memory gate electrode to be processed by the subsequent etching process. First, the same processes as those explained by using FIGS. 6 to 11 and FIGS. 39 to 42 are performed.

Next, as illustrated in FIG. 49, a resist pattern RP11 is formed. As similar to the resist pattern RP10 (see FIG. 44), the resist pattern RP11 is a film from which the first side wall of the selection gate electrode CG1, the third side wall of the selection gate electrode CG2 and the sidewall S2 adjacent to the side wall of the shunt portion CS3 and the shunt portion CS2 are exposed. However, from the resist pattern RP11, the sidewall S2 on the second side wall side of the selection gate electrode CG1 is also partially exposed.

In the subsequent process, the sidewall S2 exposed from the resist pattern RP11 is removed by using the resist pattern RP11 as a mask. However, in the process of removing the sidewall S2 after this, the sidewall S2 is processed by using the anisotropic etching process.

That is, after forming the resist pattern RP11 as described above, as illustrated in FIG. 50, with the resist pattern RP11 being used as masks, the memory gate electrodes MG1, MG2 and FM are formed by removing the sidewall S2 exposed from the resist pattern RP11 by using the anisotropic etching process, and then, the resist pattern RP11 is removed. Since the anisotropic etching is used, the sidewall S2 covered with the resist pattern RP11 (see FIG. 49) is not removed but remains in this process so as to be the memory gate electrode MG1, MG2 or FM.

In the process explained by using FIG. 49, in order to avoid short circuit between the memory gate electrode and the selection gate electrode CG1, it seems that the sidewall S2 adjacent to the shunt portion CS3 has to be entirely exposed from the resist pattern RP11. However, it is not always required to entirely expose the sidewall S2 adjacent to the shunt portion CS3. This is because there is no problem as long as the memory gate electrode FM (see FIG. 50) which is formed of a part of the sidewall S2 remaining so as to be adjacent to the shunt portion CS3 through the etching process is kept in the electrically floating state.

In the present modified example, one portion of the sidewall S2 adjacent to the second side wall in the power supply region A1 is exposed from the resist pattern RP11, and the etching is performed by using the resist pattern RP11 as a mask, so that the memory gate electrode FM in the floating state is formed. In this case, it is important that no memory gate electrode FM is formed in the active region B1 and that the memory gate electrode MG1 that is separated from the memory gate electrode FM and formed in the active region B1 is terminated on the active region B1 side so as to be closer than the end portion of the cap insulating film CA1 in the first direction.

For this reason, from the region where the sidewall S2 is exposed from the resist pattern RP11, it is always required in the power supply region A1 to expose the sidewall S2 adjacent to the second side wall overlapped with the side wall of the cap insulating film CA1 in a plan view. Moreover, in order to completely separate the sidewall S2, I is required to entirely expose the sidewall S2 from the resist pattern RP11 in a direction orthogonal to the side wall adjacent to which the sidewall S2, that is, in a direction orthogonal to the second side wall, that is, in a portion from one of the end portions of the sidewall S2 toward the other end portion thereof in the second direction.

The anisotropic etching process is performed by using the resist pattern explained above as the mask, so that, as illustrated in FIG. 50, the memory gate electrode MG1 that is formed in the active region B1 and is made of the sidewall S2 formed along the second side wall of the selection gate electrode CG1 can be formed so as to be separated from the memory gate electrode FM made of the sidewall S2 adjacent to the shunt portion CS3. Since the memory gate electrode FM is kept in the electrically floating state, there is no problem even when the memory gate electrode FM is conducted to the shunt portion CS3.

Third Embodiment

The above-described embodiments 1 and 2 have explained the structure for preventing the short circuit between the selection gate electrode and the memory gate electrode in the case of the separation of the selection gate electrode in the first direction. The present embodiment will explain a technique of preventing the short circuit between the selection gate electrode and the memory gate electrode in a case of a pattern in which both of selection gate electrodes CG1 and CG2 that are alternately arranged in the second direction are not separated but extended in the first direction.

By using FIGS. 51 to 59, a method of manufacturing a semiconductor device according to the present embodiment will be explained below. FIGS. 51 to 56 and FIG. 58 are plan views of a principal part of the semiconductor device of the present embodiment in the manufacturing processes. FIG. 57 and FIG. 59 are cross-sectional views of the principal part of the semiconductor device of the present embodiment in the manufacturing processes.

Figure 51:
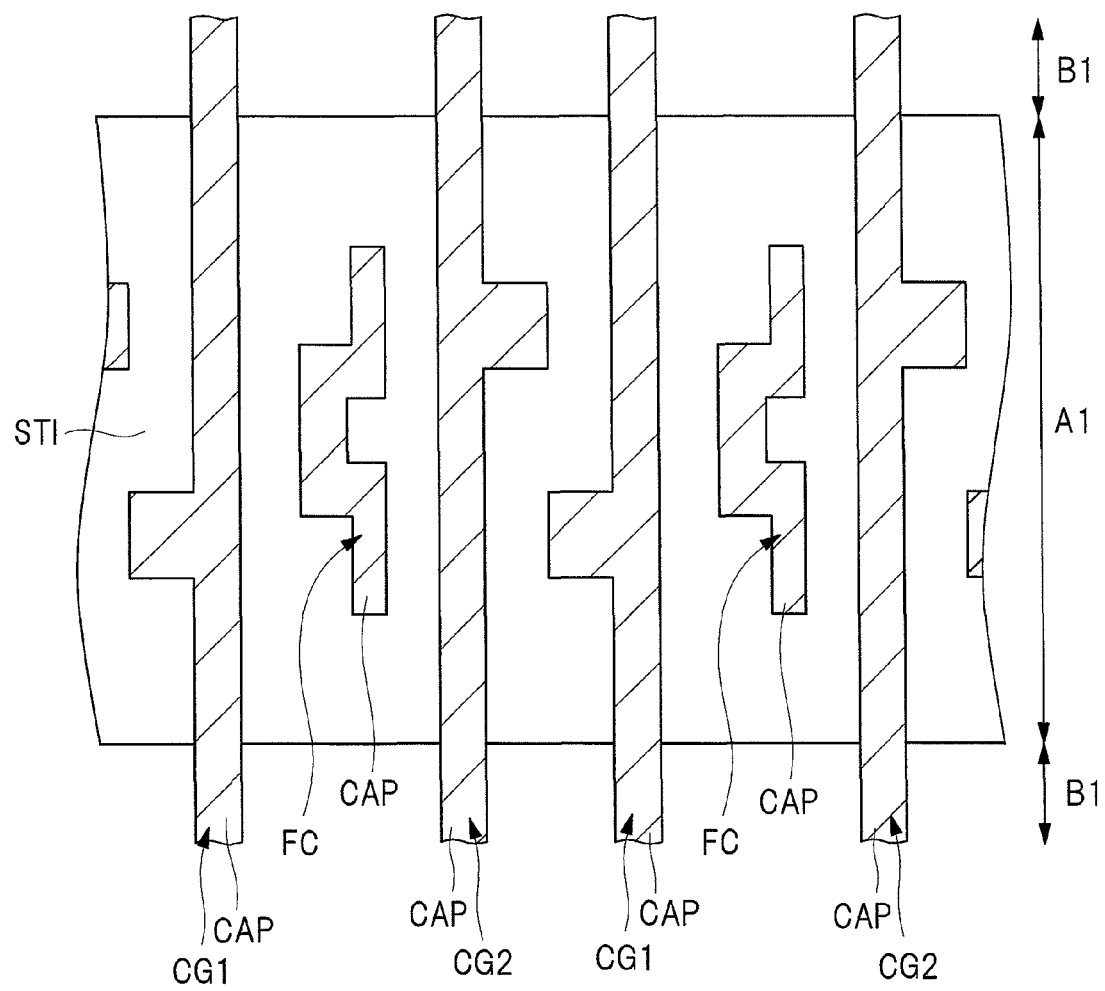
FIG. 51 is a plan view of a principal part illustrating a method of manufacturing a semiconductor device according to a third embodiment of the present invention.

FIG. 51 corresponds to processes explained by using FIG. 10 and FIG. 11. Processes to be explained by using FIGS. 52 to 57, FIG. 58 and FIG. 59 correspond to those processes explained by using FIG. 12, FIG. 13, FIG. 15, FIG. 17, FIG. 18, FIG. 19, FIG. 31 and FIG. 32, respectively. Features of the above-described first embodiment and the present embodiment and main differences therebetween lie in a shape of each pattern in a plan view or others, and the procedure of the manufacturing processes of each semiconductor element or others is common therebetween, and therefore, explanations of the processes by using cross-sectional views will be partially omitted. Moreover, detailed explanations of the formation processes of the semiconductor elements except for the MONOS memory will be omitted.

First, the same processes as those explained by using FIGS. 6 to 9 are performed. Next, as illustrated in FIG. 51, the insulating film CAP and the conductive film PS2 (see FIG. 9) are sequentially patterned by using a lithography technique and a dry etching technique, so that each of the selection gate electrodes CG1 and CG2 extending in the first direction is formed, and the selection gate electrode FC that is spaced apart from the selection gate electrodes CG1 and CG2 is formed. All of the selection gate electrodes CG1, CG2 and FC are films in the same layer made of the conductive film PS2 (see FIG. 9).

As illustrated in FIG. 51, on the semiconductor substrate (not illustrated), a stacked film including the selection gate electrode CG1 and the insulating film CAP covering the upper surface of the selection gate electrode CG1, a stacked film including the selection gate electrode CG2 and the insulating film CAP covering the upper surface of the selection gate electrode CG2, and the selection gate electrode FC and the insulating film CAP covering the selection gate electrode FC are formed. Since all of the upper surfaces of the respective selection gate electrodes CG1, CG2 and FC are covered with the insulating film CAP, FIG. 51 does not illustrate the selection gate electrodes CG1, CG2 and FC but illustrates the shape of the insulating films CAP formed thereon. The selection gate electrodes CG1, CG2 and FC and the insulating film CAP formed right above them have the same pattern in a plan view as each other.

The selection gate electrodes CG1 and CG2 has the pattern extending in the first direction, and a plurality of the selection gate electrodes CG1 and CG2 are alternately arranged in the second direction. In this case, the selection gate electrode CG1 extends in the first direction as similar to the selection gate electrode CG2, and is not separated in the power supply region A1. The same goes for the insulating film CAP on the selection gate electrode CG1. The selection gate electrode CG1 extending in the first direction has a first side wall extending in the first direction and a second side wall on the opposite side, and the selection gate electrode CG2 extending in the first direction has a third side wall extending in the first direction and a fourth side wall on the opposite side.

The third side wall of the selection gate electrode CG2 arranged on the first side wall side of the selection gate electrode CG1 is made face to face with the first side wall of the corresponding selection gate electrode CG1. Moreover, the fourth side wall of the selection gate electrode CG2 arranged on the second side wall side of the selection gate electrode CG1 is made face to face with the second side wall of the corresponding selection gate electrode CG1.

In this case, the selection gate electrode FC made of a conductive film in the same layer as those of the selection gate electrodes CG1 and CG2 is formed between the first side wall of the selection gate electrode CG1 and the fourth side wall of the selection gate electrode CG2 in a region adjacent to the fourth side wall side of the selection gate electrode CG2. The selection gate electrode FC is not connected to the selection gate electrodes CG1 and CG2, and is electrically insulated from the selection gate electrodes CG1 and CG2. As similar to the above-described first embodiment, the selection gate electrode FC is a floating pattern used for forming a power supply portion to the memory gate electrode to be formed along the selection gate electrode CG2.

The selection gate electrode CG2 partially has a pattern having such a shape as protruding from the third side wall of the selection gate electrode CG2 to the first side wall of the selection gate electrode CG1 in the second direction. The selection gate electrode CG1 also partially has a pattern having such a shape as protruding from the first side wall of the selection gate electrode CG1 to the third side wall of the selection gate electrode CG2 in the second direction.

Figure 52:
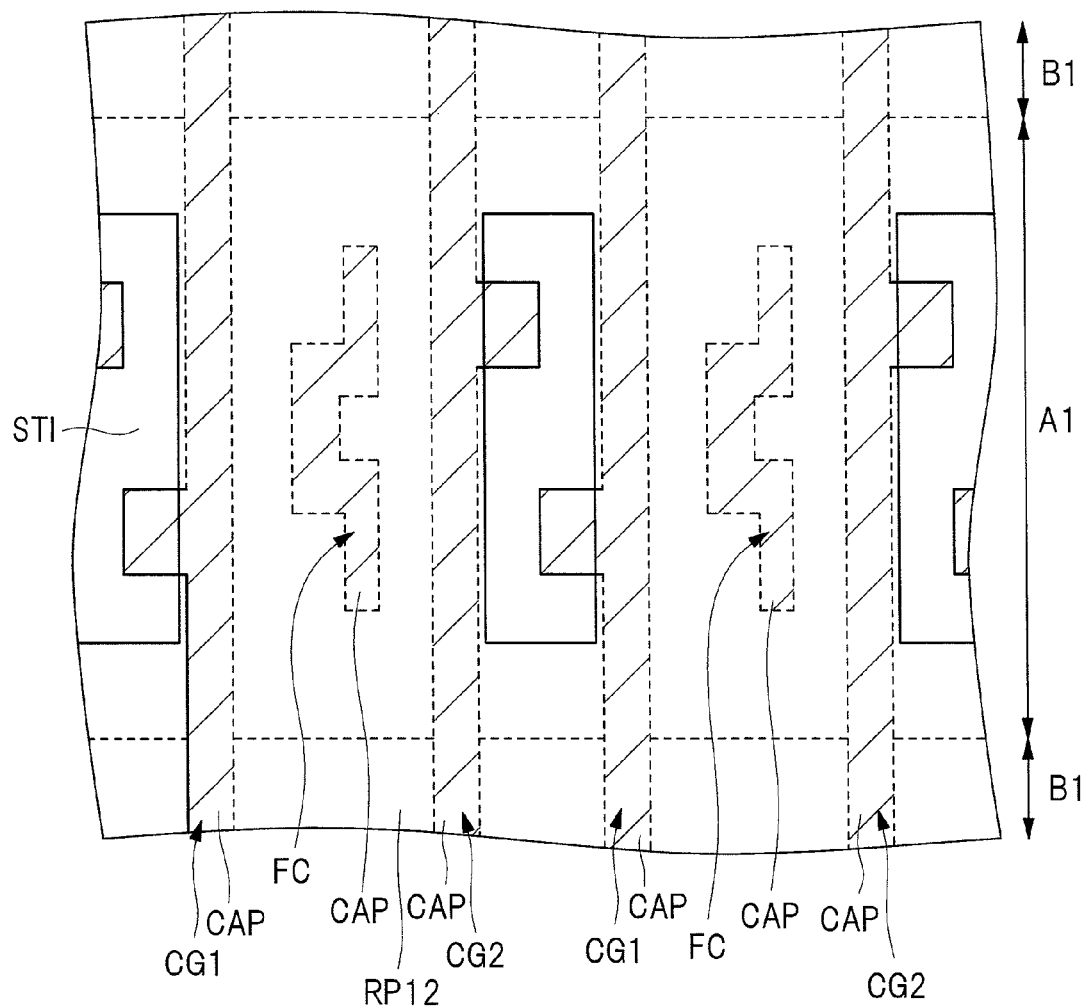
FIG. 52 is a plan view of a principal part illustrating the method of manufacturing the semiconductor device, continued from FIG. 51.

Next, as illustrated in FIG. 52, a resist pattern RP12 is formed on the semiconductor substrate. As similar to the resist pattern RP1 illustrated in FIG. 12, from the resist pattern RP12, regions to be the shunt portions, that is, insulating films CAP which are formed on the respective patterns protruding on the first side wall of the selection gate electrode CG1 and the third side wall of the selection gate electrode CG2, are exposed. Moreover, from the resist pattern RP12, the insulating film CAP extending in the first direction, the insulating film CAP on the selection gate electrode FC and the active region E1 in the memory region are not exposed.

Figure 53:
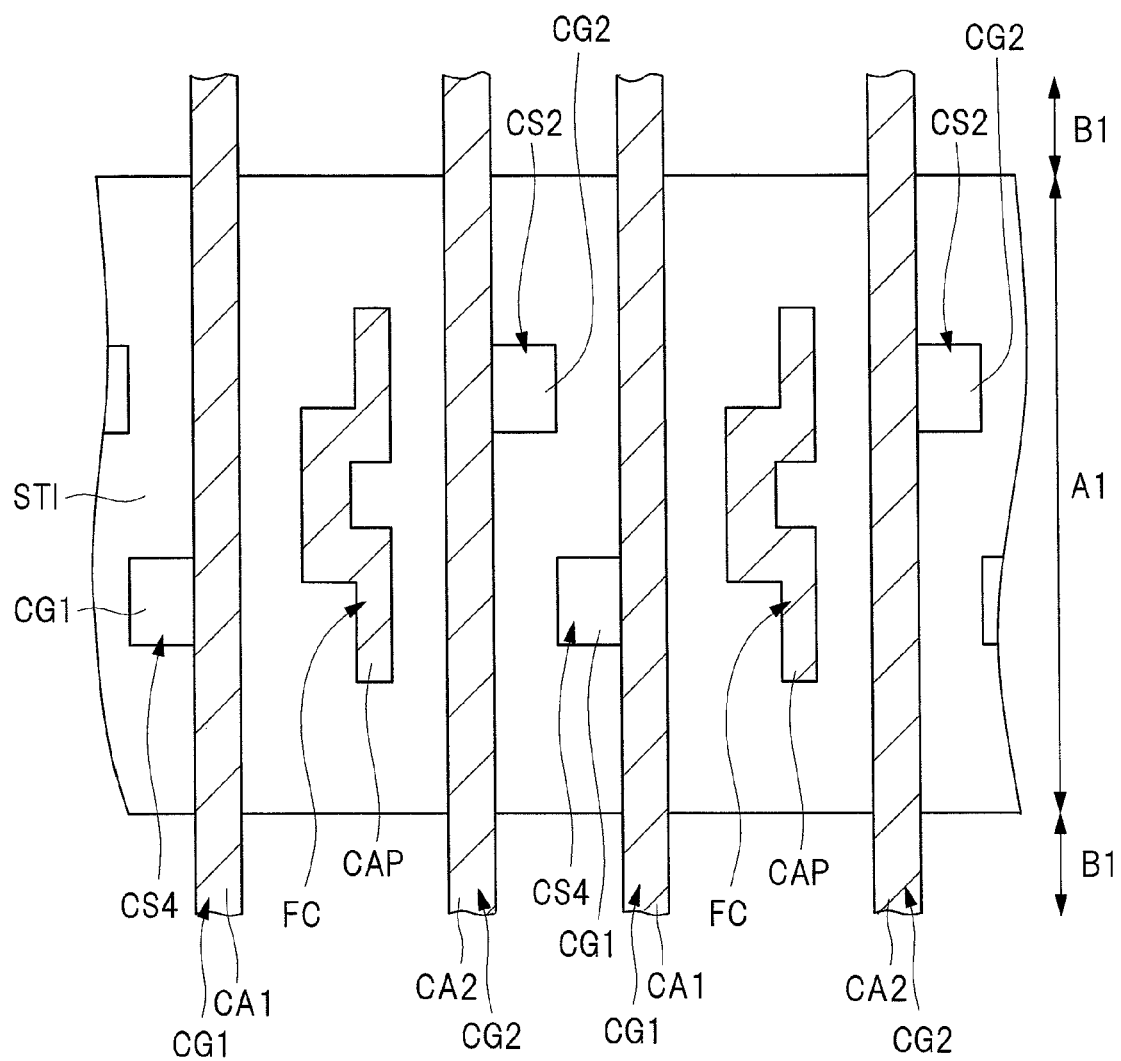
FIG. 53 is a plan view of a principal part illustrating the method of manufacturing the semiconductor device, continued from FIG. 52.

Next, as illustrated in FIG. 53, the insulating film CAP in a part of the shunt region of the power supply region F1, in the capacitive element region E1 and in the peripheral circuit region, is removed by an etching process by using the resist pattern RP12 (see FIG. 52) as a mask. Then, the resist pattern RP12 (see FIG. 52) is removed. Thus, the upper surfaces of the patterns protruding on the first side wall of the selection gate electrode CG1 and the third side wall of the selection gate electrode CG2 are exposed. Moreover, by these processes, the cap insulating films CA1 and CA2 made of the insulating film CAP are formed on the selection gate electrode CG1 and the selection gate electrode CG2, respectively. Also, the insulating film CAP on the selection gate electrode FC is referred to as a cap insulating film CAF below.

At this time, the respective cap insulating films CA1 and CA2 on the selection gate electrodes CG1 and CG2 extending in the first direction are not separated in the first direction, and extend in the first direction so as to cover the upper surfaces of the selection gate electrodes CG1 and CG2 extending in the first direction.

Moreover, a region exposed from the cap insulating film CA2 in the pattern formed of the selection gate electrode CG2 that protrudes from the third side wall of the selection gate electrode CG2 toward the first side wall side of the selection gate electrode CG1 is referred to as a shunt portion CS2. Furthermore, a region exposed from the cap insulating film CA1 in the pattern formed of the selection gate electrode CG1 that protrudes from the first side wall of the selection gate electrode CG1 toward the third side wall side of the selection gate electrode CG2 is referred to as a shunt portion CS4.

Figure 54:
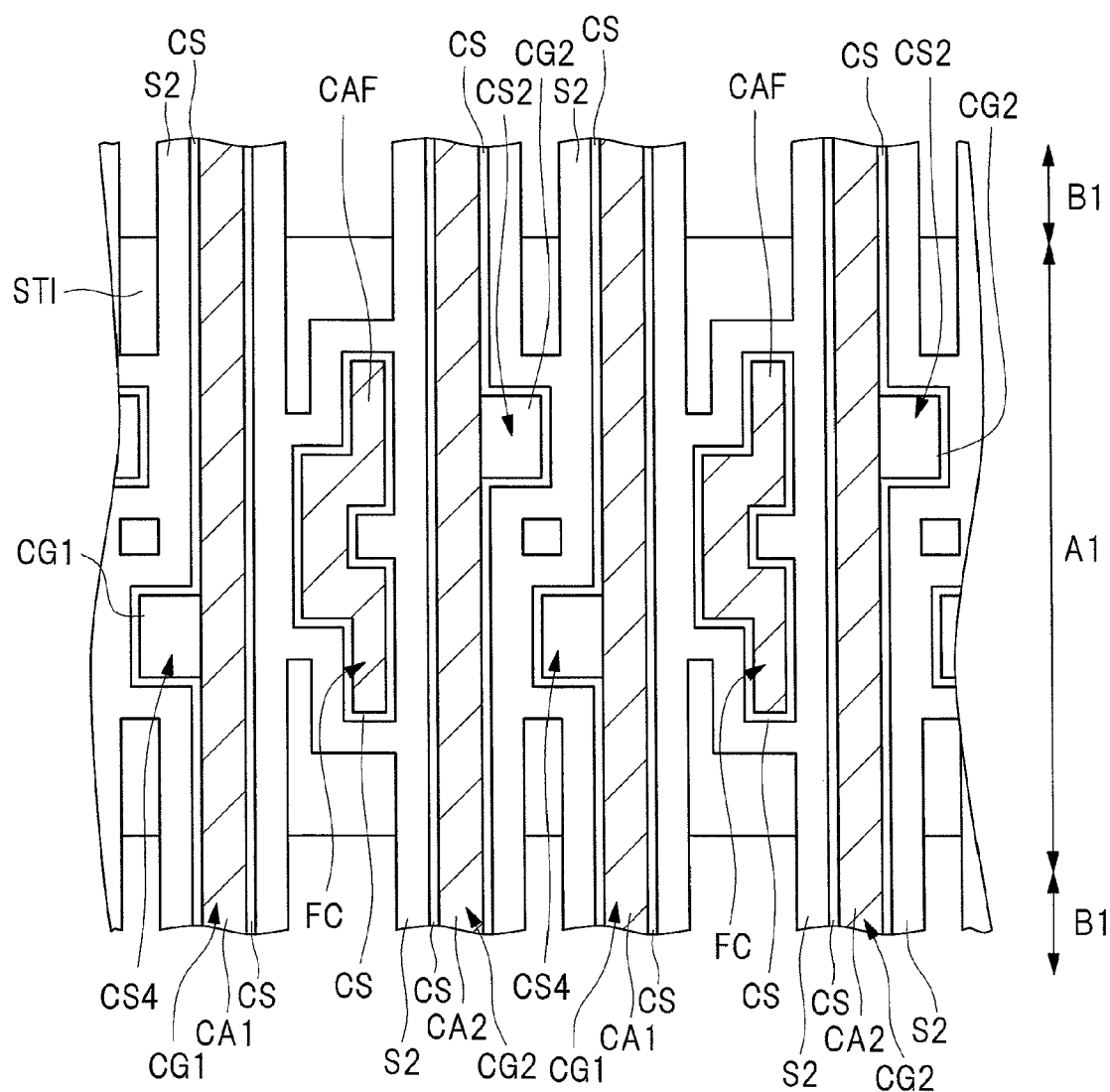
FIG. 54 is a plan view of a principal part illustrating the method of manufacturing the semiconductor device, continued from FIG. 53.

Next, as illustrated in FIG. 54, the ONO film CS and the sidewall S2 are formed on the semiconductor substrate by performing the same processes as those explained by using FIG. 15 and FIG. 16. A sidewall-shaped stacked film made of the ONO film CS and the sidewall S2 is formed so as to be adjacent to all the side walls of the respective selection gate electrodes CG1, CG2 and FC. That is, each of the selection gate electrodes CG1, CG2 and FC is surrounded by the sidewall S2 via the ONO film CS in a plan view. At this time, although not illustrated in the drawing, the ONO film CS and the sidewall S2 are formed also on a region right above the shunt portion CS4 of the selection gate electrode CG1 corresponding to the region adjacent to the side wall of the cap insulating film CA1.

Figure 55:
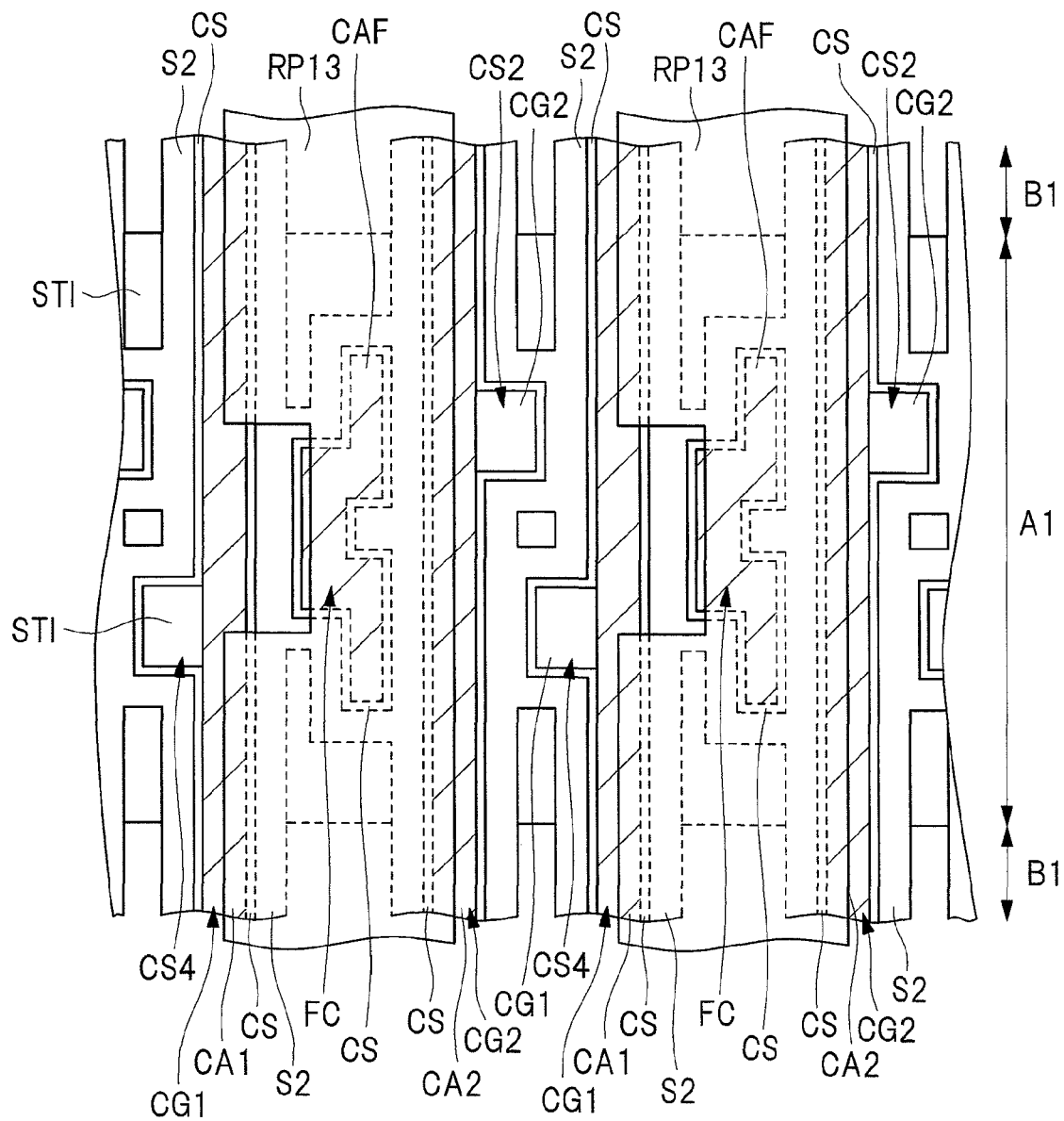
FIG. 55 is a plan view of a principal part illustrating the method of manufacturing the semiconductor device, continued from FIG. 54.

Next, as illustrated in FIG. 55, a resist pattern RP13 is formed on the semiconductor substrate. From the resist pattern RP13, the sidewall S2 in the vicinity of the first side wall of the selection gate electrode CG1, the sidewall S2 in the vicinity of the third side wall of the selection gate electrode CG2 and a region between the selection gate electrode FC and the second side wall of the selection gate electrode CG1 are exposed. Note that, when it is not required in the vicinity of the selection gate electrode FC to separate the memory gate electrode to be formed on the second side wall of the selection gate electrode CG1 as described later, it is not required to expose the region between the selection gate electrode FC and the second side wall of the selection gate electrode CG1 from the resist pattern RP13 as described above.

The resist pattern RP13 covers the sidewalls S2 formed in the vicinity of the second side wall of the selection gate electrode CG1 except for the region between the selection gate electrode FC and the second side wall of the selection gate electrode CG1, and in the vicinity of the fourth side wall of the selection gate electrode CG2.

Figure 56:
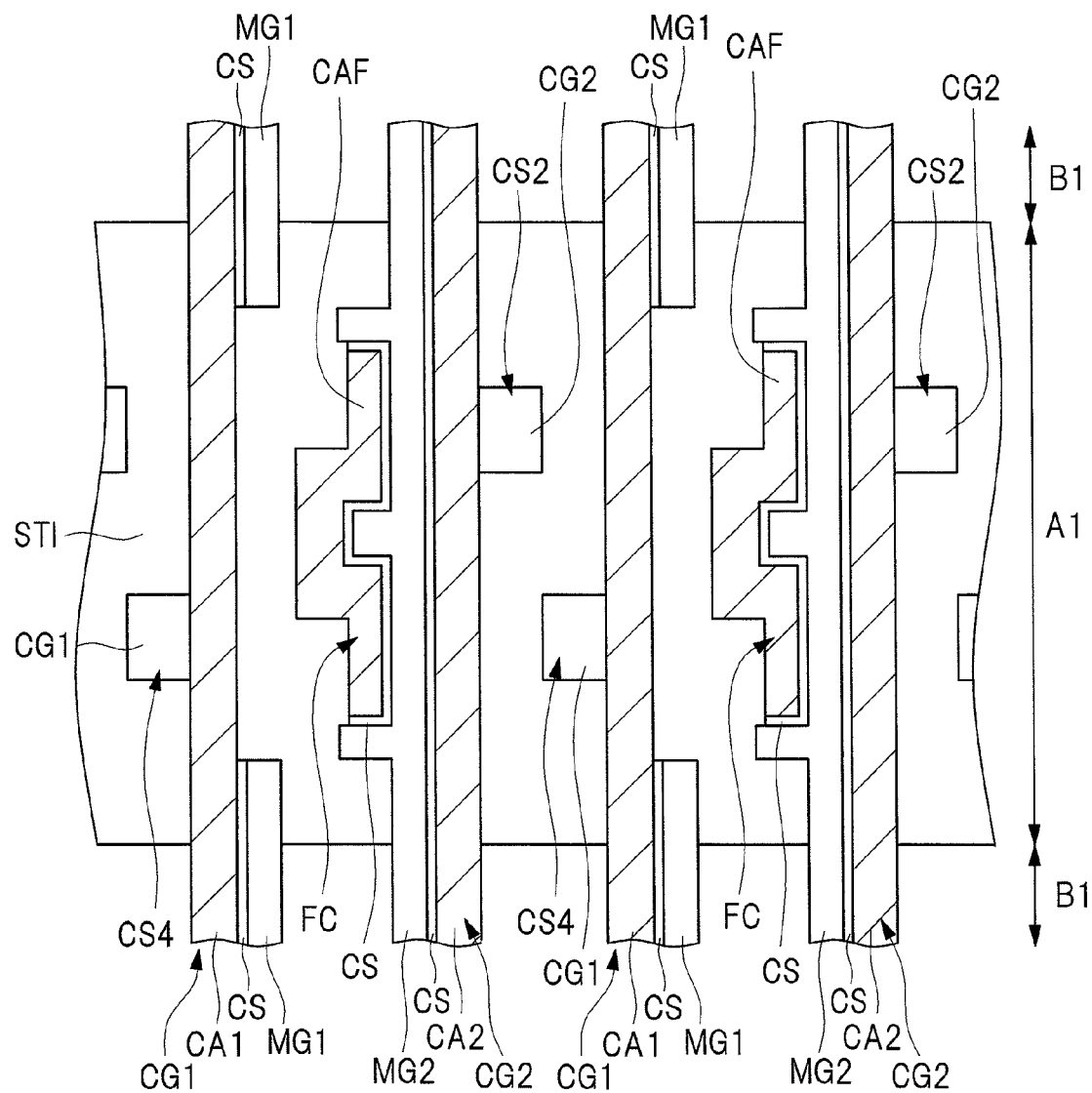
FIG. 56 is a plan view of a principal part illustrating the method of manufacturing the semiconductor device, continued from FIG. 55.
Figure 57:
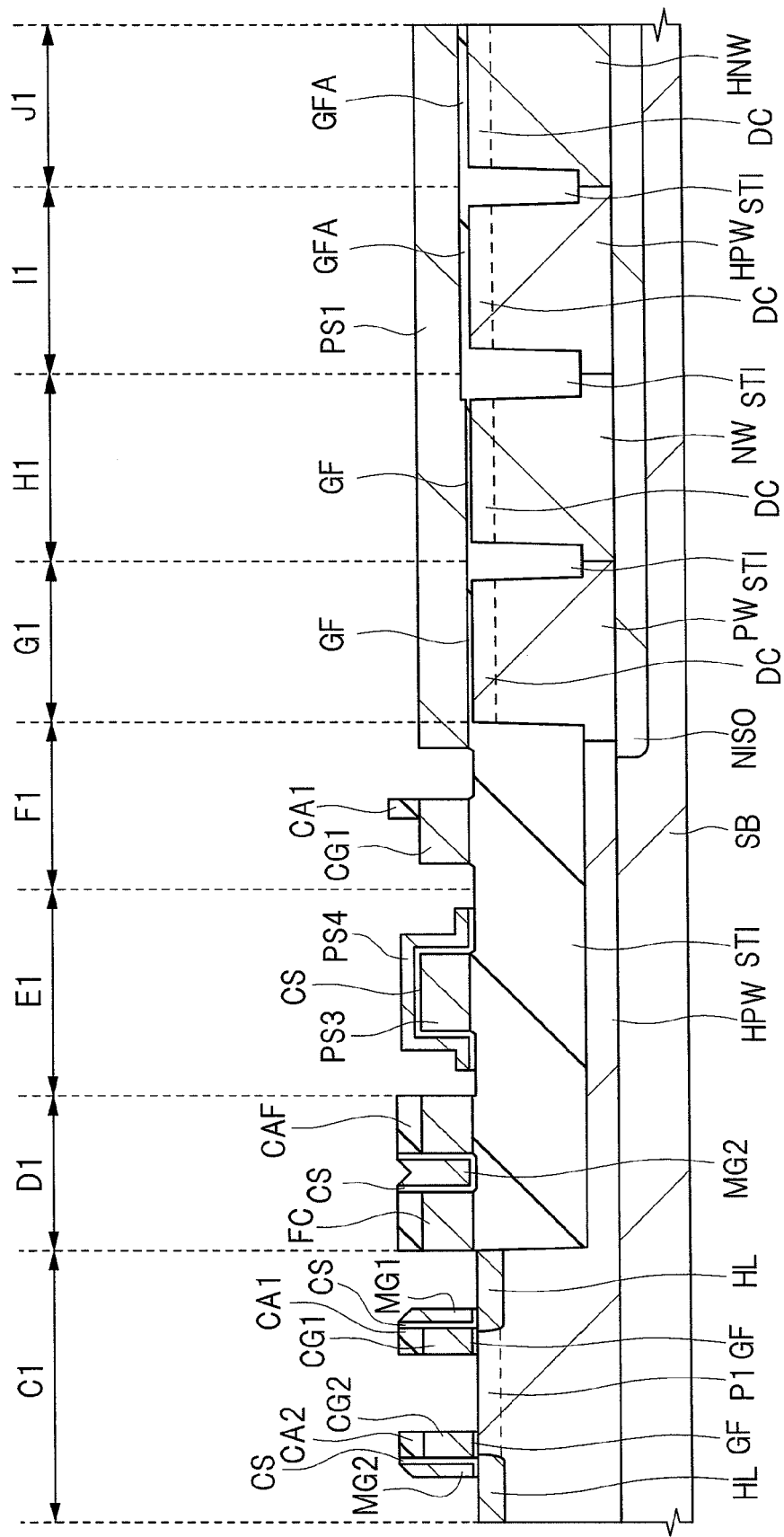
FIG. 57 is a cross-sectional view of a principal part illustrating the method of manufacturing the semiconductor device, continued from FIG. 55.

Next, as illustrated in FIG. 56 and FIG. 57, by using the resist pattern RP13 (see FIG. 55) as a mask, the sidewall S2 exposed from the mask is removed by an isotropic etching process such as wet etching. Then, the resist pattern RP13 is removed. Thus, the memory gate electrode MG1 is formed so as to be adjacent only to the second side wall which is the one side surface of the stacked film formed of the cap insulating film CA1 and the selection gate electrode CG1. Similarly, the memory gate electrode MG2 is formed only on the fourth side wall which is the one side surface of the stacked film formed of the cap insulating film CA2 and the selection gate electrode CG2.

At this time, in the power supply region F1 illustrated in FIG. 57, the sidewall S2 on the side wall of the selection gate electrode CG1 is entirely removed. As different from the memory region C1, a reason why no memory gate electrode MG1 is formed on the second side wall side of the selection gate electrode CG1 in the power supply region F1 is that the region between the selection gate electrode FC and the second side wall of the selection gate electrode CG1 is exposed from the resist pattern RP13 as illustrated in FIG. 55, and the sidewall S2 on the second side wall side of the shunt portion CS4 is also exposed. Note that the cross-sectional surface illustrated in the power supply region F1 of FIG. 57 is a cross-sectional surface obtained by cutting the shunt portion CS4 along the second direction.

Then, the memory gate electrodes MG1, MG2 and the ONO film CS not covered with the upper electrode PS4 are selectively etched and removed.

In this case, in the power supply region D1, stacked films each formed of the selection gate electrode FC and the cap insulating film CAF formed thereon are arranged so as to interpose an interval therebetween in the first direction. A side wall and a bottom surface inside a trench formed between the stacked films arranged in the first direction as described above are covered with the ONO film CS, and this trench is buried by the memory gate electrode MG2 formed on the ONO film CS.

Figure 58:
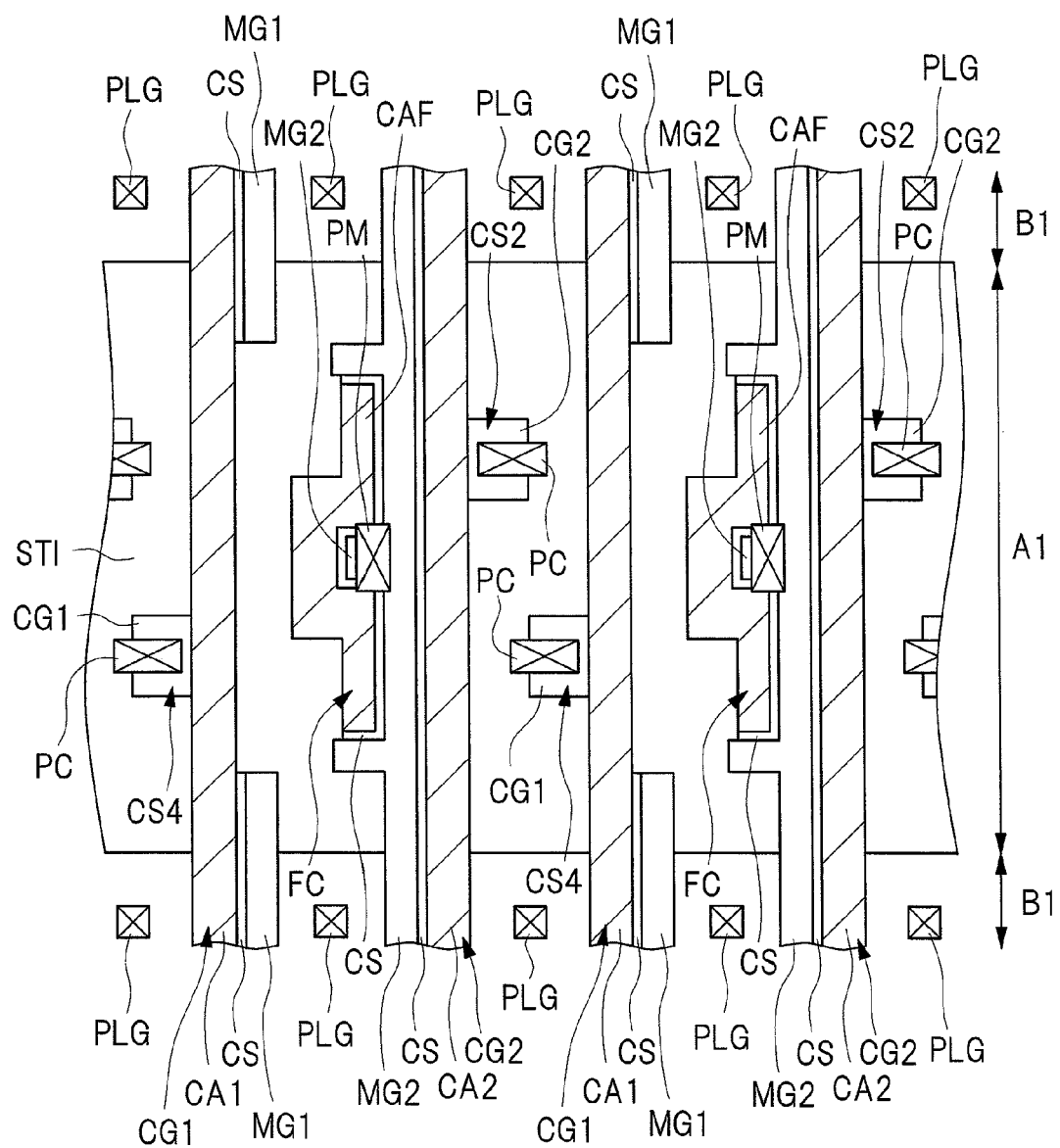
FIG. 58 is a plan view of a principal part illustrating the method of manufacturing the semiconductor device, continued from FIG. 56.
Figure 59:
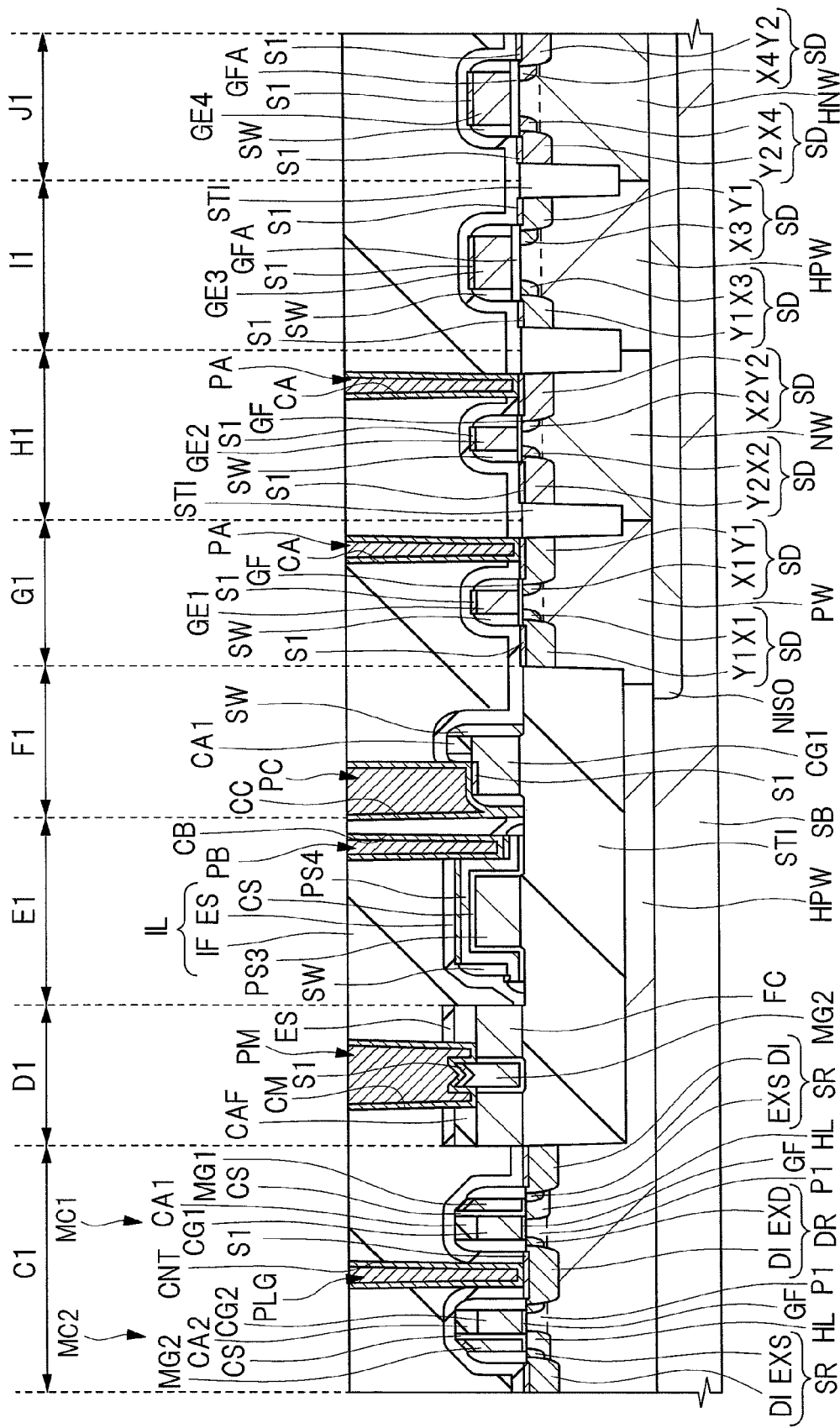
FIG. 59 is a cross-sectional view of a principal part illustrating the method of manufacturing the semiconductor device, continued from FIG. 56.

Next, the same processes as those processes explained by using FIGS. 20 to 30 are performed, so that the respective semiconductor elements are formed, and these semiconductor elements are covered with an interlayer insulating film, and then, plugs PA, PB, PC, PM and PLG that bury contact holes CA, CB, CC, CM and CNT penetrating through the interlayer insulating film IL are formed as illustrated in FIG. 58 and FIG. 59, respectively. In this case, as illustrated in FIG. 58, the plug PM and the plug PC are formed in the power supply region A1 of the MONOS memory, and the plug PLG is formed in the active region B1 of the MONOS memory.

As illustrated in FIG. 59, the present embodiment is different from the other embodiments in that the ONO film CS and the memory gate electrodes MG1 (see FIG. 32) are not formed on the second side wall of the selection gate electrode CG1 in the power supply region F1. However, when it is not required to separate the memory gate electrode MG1 as described later, the memory gate electrode MG1 is formed so as to be adjacent to the second side wall of the selection gate electrode CG1 in the power supply region F1 as similar to the structure illustrated in FIG. 32.

Moreover, in the power supply region D1, the plug PM is connected onto the memory gate electrode MG2 buried between the stacked films each formed of the selection gate electrode FC and the cap insulating film CAF so that the plug PM is electrically connected to the memory gate electrode MG2. At this time, the plug PM penetrates through the silicon nitride film ES and the cap insulating film CAF in a region adjacent to the memory gate electrode MG2, and is made in contact with the selection gate electrode FC. At this time, the plug PM is connected to the silicide layer S1 on the memory gate electrode MG2 on the ONO film CS formed on the side wall of the memory gate electrode MG. Therefore, the contact area between the plug PM and the silicide layer S1 can be increased, so that the contact resistance between the plug PM and the memory gate electrode MG2 can be reduced.

As illustrated in FIG. 58, either with or without the separation of the memory gate electrode MG1 in the first direction in the vicinity of the selection gate electrode FC and when it is not separated therein, the cap insulating film CA1 extending in the first direction is formed between the shunt portion CS4 of the selection gate electrode CG1 and the memory gate electrode MG1 adjacent to the selection gate electrode CG1. Similarly, the cap insulating film CA2 extending in the first direction is formed between the shunt portion CS2 of the selection gate electrode CG2 and the memory gate electrode MG2 adjacent to the selection gate electrode CG2.

Then, a first layer wire (illustration thereof is omitted) mainly containing, for example, Cu (copper) or Al (aluminum) is formed on the interlayer insulating film IL, so that the semiconductor device of the present embodiment is completed. From this process after this, a semiconductor device having a nonvolatile memory is manufactured through normal manufacturing processes of a semiconductor device.

In the present embodiment, as similar to the above-described first embodiment, by not forming the memory gate electrode MG1 so as to be adjacent to the shunt portion CS4 but interposing the cap insulating film CA1 between the shunt portion CS4 and the memory gate electrode MG1 in a plan view, the short circuit between the selection gate electrode CG1 and the memory gate electrode MG1 can be prevented, so that the reliability of the semiconductor device can be improved. Similarly, by interposing the cap insulating film CA2 between the shunt portion CS2 and the memory gate electrode MG2 in a plan view, the short circuit between the selection gate electrode CG2 and the memory gate electrode MG2 can be prevented, so that the reliability of the semiconductor device can be improved.

In the present embodiment, the selection gate electrode CG1 is not separated but extended in the first direction, and therefore, it is only required to electrically insulate the shunt portion CS4 formed at not the end portion of the selection gate electrode CG1 in the first direction but one of the side walls of the extending selection gate electrode CG1 from the memory gate electrode MG1 formed on the other side wall thereof. Therefore, by forming the cap insulating film CA1 extending in the first direction on the selection gate electrode CG1, the short circuit can be easily prevented.

That is, in the semiconductor devices explained in the above-described embodiments 1 and 2, the shunt portion is formed at the end portion of the selection gate electrode that extends in the first direction, and therefore, it is required to terminate the memory gate electrode in the vicinity of the border between the shunt portion and the cap insulating film. In this case, the memory gate electrode and the shunt portion tend to be close to each other, and therefore, there is a risk of the short circuit.

On the other hand, in the present embodiment, the memory gate electrode MG1 is insulated from the shunt portion CS4 formed on each of both side walls of a pattern that extends in the first direction. In this case, by forming the cap insulating film CA1 extending in the first direction on the selection gate electrode CG1, the formation of the memory gate electrode MG1 in the vicinity of the border between the shunt portion CS4 and the cap insulating film CA1 can be prevented, and therefore, the shunt portion CS4 and the memory gate electrode MG1 can be easily insulated from each other.

Note that the memory gate electrode MG1 is not formed in the vicinity of a part of the second side wall in the power supply region A1 in the present embodiment in order to prevent the short circuit between the selection gate electrode CG1 and the adjacent memory gate electrode MG2 caused by the contact or others between the memory gate electrode MG1 formed adjacent to the second side wall of the selection gate electrode CG1 and the memory gate electrode MG2 formed adjacent to the side wall of the selection gate electrode FC. Since the shunt portion of the memory gate electrode MG2 is formed at a position adjacent to the selection gate electrode FC formed on the fourth side wall side of the selection gate electrode CG2, the shunt portion of the memory gate electrode MG2 is adjacent to the second side wall of the selection gate electrode CG1 facing the fourth side wall.

On the other hand, in the present embodiment, the memory gate electrode MG1 is separated in the first direction in the vicinity of the selection gate electrode FC formed for forming the shunt portion of the memory gate electrode MG2. Therefore, no memory gate electrode MG2 is formed on the side wall of the selection gate electrode FC corresponding to the side wall facing the second sidewall side of the selection gate electrode CG1. Thus, in the vicinity of the shunt portion of the memory gate electrode MG2, the second side wall of the selection gate electrode CG1 facing the fourth side wall of the selection gate electrode CG2 adjacent to the memory gate electrode MG2 is exposed from the memory gate electrode MG1.

However, the requirement for adopting the structure described above is only in the case in which the distance between the selection gate electrodes CG1 and CG2 in the second direction is small, and the second side wall of the selection gate electrode CG1 and the selection gate electrode FC are arranged close to each other in order to reduce the layout of each gate electrode or others as small as possible. Therefore, when there is some room between the second side wall of the selection gate electrode CG1 and the selection gate electrode FC, a memory gate electrode may be formed, the memory gate electrode being adjacent to either one of the second side wall of the selection gate electrode CG1 or the side wall of the selection gate electrode FC facing the second side wall of the selection gate electrode CG1 or to both of them.

That is, the memory gate electrode MG1 may be not separated in the first direction but formed along the second side wall of the selection gate electrode CG1.

Moreover, in the above-described second embodiment, the border between the shunt portion CS3 (see FIG. 47) and the cap insulating film CA1 (see FIG. 47) is formed along the second direction. On the other hand, in the present embodiment, the shunt portion CS4, which is one portion of the selection gate electrode CG1 formed so as to protrude from the first side wall of the selection gate electrode CG1 in the second direction, is formed on the stacked film extending in the first direction and being made of the selection gate electrode CG1 and cap insulating film CA1 formed thereon, and the upper surface of the shunt portion CS4 is exposed from the cap insulating film CA1. That is, the border between the shunt portion CS4 and the cap insulating film CA1 is formed in the extending direction of the selection gate electrode CG1, that is, in parallel with the first direction.

In the present embodiment, even when the distance between the selection gate electrodes CG1 and CG2 is equal to those in the above-described embodiments 1 and 2, it is more difficult to ensure large areas of the shunt portions CS4 and CS2 in the second direction which are power supply portions for the selection gate electrodes CG1 and CG2 than the above-described embodiments 1 and 2.

Therefore, in the present embodiment, by forming the plug PC connected to the upper surfaces of the shunt portions CS2 and CS4 into a rectangular shape, an elliptical shape, or others that extends in the second direction in a plan view, the margin for the positional misalignment in forming the plug PC can be expanded, and the increase in the resistance value caused by the reduction of the contact area of the plug PC can be prevented.

As described above, in the present embodiment, since the shunt portion formed on one of the side walls of the selection gate electrode extending in the first direction can be insulated from the memory gate electrode formed on the other side wall thereof, the short circuit between the selection gate electrode and the memory gate electrode can be prevented. For this reason, the reliability of the semiconductor device can be improved.

Figure 60:
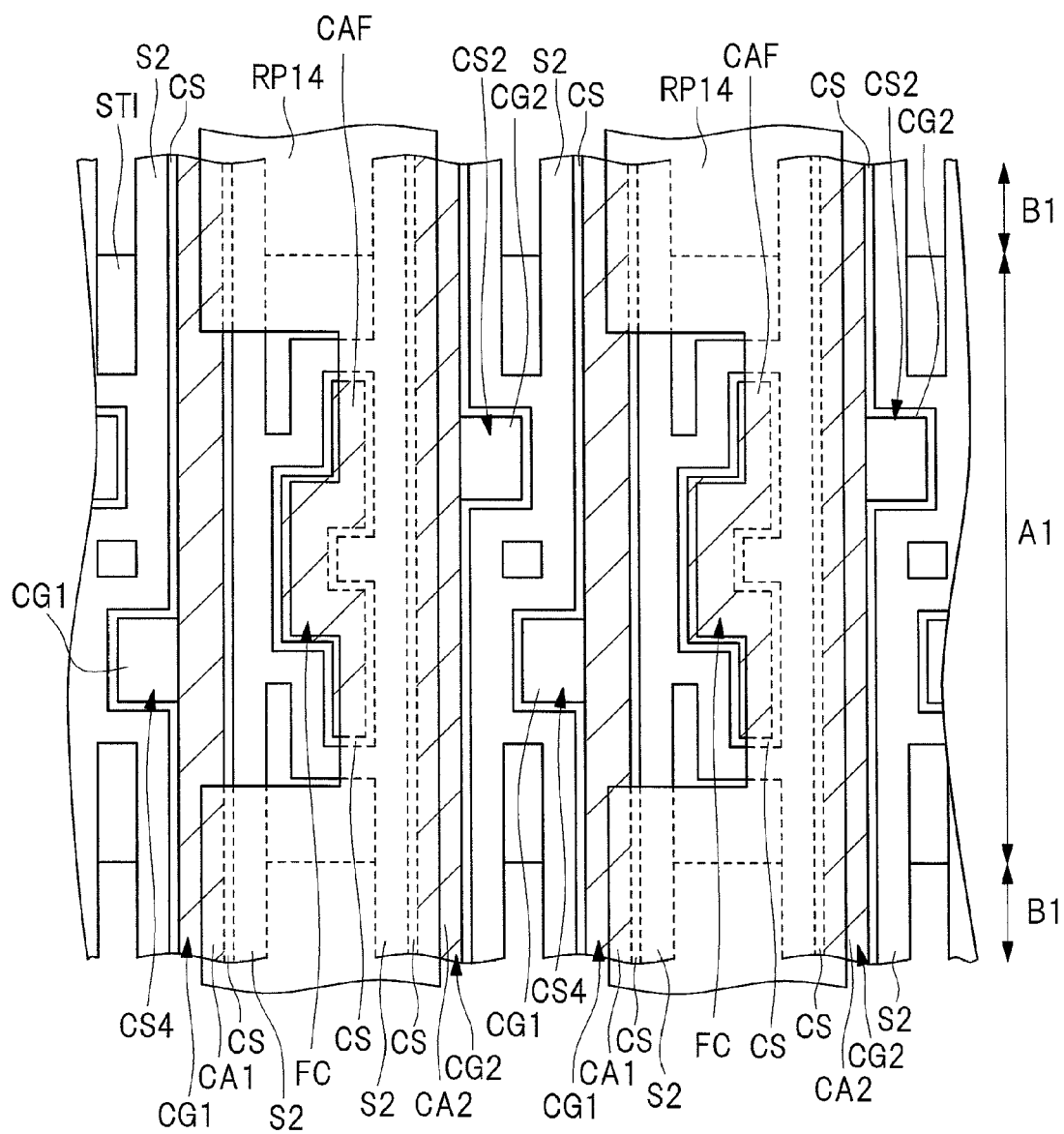
FIG. 60 is a plan view of a principal part illustrating a method of manufacturing a semiconductor device according to a modification example of the third embodiment of the present invention.
Figure 61:
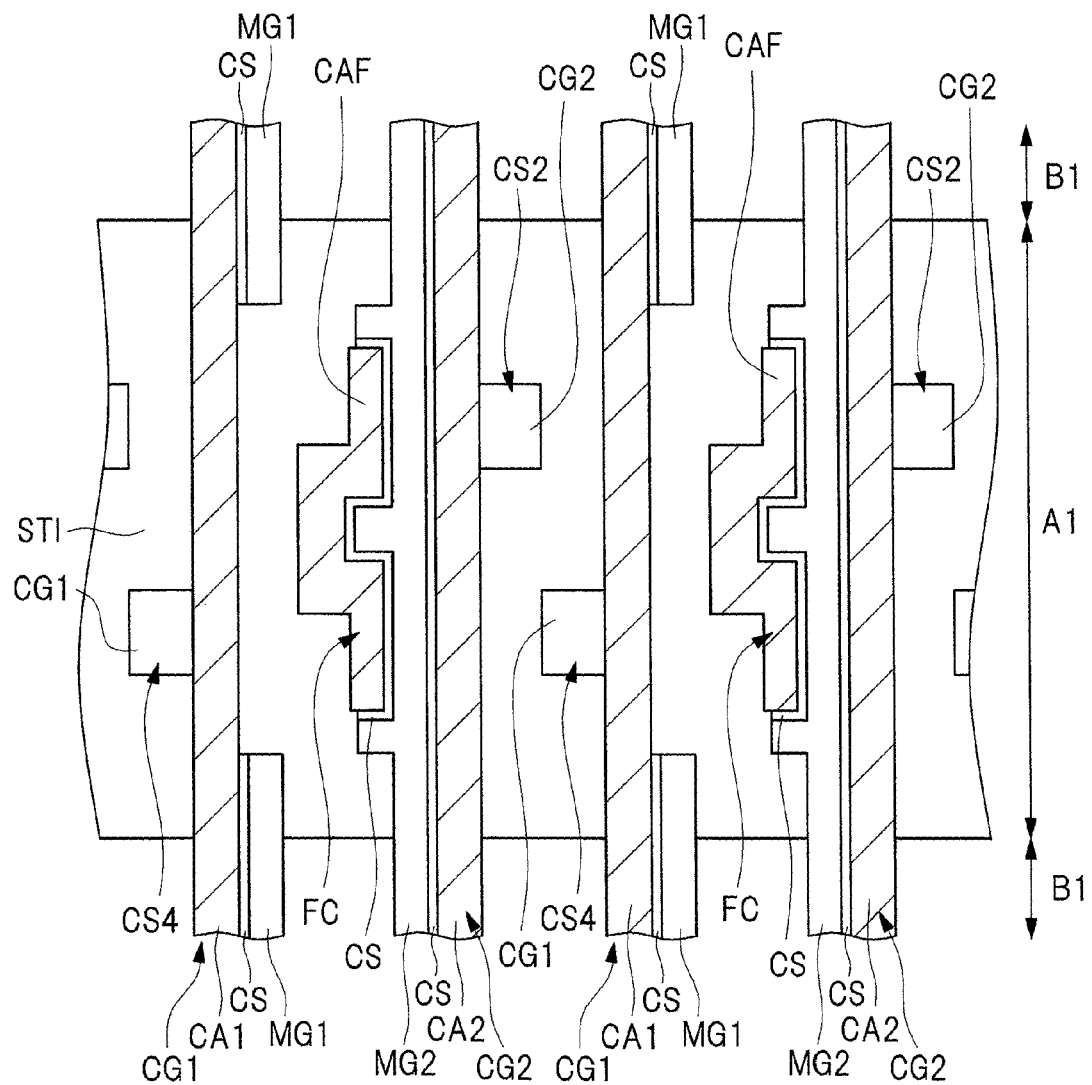
FIG. 61 is a plan view of a principal part illustrating the method of manufacturing the semiconductor device, continued from FIG. 60.

Moreover, as a modified example of the present embodiment, a method of partially removing the sidewall S2 (see FIG. 54) by using not an isotropic etching process but an anisotropic etching process in the formation processes of the memory gate electrodes MG1 and MG2 explained by using FIGS. 54 to 56 will be explained by using FIG. 60 and FIG. 61. FIG. 60 and FIG. 61 correspond to FIG. 55 and FIG. 56, respectively. That is, FIGS. 60 and 61 are plan views of a principal part of a semiconductor device during manufacturing processes according to the modified example.

The present modified example is partially different from the method of manufacturing the semiconductor device explained by using FIGS. 54 to 56 in the shape of the resist pattern illustrated in FIG. 55 and the shape of the memory gate electrode to be processed in the subsequent etching process. In this case, first, the same processes as those processes explained by using FIGS. 6 to 9 and FIGS. 51 to 54 are performed.

Next, as illustrated in FIG. 60, a resist pattern RP14 is formed. As similar to the resist pattern RP13 (see FIG. 55), the resist pattern RP14 is a film used for exposing the first side wall of the selection gate electrode CG1, the third side wall of the selection gate electrode CG2, and the sidewall S2 adjacent to the side wall of the shunt portion CS4 and the side wall of the CS2. However, from the resist pattern RP14, the sidewall S2 on the second side wall side of the selection gate electrode CG1 is exposed to be wider than from the resist pattern RP13. Moreover, from the resist pattern RP14, the sidewall S2 adjacent to the side wall of the selection gate electrode FC, that is, the side wall facing the second side wall of the selection gate electrode CG1 is exposed to be wider than from the resist pattern RP13.

Next, as illustrated in FIG. 61, by removing the sidewall S2 exposed from the resist pattern RP14 by using the resist pattern RP14 as a mask, the memory gate electrodes MG1 and MG2 are formed. In this case, however, the sidewall S2 is processed by using an anisotropic etching process. Thus, the pattern obtained by these processes has the substantially same structure as that explained by using FIG. 56.

In the present modified example, an anisotropic etching process is performed by using the resist pattern RP14 from which the region where the sidewall S2 is to be removed by the isotropic etching process performed by the process explained by using FIGS. 55 and 56 is exposed, without forming the memory gate electrode in the electrically floating state as explained by using FIGS. 38 and 50.

In other words, in the etching process of the sidewall S2 explained by using FIGS. 55 and 56, the sidewall S2 in the region covered with the resist pattern RP13 is partially receded and removed by a side etching process by using the isotropic etching process. However, since the anisotropic etching process is used in the modified example explained in this case, the sidewall S2 covered with the resist pattern RP14 is not removed.

Therefore, as illustrated in FIG. 60, by expanding an area of the sidewall in which the sidewall S2 is exposed from the resist pattern RP14 in the power supply region A1, the process of the sidewall S2 into a desired shape by using the anisotropic etching process can be achieved. By processing the sidewall S2, the memory gate electrodes MG1 and MG2 illustrated in FIG. 61 can be formed so as to be adjacent to the second side wall of the selection gate electrode CG1 and the fourth side wall of the selection gate electrode CG2, respectively. Moreover, in this case, by removing the sidewall S2 between the selection gate electrode FC of the power supply region A1 and the selection gate electrode CG1, the conduction between the memory gate electrode MG1 and the memory gate electrode MG2 is prevented.

If the selection gate electrode FC and the selection gate electrode CG1 are sufficiently separated from each other so that the sidewalls S2 which are adjacent to the respective side walls of the selection gate electrode FC and the selection gate electrode CG1 are not in contact with each other as described above, note that it is not required to remove the sidewall S2 between the second side wall of the selection gate electrode CG1 and the fourth side wall of the selection gate electrode CG2 that face each other.

In the foregoing, the invention made by the inventors has been concretely described based on the embodiments. However, it is needless to say that the present invention is not limited to the foregoing embodiments and various modifications and alterations can be made within the scope of the present invention.

Note that the contents described in the embodiments will be partially described below.

(1) A method of manufacturing a semiconductor device includes:

(a) a step of forming a first gate insulating film on a semiconductor substrate;

(b) a step of forming a first conductive film on the first gate insulating film;

(c) a step of forming a second insulating film on the first conductive film;

(d) a step of forming a first stacked film including a first selection gate electrode and a first cap insulating film by processing the second insulating film and the first conductive film, the first selection gate electrode being made of the first conductive film and extending in a first direction along amain surface of the semiconductor substrate over a first region and a second region on the semiconductor substrate, and the first cap insulating film being made of the second insulating film on the first selection gate electrode and extending in the first direction;

(e) a step of forming a first power supply portion being made of the first selection gate electrode and being exposed from the first cap insulating film by, in the first region, leaving the first cap insulating film on the first selection gate electrode extending in the first direction but removing the first cap insulating film on the first selection gate electrode protruding in a second direction orthogonal to the first direction from a first side wall of the first selection gate electrode extending in the first direction;

(f) after the above-described step of (e), a step of forming a second gate insulating film including a charge storage layer on the semiconductor substrate;

(g) a step of forming a second conductive film on the second gate insulating film;

(h) a step of leaving the second conductive film having a sidewall shape adjacent to a side wall of the first selection gate electrode by performing an anisotropic etching process to the second conductive film;

(i) after the above-described step of (h), a step of forming a first memory gate electrode made of the second conductive film adjacent to a second side wall of the first selection gate electrode on an opposite side to the first side wall thereof by removing the second conductive film adjacent to the first side wall of the first selection gate electrode;

(j) after the above-described step of (i), a step of forming a first source region and a first drain region on the semiconductor substrate in the second region;

(k) after the above-described step of (j), a step of forming silicide layers on an upper surface of the first memory gate electrode, an upper surface of the first power supply portion and upper surfaces of the first source region and the first drain region, respectively; and (l) after the above-described step of (k), a step of connecting a first plug to the upper surface of the first power supply portion, and, in a plan view, the first cap insulating film is formed between the first power supply portion and the first memory gate electrode.

(2) In the method of manufacturing the semiconductor device described in the item (1), the first plug has a shape extending in the second direction in a plan view.

(3) In the method of manufacturing the semiconductor device described in the item (1), in the above-described step of (d), a second stacked film including a second selection gate electrode and a second cap insulating film is formed by processing the second insulating film and the first conductive film, the second selection gate electrode being made of the first conductive film and extending in the first direction over the first region and the second region on the semiconductor substrate, and the second cap insulating film being made of the second insulating film on the second selection gate electrode and extending in the first direction, and a plurality of the first selection gate electrode and the second selection gate electrode are arranged so as to be alternately aligned in the second direction so that the first side wall and a third side wall of the second selection gate electrode which extends in the first direction face each other, in the above-described step of (e), a second power supply portion being made of the second selection gate electrode exposed from the second cap insulating film is formed by leaving the second cap insulating film on the second selection gate electrode extending in the first direction in the first region and the second region but removing the second cap insulating film on the second selection gate electrode protruding in the second direction from the third side wall of the second selection gate electrode, in the above-described step of (h), the second conductive film having a sidewall shape adjacent to a side wall of the second selection gate electrode is left by performing an anisotropic etching process to the second conductive film, in the above-described step of (i), a second memory gate electrode made of the second conductive film adjacent to a fourth side wall of the second selection gate electrode on an opposite side to the third side wall thereof is formed by removing the second conductive film adjacent to the third side wall of the second selection gate electrode, in the above-described step of (j), a second source region and a second drain region are formed on the semiconductor substrate in the second region, in the above-described step of (k), silicide layers are formed on an upper surface of the second memory gate electrode, an upper surface of the second power supply portion and upper surfaces of the second source region and the second drain region, respectively, in the above-described step of (l), a second plug is connected to an upper surface of the second power supply portion, and, in the first region, a third power supply portion of the second memory gate electrode is formed so as to be adjacent to the fourth side wall of the second selection gate electrode, and, in the vicinity of the third power supply portion, the first memory gate electrode is separated in the first direction so that the second side wall is exposed from the first memory gate electrode.

What is claimed is:

1. A semiconductor device comprising:
   a first stacked film that is formed on a semiconductor substrate via a first gate insulating film, that extends in a first direction along a main surface of the semiconductor substrate, and that is made of a first selection gate electrode and a first cap insulating film on the first selection gate electrode;
   a first memory gate electrode that is adjacent via a second gate insulating film including a first charge storage layer to a second side wall of the first selection gate electrode on an opposite side to a first side wall thereof extending in the first direction and that extends in the first direction;
   a first power supply portion that is an end portion of the first selection gate electrode in the first direction and that is exposed from the first cap insulating film in a plan view; and
   a first plug that is connected to an upper surface of the first power supply portion,
   wherein, the first memory gate electrode is terminated on the first cap insulating film side so as to be closer than a border between the first power supply portion and the first cap insulating film in a plan view.

2. The semiconductor device according to claim 1,
   wherein, in a plan view, the first cap insulating film is formed between the first power supply portion and the first memory gate electrode.

3. The semiconductor device according to claim 2,
   wherein, right above the first selection gate electrode, the first power supply portion and the first cap insulating film are arranged so as to be aligned in a second direction orthogonal to the first direction.

4. The semiconductor device according to claim 3,
   wherein, in a plan view, an end portion of the first cap insulating film reaches the farthermost end portion of the first selection gate electrode in the first direction.

5. The semiconductor device according to claim 1 further comprising:
   a second stacked film that is formed on the semiconductor substrate via a third gate insulating film, that extends in the first direction, and that is made of a second selection gate electrode and a second cap insulating film on the second selection gate electrode;
   a second memory gate electrode that is adjacent via a fourth gate insulating film including a second charge storage layer to a fourth side wall of the second selection gate electrode on an opposite side to a third side wall thereof extending in the first direction and that extends in the first direction;
   a second power supply portion that is a part of the second selection gate electrode, that protrudes in a second direction orthogonal to the first direction from the third side wall of the second selection gate electrode, and that is exposed from the second cap insulating film in a plan view; and
   a second plug that is connected to an upper surface of the second power supply portion, wherein a plurality of the first selection gate electrode and the second selection gate electrode are arranged so as to be alternately aligned in the second direction, the first side wall and the third side wall face each other, and a plurality of the first selection gate electrodes are arranged so as to be aligned in the first direction, and the second power supply portion and a third power supply portion of the second memory gate electrode are arranged in the second direction in a region between the first selection gate electrodes adjacent to each other in the first direction.

6. The semiconductor device according to claim 1, wherein the border is formed along a second direction orthogonal to the first direction from the first side wall to the second side wall in a plan view.

7. The semiconductor device according to claim 1, wherein the first plug has a shape extending in a second direction orthogonal to the first direction in a plan view.

8. The semiconductor device according to claim 7, wherein the first power supply portion is formed on an element isolation region formed on the main surface of the semiconductor substrate, and a part of the first plug is in contact with an upper surface of the element isolation region.

9. The semiconductor device according to claim 7, wherein the second gate insulating film includes a third stacked film made of a first insulating film, the first charge storage layer formed on the first insulating film and a second insulating film formed on the first charge storage layer.

10. The semiconductor device according to claim 1, wherein the first power supply portion is formed on an element isolation region formed on the main surface of the semiconductor substrate, and a part of the first stacked film protrudes from the second side wall on the element isolation region in a second direction orthogonal to the first direction.

11. A semiconductor device comprising:

a first stacked film that is formed on a semiconductor substrate via a first gate insulating film, that extends in a first direction along a main surface of the semiconductor substrate, and that is made of a first selection gate electrode and a first cap insulating film on the first selection gate electrode;

a first memory gate electrode that is adjacent via a second gate insulating film including a first charge storage layer to a second side wall of the first selection gate electrode on an opposite side to a first side wall thereof extending in the first direction and that extends in the first direction;

a first power supply portion that is a part of the first selection gate electrode, that protrudes from the first side wall in a second direction orthogonal to the first direction, and that is exposed from the first cap insulating film in a plan view; and a first plug that is connected to an upper surface of the first power supply portion, wherein, in a plan view, the first cap insulating film is formed between the first power supply portion and the first memory gate electrode.

12. The semiconductor device according to claim 11, wherein the first plug has a shape extending in the second direction in a plan view.

13. The semiconductor device according to claim 11 further comprising:

a second stacked film that is formed on the semiconductor substrate via a third gate insulating film, that extends in the first direction, and that is made of a second selection gate electrode and a second cap insulating film on the second selection gate electrode;

a second memory gate electrode that is adjacent via a fourth gate insulating film including a second charge storage layer to a fourth side wall of the second selection gate electrode on an opposite side to a third side wall thereof extending in the first direction and that extends in the first direction;

a second power supply portion that is a part of the second selection gate electrode, that protrudes in the second direction from the third side wall of the second selection gate electrode, and that is exposed from the second cap insulating film in a plan view;

a second plug that is connected to an upper surface of the second power supply portion; and a third power supply portion of the second memory gate electrode that is formed adjacent to the fourth side wall of the second selection gate electrode in the first region, wherein a plurality of the first selection gate electrode and the second selection gate electrode are arranged so as to be alternately aligned in the second direction, the second side wall and the fourth side wall face each other, and the first memory gate electrode is separated in the first direction in the vicinity of the third power supply portion so that the second side wall is exposed from the first memory gate electrode.

* * * * *